US012646957B2

(12) United States Patent
Thiel et al.

(10) Patent No.: US 12,646,957 B2
(45) Date of Patent: *Jun. 2, 2026

(54) PORTABLE POWER CASE WITH LITHIUM IRON PHOSPHATE BATTERY

(71) Applicant: LAT Enterprises, Inc., Raleigh, NC (US)

(72) Inventors: Laura Thiel, Raleigh, NC (US); Giancarlo Urzi, Raleigh, NC (US); Carlos Cid, Raleigh, NC (US)

(73) Assignee: LAT Enterprises, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/334,135

(22) Filed: Sep. 19, 2025

(65) Prior Publication Data

US 2026/0012027 A1     Jan. 8, 2026

Related U.S. Application Data

(63) Continuation of application No. 19/235,017, filed on Jun. 11, 2025, now Pat. No. 12,444,958, which is a
(Continued)

(51) Int. Cl.
*H02J 7/70*          (2026.01)
*H01M 4/58*          (2010.01)
(Continued)

(52) U.S. Cl.
CPC ............. *H02J 7/70* (2026.01); *H01M 10/425* (2013.01); *H01M 10/658* (2015.04);
(Continued)

(58) Field of Classification Search
CPC ........ H02J 7/0042; H02J 7/00; H01M 10/425; H01M 10/658; H01M 50/202;
(Continued)

(56) References Cited

U.S. PATENT DOCUMENTS

| | | | |
|---|---|---|---|
| 1,901,232 | A | 3/1933 | Glowacki |
| RE21,577 | E | 9/1940 | Brownlee |

(Continued)

FOREIGN PATENT DOCUMENTS

| | | | |
|---|---|---|---|
| BR | 102012032925 | A2 | 8/2014 |
| CA | 2794979 | A1 | 10/2011 |

(Continued)

OTHER PUBLICATIONS (computer-generated translation of BR-102012032925) Lago et al., "Personal Monitoring System", Aug. 26, 2014.
(Continued)

*Primary Examiner* — M Baye Diao
(74) *Attorney, Agent, or Firm* — Neo IP

(57) ABSTRACT

Systems, methods, and articles for a portable power case are disclosed. The portable power case is comprised of at least one battery and at least one PCB. The portable power case has at least one USB port and at least two access ports, at least two leads, or at least one access port and at least one lead. The portable power case is operable to supply power to an amplifier, a radio, a wearable battery, a mobile phone, and a tablet. The portable power case is operable to be charged using solar panels, vehicle batteries, AC adapters, non-rechargeable batteries, and generators. The portable power case provides for modularity that allows the user to disassemble and selectively remove the batteries installed within the portable power case housing.

20 Claims, 54 Drawing Sheets

Related U.S. Application Data continuation of application No. 18/989,577, filed on Dec. 20, 2024, now Pat. No. 12,355,286, which is a continuation of application No. 18/615,613, filed on Mar. 25, 2024, now Pat. No. 12,237,701, which is a continuation of application No. 17/331,187, filed on May 26, 2021, now Pat. No. 11,955,825, which is a continuation of application No. 16/191,058, filed on Nov. 14, 2018, now Pat. No. 11,025,076, which is a continuation-in-part of application No. 15/836,299, filed on Dec. 8, 2017, now Pat. No. 11,025,075, which is a continuation-in-part of application No. 15/720,270, filed on Sep. 29, 2017, now Pat. No. 10,461,289, which is a continuation-in-part of application No. 15/664,776, filed on Jul. 31, 2017, now Pat. No. 11,462,649, said application No. 15/836,299 is a continuation-in-part of application No. 15/664,776, filed on Jul. 31, 2017, now Pat. No. 11,462,649, which is a continuation-in-part of application No. 15/470,382, filed on Mar. 27, 2017, now Pat. No. 11,302,987, said application No. 15/720,270 is a continuation-in-part of application No. 14/520,821, filed on Oct. 22, 2014, now Pat. No. 9,780,344, said application No. 15/470,382 is a continuation-in-part of application No. 14/516,127, filed on Oct. 16, 2014, now abandoned.

(51) Int. Cl.

| | |
|---|---|
| *H01M 10/0525* | (2010.01) |
| *H01M 10/42* | (2006.01) |
| *H01M 10/658* | (2014.01) |
| *H01M 50/202* | (2021.01) |
| *H01M 50/24* | (2021.01) |
| *H01M 50/256* | (2021.01) |
| *H01M 50/271* | (2021.01) |
| *H01M 50/284* | (2021.01) |
| *H01M 50/289* | (2021.01) |
| *H02J 7/00* | (2026.01) |
| *H05K 5/00* | (2025.01) |
| *H05K 5/02* | (2006.01) |
| *H05K 5/03* | (2006.01) |
| *H05K 7/14* | (2006.01) |

(52) U.S. Cl.

CPC ......... *H01M 50/202* (2021.01); *H01M 50/24* (2021.01); *H01M 50/256* (2021.01); *H01M 50/284* (2021.01); *H01M 50/289* (2021.01); *H02J 7/00* (2013.01); *H05K 5/0047* (2013.01); *H05K 5/0086* (2013.01); *H05K 5/0217* (2013.01); *H05K 5/023* (2013.01); *H05K 5/0247* (2013.01); *H05K 5/03* (2013.01); *H05K 7/1427* (2013.01); *H01M 4/5825* (2013.01); *H01M 10/0525* (2013.01); *H01M 10/4257* (2013.01); *H01M 50/271* (2021.01); *H01M 2220/30* (2013.01)

(58) Field of Classification Search

CPC .. H01M 50/24; H01M 50/256; H01M 50/284; H01M 50/289; H01M 4/5825; H01M 10/0525; H01M 10/4257; H01M 50/271; H01M 2220/30; H05K 5/0047; H05K 5/0086; H05K 5/0217; H05K 5/023; H05K 5/0247; H05K 5/03; H05K 7/1427
USPC ...................................................... 320/107
See application file for complete search history.

(56) References Cited

U.S. PATENT DOCUMENTS

| | | | |
|---|---|---|---|
| 2,416,984 A | 3/1947 | Farr | |
| 2,450,369 A | 9/1948 | Alexander | |
| 2,501,725 A | 3/1950 | Knopp | |
| 2,800,807 A | 7/1957 | Gomersall et al. | |
| 3,926,499 A | 12/1975 | Bailey et al. | |
| 3,952,694 A | 4/1976 | McDonald | |
| 3,968,348 A | 7/1976 | Stanfield | |
| 4,080,677 A | 3/1978 | Koehler | |
| 4,081,061 A | 3/1978 | Tucker | |
| 4,303,083 A | 12/1981 | Burruss, Jr. | |
| 4,346,151 A | 8/1982 | Uba et al. | |
| 4,656,770 A | 4/1987 | Nuttle | |
| 4,872,414 A | 10/1989 | Asquith | |
| 4,944,916 A | 7/1990 | Franey | |
| 4,979,502 A | 12/1990 | Hunt | |
| 5,185,042 A | 2/1993 | Ferguson | |
| 5,245,943 A | 9/1993 | Hull et al. | |
| 5,326,297 A | 7/1994 | Loughlin | |
| 5,340,662 A | 8/1994 | Mccarter | |
| 5,421,287 A | 6/1995 | Yonover | |
| 5,522,943 A | 6/1996 | Spencer et al. | |
| 5,537,022 A | 7/1996 | Huang | |
| D376,579 S | 12/1996 | Bunyea et al. | |
| 5,610,496 A | 3/1997 | Hofbauer et al. | |
| 5,653,367 A | 8/1997 | Abramson | |
| 5,680,026 A | 10/1997 | Lueschen | |
| 5,701,067 A | 12/1997 | Kaji et al. | |
| D392,249 S | 3/1998 | Nakazawa et al. | |
| 5,724,707 A | 3/1998 | Kirk et al. | |
| 5,736,954 A | 4/1998 | Veazey | |
| 5,808,865 A | 9/1998 | Alves | |
| 5,853,915 A | 12/1998 | Suto | |
| 5,861,223 A | 1/1999 | Motlagh | |
| 5,869,204 A | 2/1999 | Kottke et al. | |
| 5,944,567 A | 8/1999 | Ratajczak et al. | |
| 6,093,884 A | 7/2000 | Toyomura et al. | |
| 6,115,277 A | 9/2000 | Plichta et al. | |
| 6,172,892 B1 | 1/2001 | Plichta et al. | |
| 6,193,678 B1 | 2/2001 | Brannon | |
| 6,239,701 B1 | 5/2001 | Vasquez et al. | |
| 6,259,228 B1 | 7/2001 | Becker et al. | |
| 6,281,594 B1 | 8/2001 | Sarich | |
| 6,303,248 B1 | 10/2001 | Peterson | |
| 6,313,396 B1 | 11/2001 | Glenn | |
| 6,351,908 B1 | 3/2002 | Thomas | |
| 6,380,713 B2 | 4/2002 | Namura | |
| 6,396,403 B1 | 5/2002 | Haner | |
| 6,415,734 B1 | 7/2002 | LaPuzza | |
| 6,477,035 B1 | 11/2002 | Cepas et al. | |
| 6,546,873 B1 | 4/2003 | Andrejkovics et al. | |
| 6,641,432 B1 | 11/2003 | Ouyoung | |
| 6,659,320 B1 | 12/2003 | Alves et al. | |
| 6,727,197 B1 | 4/2004 | Wilson et al. | |
| 6,784,833 B1 | 8/2004 | Evans | |
| 6,866,527 B2 | 3/2005 | Potega | |
| 6,870,089 B1 | 3/2005 | Gray | |
| 6,945,803 B2 | 9/2005 | Potega | |
| 7,074,520 B2 | 7/2006 | Probst et al. | |
| 7,124,593 B2 | 10/2006 | Feher | |
| 7,141,330 B2 | 11/2006 | Aoyama | |
| D539,217 S | 3/2007 | Hamaguchi | |
| 7,221,552 B1 | 5/2007 | Brown | |
| 7,356,934 B2 | 4/2008 | McCambridge et al. | |
| D577,333 S | 9/2008 | Daniel et al. | |
| 7,443,627 B1 | 10/2008 | Krishnamoorthy et al. | |
| 7,489,105 B2 | 2/2009 | Weinstein et al. | |
| 7,494,348 B1 | 2/2009 | Tyler et al. | |
| 7,611,255 B1 | 11/2009 | Lagassey | |
| 7,624,453 B2 | 12/2009 | Rene et al. | |
| 7,695,334 B2 | 4/2010 | Yonover et al. | |
| 7,697,269 B2 | 4/2010 | Yang et al. | |
| 7,712,645 B2 | 5/2010 | Calkin | |
| 7,769,465 B2 | 8/2010 | Matos | |
| 7,782,610 B2 * | 8/2010 | Diebel ................ H04M 1/0262 361/679.41 |

(56) References Cited

U.S. PATENT DOCUMENTS

| | | | |
|---|---|---|---|
| 7,798,090 | B2 | 9/2010 | Hatfield |
| 7,805,114 | B1 | 9/2010 | Quintana et al. |
| 7,878,678 | B1 | 2/2011 | Stamatatos |
| 7,931,178 | B2 | 4/2011 | Rome et al. |
| D664,498 | S | 7/2012 | Liu |
| 8,258,394 | B2 | 9/2012 | Baruh |
| 8,415,924 | B2 | 4/2013 | Matthias et al. |
| D686,155 | S | 7/2013 | Nguyen |
| 8,587,261 | B2 | 11/2013 | Sassen et al. |
| 8,633,619 | B2 | 1/2014 | Robinson et al. |
| 8,638,011 | B2 | 1/2014 | Robinson et al. |
| 8,647,777 | B2 | 2/2014 | Yasunaga et al. |
| 8,720,762 | B2 | 5/2014 | Hilliard et al. |
| 8,736,108 | B1 | 5/2014 | Nielson et al. |
| 8,775,846 | B2 | 7/2014 | Robinson et al. |
| 8,832,981 | B2 | 9/2014 | Desaulniers |
| 8,945,328 | B2 | 2/2015 | Longinotti-Buitoni et al. |
| 8,984,666 | B1 | 3/2015 | LoBue |
| 9,029,681 | B1 | 5/2015 | Nielson et al. |
| 9,057,361 | B2 | 6/2015 | Donelan et al. |
| 9,093,586 | B2 | 7/2015 | Lentine et al. |
| 9,138,022 | B2 | 9/2015 | Walker |
| 9,141,143 | B2 | 9/2015 | Morita |
| 9,143,053 | B1 | 9/2015 | Lentine et al. |
| 9,144,255 | B1 | 9/2015 | Perciballi |
| 9,160,022 | B2 | 10/2015 | Pruett et al. |
| 9,230,486 | B2 | 1/2016 | Klement et al. |
| D756,908 | S | 5/2016 | Chung |
| 9,335,811 | B2 | 5/2016 | Long et al. |
| D762,564 | S | 8/2016 | Patton et al. |
| 9,496,448 | B2 | 11/2016 | Cruz-Campa et al. |
| 9,508,881 | B2 | 11/2016 | Tauke-Pedretti et al. |
| 9,531,322 | B2 | 12/2016 | Okandan et al. |
| 9,548,411 | B2 | 1/2017 | Nielson et al. |
| 9,559,219 | B1 | 1/2017 | Okandan et al. |
| 9,634,485 | B2 | 4/2017 | Long et al. |
| 9,634,491 | B2 | 4/2017 | Robinson et al. |
| 9,640,965 | B1 | 5/2017 | Long et al. |
| 9,653,632 | B1 | 5/2017 | Beitman, Sr. |
| 9,680,318 | B2 | 6/2017 | Carkner et al. |
| 9,709,362 | B2 | 7/2017 | Shelley |
| 9,780,344 | B2 | 10/2017 | Thiel et al. |
| D826,845 | S | 8/2018 | Greiner |
| D844,557 | S | 4/2019 | Wang |
| 10,250,134 | B2 | 4/2019 | Long et al. |
| 10,281,240 | B2 | 5/2019 | Cole et al. |
| 10,326,284 | B2 | 6/2019 | Long et al. |
| 10,333,315 | B2 | 6/2019 | Robinson et al. |
| 10,361,629 | B2 | 7/2019 | Long et al. |
| 10,531,590 | B2 | 1/2020 | Thiel et al. |
| D874,721 | S | 2/2020 | Lai |
| 10,587,116 | B2 | 3/2020 | Long et al. |
| 10,594,142 | B2 | 3/2020 | Long et al. |
| 10,616,534 | B2 | 4/2020 | Thiel et al. |
| D889,401 | S | 7/2020 | Li |
| D897,946 | S | 10/2020 | Liu |
| D899,355 | S | 10/2020 | Sommerfeld et al. |
| 10,848,067 | B2 | 11/2020 | Long et al. |
| 10,862,320 | B2 | 12/2020 | Carkner et al. |
| D907,572 | S | 1/2021 | Merrill et al. |
| D911,926 | S | 3/2021 | Li |
| 10,951,865 | B2 | 3/2021 | Thiel et al. |
| D921,576 | S | 6/2021 | Baker et al. |
| D926,120 | S | 7/2021 | Richard |
| 11,108,230 | B2 | 8/2021 | Long et al. |
| D930,574 | S | 9/2021 | Schramm et al. |
| D930,575 | S | 9/2021 | Schramm et al. |
| D932,439 | S | 10/2021 | Baker |
| D941,751 | S | 1/2022 | Boris |
| D942,967 | S | 2/2022 | Yan |
| D943,511 | S | 2/2022 | Liu |
| D943,512 | S | 2/2022 | Liu |
| 11,258,366 | B2 | 2/2022 | Long et al. |
| 11,283,265 | B2 | 3/2022 | Robinson et al. |
| D949,094 | S | 4/2022 | Liu |
| D949,095 | S | 4/2022 | Boris |
| 11,355,928 | B2 | 6/2022 | Long et al. |
| D965,512 | S | 10/2022 | Liao |
| D965,513 | S | 10/2022 | Liao |
| D966,184 | S | 10/2022 | Cheng |
| D967,010 | S | 10/2022 | Liao |
| D967,755 | S | 10/2022 | Liao |
| 11,477,853 | B2 | 10/2022 | Gray et al. |
| 11,569,667 | B2 | 1/2023 | Robinson et al. |
| D988,252 | S | 6/2023 | Horikoshi et al. |
| D988,253 | S | 6/2023 | Watanabe et al. |
| D988,254 | S | 6/2023 | Katsumoto et al. |
| D988,255 | S | 6/2023 | Watanabe et al. |
| D991,160 | S | 7/2023 | Lai et al. |
| D993,166 | S | 7/2023 | Horikoshi et al. |
| D993,167 | S | 7/2023 | Horikoshi et al. |
| D993,168 | S | 7/2023 | Horikoshi et al. |
| D993,169 | S | 7/2023 | Watanabe et al. |
| D1,001,061 | S | 10/2023 | Wang |
| 11,800,067 | B2 | 10/2023 | Thiel et al. |
| 11,876,354 | B2 | 1/2024 | Thiel et al. |
| D1,017,531 | S | 3/2024 | Li et al. |
| D1,019,539 | S | 3/2024 | Li et al. |
| D1,019,540 | S | 3/2024 | Li et al. |
| D1,029,751 | S | 6/2024 | Chen |
| D1,030,638 | S | 6/2024 | Wang et al. |
| 12,068,600 | B2 | 8/2024 | Long et al. |
| 12,088,244 | B2 | 9/2024 | Thiel et al. |
| 12,114,747 | B2 | 10/2024 | Thiel et al. |
| 12,119,461 | B2 | 10/2024 | Thiel et al. |
| D1,054,974 | S | 12/2024 | Feng |
| D1,055,845 | S | 12/2024 | Wu |
| 12,237,701 | B2 | 2/2025 | Thiel et al. |
| 12,289,004 | B2 | 4/2025 | Thiel et al. |
| 12,294,200 | B2 | 5/2025 | Thiel et al. |
| 12,294,231 | B2 | 5/2025 | Thiel et al. |
| 2002/0074370 | A1 | 6/2002 | Quintana et al. |
| 2002/0148078 | A1 | 10/2002 | Salentine et al. |
| 2002/0178558 | A1 | 12/2002 | Doshi et al. |
| 2003/0029494 | A1 | 2/2003 | Ohkubo |
| 2003/0038611 | A1 | 2/2003 | Morgan |
| 2003/0098060 | A1 | 5/2003 | Yoshimi |
| 2003/0165744 | A1 | 9/2003 | Schubert et al. |
| 2004/0144580 | A1 | 7/2004 | Wu |
| 2004/0154076 | A1 | 8/2004 | Yoo |
| 2004/0237178 | A1 | 12/2004 | Landeros |
| 2005/0140331 | A1 | 6/2005 | McQuade |
| 2005/0151930 | A1 | 7/2005 | Harris |
| 2005/0161079 | A1 | 7/2005 | Gray |
| 2005/0210722 | A1 | 9/2005 | Graef et al. |
| 2006/0028166 | A1 | 2/2006 | Closset et al. |
| 2006/0147172 | A1 | 7/2006 | Luther et al. |
| 2006/0225781 | A1 | 10/2006 | Locher |
| 2006/0267547 | A1 | 11/2006 | Godovich |
| 2007/0030146 | A1 | 2/2007 | Shepherd |
| 2007/0061941 | A1 | 3/2007 | Makabe et al. |
| 2007/0099488 | A1 | 5/2007 | Huffman et al. |
| 2007/0125815 | A1 | 6/2007 | Tong |
| 2007/0222410 | A1 | 9/2007 | Lee |
| 2007/0245444 | A1 | 10/2007 | Brink |
| 2007/0295772 | A1 | 12/2007 | Woodmansee |
| 2007/0299473 | A1 | 12/2007 | Matos |
| 2008/0052439 | A1 | 2/2008 | Young et al. |
| 2008/0190476 | A1 | 8/2008 | Baruh |
| 2008/0223428 | A1 | 9/2008 | Zeira |
| 2008/0223431 | A1 | 9/2008 | Chu |
| 2008/0231225 | A1 | 9/2008 | Lin |
| 2009/0004909 | A1 | 1/2009 | Puzio et al. |
| 2009/0039122 | A1 | 2/2009 | Antonioni |
| 2009/0044852 | A1 | 2/2009 | Shadbolt et al. |
| 2009/0114690 | A1 | 5/2009 | Landay |
| 2009/0131165 | A1 | 5/2009 | Buchner et al. |
| 2009/0164174 | A1 | 6/2009 | Bears et al. |
| 2009/0229655 | A1 | 9/2009 | Lee |
| 2009/0269943 | A1 | 10/2009 | Palli et al. |
| 2009/0272773 | A1 | 11/2009 | Andrade |
| 2009/0279810 | A1 | 11/2009 | Nobles |
| 2010/0008028 | A1 | 1/2010 | Richardson et al. |
| 2010/0115680 | A1 | 5/2010 | Thomas et al. |

(56)　　　　　　　References Cited

U.S. PATENT DOCUMENTS

| | | |
|---|---|---|
| 2010/0147604 A1 | 6/2010 | Sakita |
| 2010/0213309 A1 | 8/2010 | Parks |
| 2010/0253501 A1 | 10/2010 | Gibson |
| 2010/0287681 A1 | 11/2010 | Storms, Jr. et al. |
| 2010/0300744 A1 | 12/2010 | Romanko et al. |
| 2011/0049992 A1 | 3/2011 | Sant'Anselmo et al. |
| 2011/0059642 A1 | 3/2011 | Slippy et al. |
| 2011/0064983 A1 | 3/2011 | Yokoyama et al. |
| 2011/0070472 A1 | 3/2011 | Cui et al. |
| 2011/0097069 A1 | 4/2011 | Braithwaite |
| 2011/0100425 A1 | 5/2011 | Osamura et al. |
| 2011/0101794 A1 | 5/2011 | Schroeder et al. |
| 2011/0162690 A1 | 7/2011 | Workman et al. |
| 2011/0173731 A1 | 7/2011 | McElroy et al. |
| 2011/0183183 A1 | 7/2011 | Grady et al. |
| 2011/0204114 A1 | 8/2011 | Miller |
| 2011/0242134 A1 | 10/2011 | Miller et al. |
| 2011/0277809 A1 | 11/2011 | Dalland et al. |
| 2011/0278338 A1 | 11/2011 | Darnell, II et al. |
| 2011/0290683 A1 | 12/2011 | High et al. |
| 2011/0291607 A1 | 12/2011 | Rossi et al. |
| 2012/0025766 A1* | 2/2012 | Reade .................. H02J 7/80 |
| | | 320/110 |
| 2012/0043937 A1 | 2/2012 | Williams |
| 2012/0045929 A1 | 2/2012 | Streeter et al. |
| 2012/0060261 A1 | 3/2012 | Raviv |
| 2012/0073623 A1 | 3/2012 | Jones et al. |
| 2012/0090659 A1 | 4/2012 | Muchow et al. |
| 2012/0094166 A1 | 4/2012 | Lee et al. |
| 2012/0100414 A1 | 4/2012 | Sonta |
| 2012/0114990 A1 | 5/2012 | Jeong et al. |
| 2012/0156911 A1 | 6/2012 | Smith |
| 2012/0186000 A1 | 7/2012 | Raviv |
| 2012/0214042 A1 | 8/2012 | Wiegert |
| 2012/0227792 A1 | 9/2012 | Chen et al. |
| 2012/0235477 A1 | 9/2012 | Korman |
| 2012/0240999 A1 | 9/2012 | Yoshida et al. |
| 2012/0289081 A1 | 11/2012 | Izzard |
| 2013/0034765 A1 | 2/2013 | Kowalski |
| 2013/0043827 A1 | 2/2013 | Weinstein et al. |
| 2013/0049991 A1 | 2/2013 | Mothaffar |
| 2013/0084473 A1 | 4/2013 | Wahlquist et al. |
| 2013/0089756 A1 | 4/2013 | Kwag |
| 2013/0164567 A1 | 6/2013 | Olsson et al. |
| 2013/0181666 A1 | 7/2013 | Matthias et al. |
| 2013/0183562 A1 | 7/2013 | Workman et al. |
| 2013/0263922 A1 | 10/2013 | Jung et al. |
| 2013/0294712 A1 | 11/2013 | Seuk |
| 2013/0298958 A1 | 11/2013 | Kopylov |
| 2013/0305528 A1 | 11/2013 | Anderson |
| 2014/0061273 A1 | 3/2014 | Bullivant et al. |
| 2014/0062381 A1 | 3/2014 | Teggatz et al. |
| 2014/0072864 A1 | 3/2014 | Suzuta et al. |
| 2014/0082814 A1 | 3/2014 | Rober et al. |
| 2014/0095915 A1 | 4/2014 | Hitchcock et al. |
| 2014/0101831 A1 | 4/2014 | Balzano |
| 2014/0142507 A1 | 5/2014 | Armes |
| 2014/0206976 A1 | 7/2014 | Thompson et al. |
| 2014/0210399 A1 | 7/2014 | Urschel et al. |
| 2014/0226920 A1 | 8/2014 | Passavia |
| 2014/0361726 A1 | 12/2014 | Carkner |
| 2015/0060430 A1 | 3/2015 | Tsuge et al. |
| 2015/0086868 A1 | 3/2015 | Inoue et al. |
| 2015/0114444 A1 | 4/2015 | Lentine et al. |
| 2015/0114451 A1 | 4/2015 | Anderson et al. |
| 2015/0118543 A1 | 4/2015 | Kim et al. |
| 2015/0128845 A1 | 5/2015 | Desaulniers |
| 2015/0132622 A1 | 5/2015 | Gohl et al. |
| 2015/0198670 A1 | 7/2015 | Thiel |
| 2015/0200318 A1 | 7/2015 | Thiel |
| 2015/0216245 A1 | 8/2015 | Kinsley |
| 2015/0216274 A1 | 8/2015 | Akin et al. |
| 2015/0263377 A1 | 9/2015 | Brooks et al. |
| 2015/0295617 A1 | 10/2015 | Lai et al. |
| 2016/0026423 A1 | 1/2016 | Zenoff |
| 2016/0112004 A1 | 4/2016 | Thiel et al. |
| 2016/0118634 A1 | 4/2016 | Thiel et al. |
| 2016/0183394 A1 | 6/2016 | Raschilla et al. |
| 2016/0360146 A1 | 12/2016 | Smith |
| 2017/0045337 A1 | 2/2017 | Kim |
| 2017/0050259 A1 | 2/2017 | Schraff et al. |
| 2017/0110896 A1 | 4/2017 | Gissin et al. |
| 2017/0214103 A1 | 7/2017 | Onnerud et al. |
| 2017/0229692 A1 | 8/2017 | Thiel et al. |
| 2017/0245567 A1 | 8/2017 | Fathollahi et al. |
| 2017/0259956 A1 | 9/2017 | Hori et al. |
| 2017/0263902 A1 | 9/2017 | Hwang et al. |
| 2017/0264116 A1 | 9/2017 | Carkner et al. |
| 2017/0264237 A1 | 9/2017 | La Due |
| 2017/0280797 A1 | 10/2017 | Bayliss |
| 2018/0040910 A1 | 2/2018 | Chung et al. |
| 2018/0047994 A1 | 2/2018 | Perry et al. |
| 2018/0053919 A1 | 2/2018 | Thiel et al. |
| 2018/0062197 A1 | 3/2018 | Thiel et al. |
| 2018/0102518 A1 | 4/2018 | Thiel et al. |
| 2018/0102656 A1 | 4/2018 | Thiel et al. |
| 2018/0145445 A1 | 5/2018 | Louis et al. |
| 2018/0168065 A1 | 6/2018 | Thiel et al. |
| 2018/0249133 A1 | 8/2018 | Thiel et al. |
| 2018/0258882 A1 | 9/2018 | Thiel et al. |
| 2018/0309307 A1 | 10/2018 | Carkner |
| 2019/0081493 A1 | 3/2019 | Thiel et al. |
| 2019/0109349 A1 | 4/2019 | Thiel et al. |
| 2019/0133303 A1 | 5/2019 | Thiel et al. |
| 2020/0099023 A1 | 3/2020 | Thiel et al. |
| 2020/0112189 A1 | 4/2020 | McLean |
| 2020/0187379 A1 | 6/2020 | Thiel et al. |
| 2020/0288089 A1 | 9/2020 | Thiel et al. |
| 2020/0313610 A1 | 10/2020 | Thiel et al. |
| 2020/0343493 A1 | 10/2020 | Thiel et al. |
| 2021/0005850 A1 | 1/2021 | Thiel et al. |
| 2021/0005936 A1 | 1/2021 | Jeong |
| 2021/0032008 A1 | 2/2021 | Luo |
| 2021/0119192 A1 | 4/2021 | Gotcher |
| 2021/0273468 A1 | 9/2021 | Reimann |
| 2021/0280933 A1 | 9/2021 | Thiel et al. |
| 2021/0288375 A1 | 9/2021 | Baker |
| 2021/0289174 A1 | 9/2021 | Thiel et al. |
| 2021/0296925 A1 | 9/2021 | Long et al. |
| 2021/0313629 A1 | 10/2021 | Thiel et al. |
| 2022/0052536 A1 | 2/2022 | Thiel et al. |
| 2022/0231369 A1 | 7/2022 | Thiel et al. |
| 2022/0240654 A1 | 8/2022 | Thiel et al. |
| 2022/0285936 A1 | 9/2022 | Long et al. |
| 2023/0034714 A1 | 2/2023 | Thiel et al. |
| 2023/0208114 A1 | 6/2023 | Thiel et al. |
| 2023/0367284 A1 | 11/2023 | Moore et al. |
| 2023/0370414 A1 | 11/2023 | Moore et al. |
| 2023/0412119 A1 | 12/2023 | Thiel et al. |
| 2024/0113656 A1 | 4/2024 | Thiel et al. |
| 2024/0115020 A1 | 4/2024 | Thiel et al. |
| 2024/0128526 A1 | 4/2024 | Thiel et al. |
| 2024/0145836 A1 | 5/2024 | Thiel et al. |
| 2024/0145840 A1 | 5/2024 | Thiel et al. |
| 2024/0146037 A1 | 5/2024 | Thiel et al. |
| 2024/0186602 A1 | 6/2024 | Nguyen et al. |
| 2024/0250509 A1 | 7/2024 | Thiel et al. |
| 2024/0250541 A1 | 7/2024 | Thiel et al. |
| 2024/0266851 A1 | 8/2024 | Thiel et al. |
| 2024/0285062 A1 | 8/2024 | Thiel et al. |
| 2024/0297615 A1 | 9/2024 | Thiel et al. |
| 2024/0339708 A1 | 10/2024 | Thiel et al. |
| 2024/0405316 A1 | 12/2024 | Ma |
| 2024/0422296 A1 | 12/2024 | Thiel et al. |
| 2024/0431065 A1 | 12/2024 | Thiel et al. |
| 2025/0015374 A1 | 1/2025 | Thiel et al. |
| 2025/0015417 A1 | 1/2025 | Carlucci et al. |
| 2025/0022968 A1 | 1/2025 | Thiel et al. |
| 2025/0023334 A1 | 1/2025 | Thiel et al. |
| 2025/0023512 A1 | 1/2025 | Thiel et al. |
| 2025/0038166 A1 | 1/2025 | Chen et al. |
| 2025/0105641 A1 | 3/2025 | Thiel et al. |
| 2025/0112339 A1 | 4/2025 | Li et al. |
| 2025/0118976 A1 | 4/2025 | Thiel et al. |

(56)  References Cited

U.S. PATENT DOCUMENTS

| | | | |
|---|---|---|---|
| 2025/0141047 A1 | 5/2025 | Zhang et al. |
| 2025/0149646 A1 | 5/2025 | Kang et al. |
| 2025/0167568 A1 | 5/2025 | Thiel et al. |
| 2025/0167726 A1 | 5/2025 | Thiel et al. |
| 2025/0174741 A1 | 5/2025 | Zhu et al. |
| 2025/0226546 A1 | 7/2025 | Xu et al. |
| 2025/0226677 A1 | 7/2025 | Thiel et al. |
| 2025/0233160 A1 | 7/2025 | Jung |
| 2025/0246667 A1 | 7/2025 | Jeong |
| 2025/0246770 A1 | 7/2025 | Jun et al. |
| 2025/0246775 A1 | 7/2025 | Zhu et al. |
| 2025/0246778 A1 | 7/2025 | Jung et al. |
| 2025/0246780 A1 | 7/2025 | Ko et al. |
| 2025/0246787 A1 | 7/2025 | Jung |
| 2025/0253430 A1 | 8/2025 | Jeong |
| 2025/0260214 A1 | 8/2025 | Thiel et al. |
| 2025/0267241 A1 | 8/2025 | Thiel et al. |

FOREIGN PATENT DOCUMENTS

| | | | |
|---|---|---|---|
| CN | 202474897 U | 10/2012 |
| CN | 202931205 U | 5/2013 |
| CN | 203434648 U | 2/2014 |
| CN | 203435168 U | 2/2014 |
| CN | 205452304 U | 8/2016 |
| DE | 102011054322 A1 | 4/2012 |
| DE | 202012104339 U1 | 2/2014 |
| GB | 2518669 A | 4/2015 |
| GB | 2553537 A | 3/2018 |
| JP | 2002325339 A | 11/2002 |
| JP | 2003174179 A | 6/2003 |
| JP | 2004103248 A | 4/2004 |
| JP | 2014003846 A | 1/2014 |
| KR | 101145898 B1 | 5/2012 |
| KR | 101159750 B1 | 6/2012 |
| KR | 101294972 B1 | 8/2013 |
| WO | 2013106474 A1 | 7/2013 |
| WO | 2015181673 A1 | 12/2015 |
| WO | 2016061508 A1 | 4/2016 |
| WO | 2017040724 A1 | 3/2017 |

OTHER PUBLICATIONS

CaSZLUTION Bag. Amazon. https://www.amazon.com/dp/B0DJ8TV2VX.%20Accessed%2021%20Nov.%202024. Accessed Nov. 21, 2024.
DE 202012104339 Machine English translation (Year: 2014).
EE-Dan; Repair Your Laptop Power Cord; Instructables.com; published Jun. 11, 2013; https://www.instructables.com/Repair-Your-Laptop-Power-Cord/ (Year: 2013).
Electropaedia; Battery and Energy Technologies; printout from Jul. 2, 2012; pp. 1-5 (Year: 2012).
Epsilor; ELI-0414 Rechargeable Li-ion Military Battery; accessed and printed Apr. 21, 2020 (Year: 2020).
Machine translation of CN202931205U, Liu et al., 2013 (Year: 2013).
Machine translation of JP 2002-325339A, Okada Tadao, 2002 (Year: 2002).
Machine translation of JP 2004-103248; accessed and printed Aug. 7, 2021 (Year: 2004).
SATGEAR. https://satgear.com/products/starlink-gen-3-4-bag-backpack. Accessed Nov. 21, 2024.
Simon Tay, "DIY Spring Cable Support—To prevent cable damage", Dec. 13, 2013, YouTube, (Year: 2013).
Starlink Mini Specifications https://www.starlink.com/specifications?spec=5 Accessed Nov. 22, 2024.
STARLINK Roam. https://www.starlink.com/roam Accessed Nov. 21, 2024.
Translation of CN205452304 (Year: 2016).
Westover, Brian and Kan, Michael. SpaceX Selling $199 Backpack for Its Portable V4 Starlink Dish. PC Magazine, Nov. 12, 2024, https://www.pcmag.com/news/spacex-selling-199-backpack-for-its-portable-v4-starlink-dish. Accessed Nov. 21, 2024.
Yunhuan Group; 3 prong Australia AC power cord; archived Jul. 1, 2016; https://web.archive.org/web/20160701194647/http://www.yunhuanelectric.com/Australia-AC-Power-Cord-03.html (Year: 2016).

* cited by examiner

300

322

326

324

510
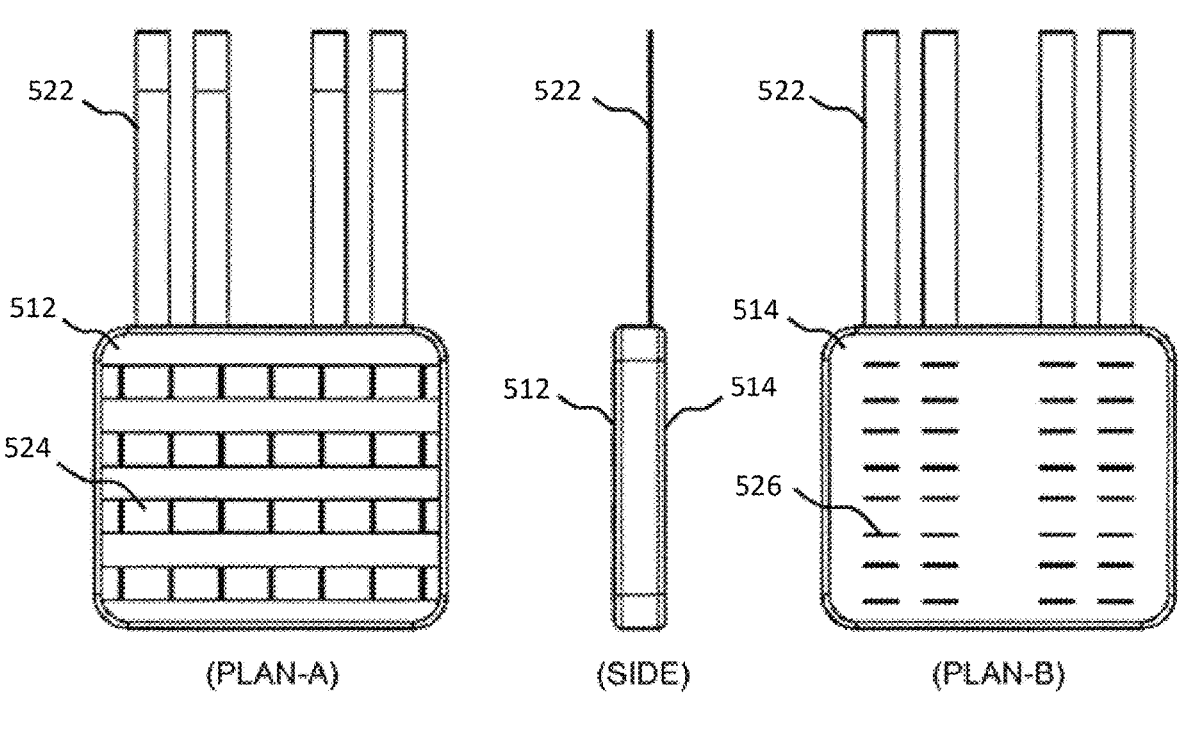
522
512
524
(PLAN-A)
FIG. 11A
522
512
514
(SIDE)
FIG. 11B
522
514
526
(PLAN-B)
FIG. 11C
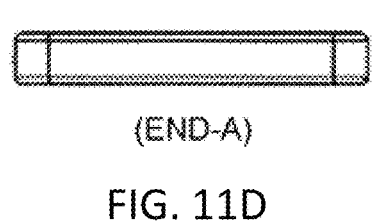
(END-A)
FIG. 11D
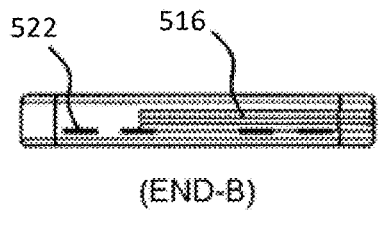
522     516
(END-B)
FIG. 11E

1500

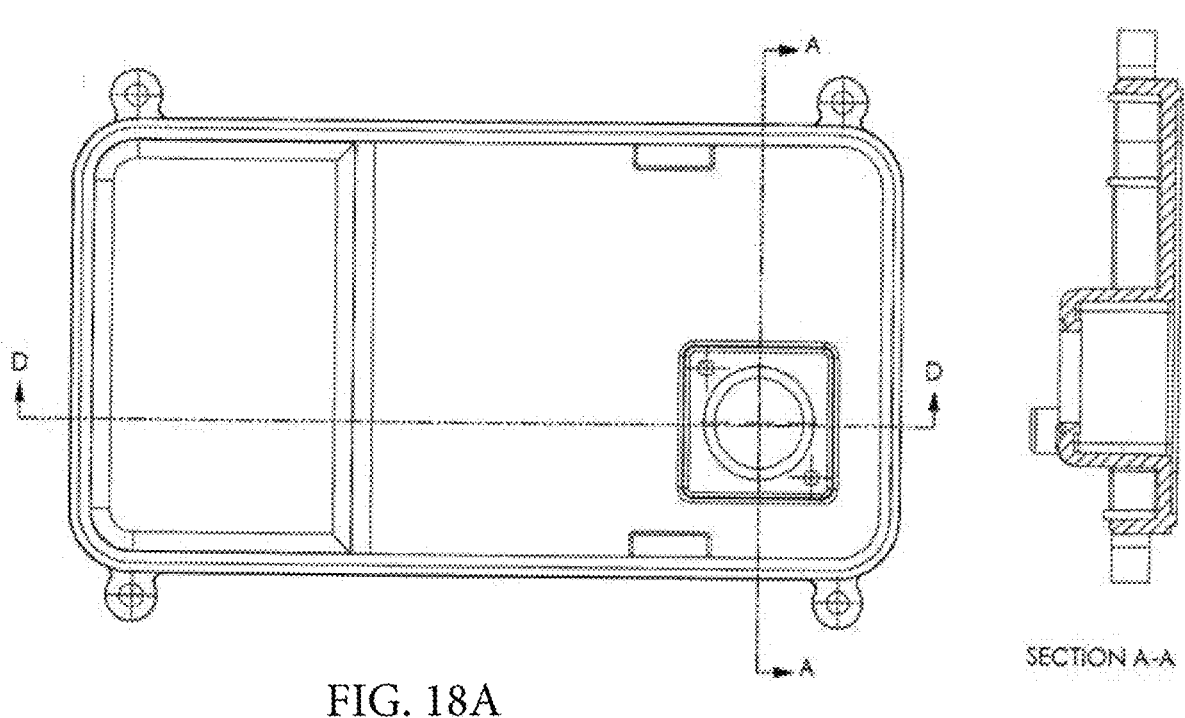
FIG. 18A
SECTION A-A
FIG. 18B
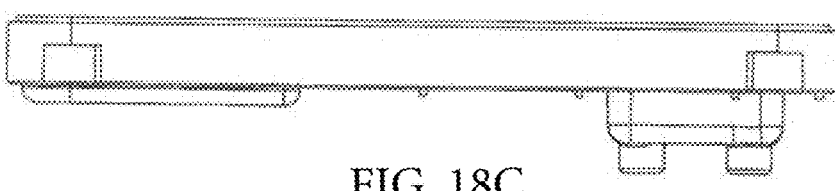
FIG. 18C
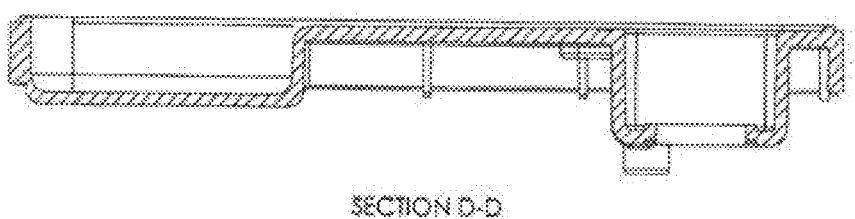
SECTION D-D
FIG. 18D

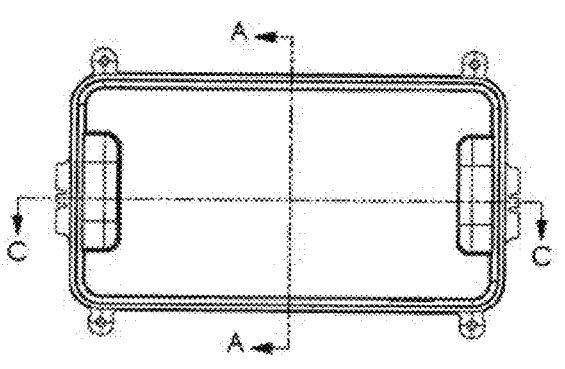
FIG. 19A
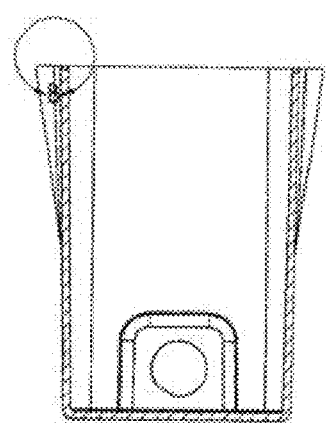
SECTION A-A
FIG. 19B
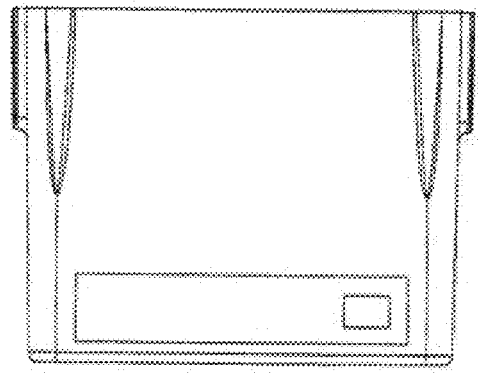
DETAIL 8
SCALE 2 : 1
FIG. 19C
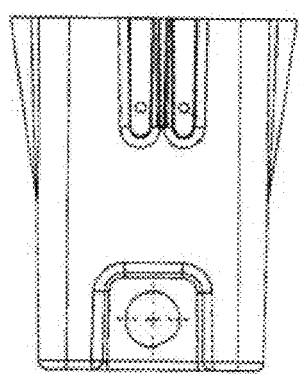
FIG. 19D
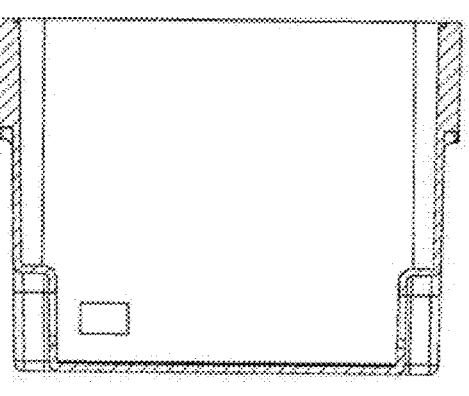
SECTION C-C
FIG. 19E
FIG. 19F

2100

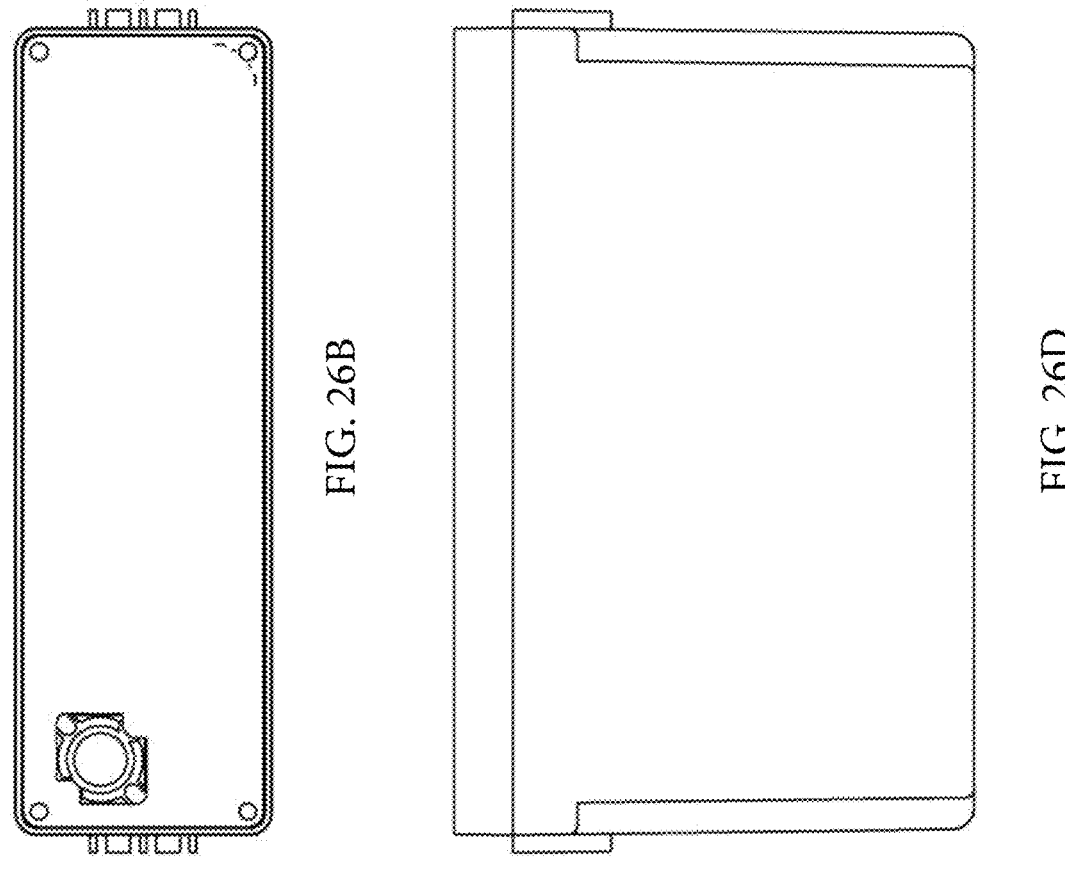
FIG. 26B
FIG. 26D
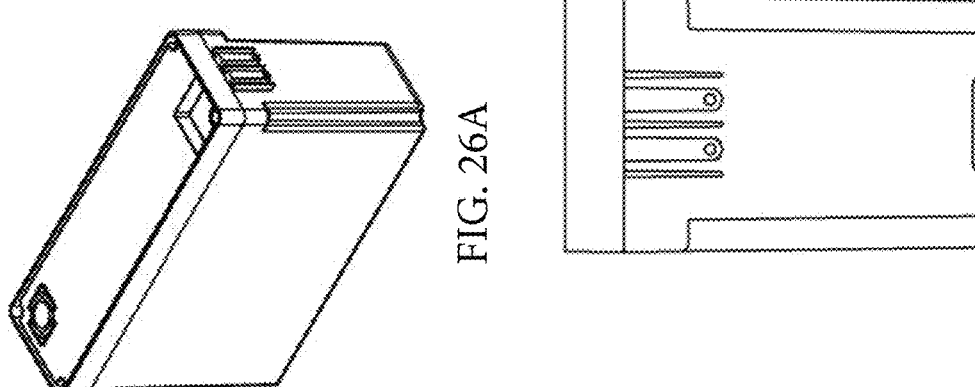
FIG. 26A
FIG. 26C

2100

120

2100

2702

2704

SECTION A-A
SCALE 1 : 1

3600

3602

3606

3604

PORTABLE POWER CASE WITH LITHIUM IRON PHOSPHATE BATTERY

CROSS REFERENCE TO RELATED APPLICATIONS

This application is related to and claims priority from the following U.S. patent applications: this application is a continuation of U.S. application Ser. No. 19/235,017, filed Jun. 11, 2025, which is a continuation of U.S. application Ser. No. 18/989,577, filed Dec. 20, 2024, which is continuation of U.S. application Ser. No. 18/615,613, filed Mar. 25, 2024, which is a continuation of U.S. application Ser. No. 17/331,187, filed May 26, 2021, which is a continuation of U.S. application Ser. No. 16/191,058, filed Nov. 14, 2018, which is a continuation-in-part of U.S. application Ser. No. 15/836,299, filed Dec. 8, 2017, which is a continuation-in-part of U.S. application Ser. No. 15/664,776, filed Jul. 31, 2017, and a continuation-in-part of U.S. application Ser. No. 15/720,270, filed Sep. 29, 2017. U.S. application Ser. No. 15/664,776 is a continuation-in-part of U.S. application Ser. No. 15/470,382, filed Mar. 27, 2017, which is a continuation-in-part of U.S. application Ser. No. 14/516,127, filed Oct. 16, 2014. U.S. application Ser. No. 15/720,270 is a continuation-in-part of U.S. application Ser. No. 14/520,821, filed Oct. 22, 2014, and a continuation-in-part of U.S. application Ser. No. 15/664,776, filed Jul. 31, 2017, which is a continuation-in-part of U.S. application Ser. No. 15/470,382, filed Mar. 27, 2017, which is a continuation-in-part of U.S. application Ser. No. 14/516,127, filed Oct. 16, 2014. Each of the U.S. Applications mentioned above is incorporated herein by reference in its entirety.

BACKGROUND OF THE INVENTION

1. Field of the Invention

The present invention relates generally to a portable power case comprised of at least one battery that allows the user to disassemble and selectively remove the batteries installed within the portable power case housing.

2. Description of the Prior Art

The military uses various types of portable electronic devices, such as portable battery-operated radios, which generate heat during operation, i.e., during normal operation, the devices may be heat-generating devices. In particular, a malfunctioning device can cause excessive heating. A drawback of heat-generating devices is that the heat may be transferred to the person using or carrying the device, causing uncomfortableness or burns. Another drawback of heat-generating devices is that the heat may be transferred to other devices, causing damage to these devices. Further, in military applications, heat-generating devices may increase the heat profile of military personnel, making them more prone to detection by thermal imaging and therefore more prone to danger.

It is known in the prior art to provide heat dissipating material or insulating material with heat-generating devices. It is also known in the prior art to provide a portable power supply for electronic devices, including military radios.

Representative prior art patent documents include the following:

U.S. Pat. No. 5,522,943 for portable power supply by inventors Spencer et al., filed Dec. 5, 1994 and issued Jun. 4, 1996, is directed to a portable power supply that includes at least one solar panel assembly that is capable of producing an electrical output through the conversion of solar energy to electrical energy. The power supply further includes power transmission means which is typically an electrical cable that will supply the power output of the solar panel to an electrical energy consuming device such as a portable computer or a battery for use therewith. The portable power supply further includes a case having at least two opposing side panels and includes solar panel assembly attachment means permitting the mounting of a solar panel assembly. The solar panel assembly typically comprises a photovoltaic panel attached to a backing panel. Backing panels utilized in the solar panel assembly may also be foldable, thus protecting the attached photovoltaic panel within the folded sections of the backing panel.

U.S. Pat. No. 5,621,299 for rechargeable power supply with load voltage sensing, selectable output voltage and a wrist rest by inventor Krall, filed Nov. 14, 1994 and issued Apr. 15, 1997, is directed to a plurality of rechargeable batteries are provided as part of an electronic system that includes an electronic circuit which controls periodic charging of the batteries and allows selection of the output voltage over a given range. The system is preferably packaged in a shape to be easily integrated with a carrying case, such as a briefcase, and/or to physically match a specific type of portable equipment, such as a notebook computer. In one embodiment, the batteries and circuitry are included in a wrist rest structure of a type used with portable computer keyboards. In other forms, the power supply is useable with a large number of other specific items of portable electronic equipment, such as portable video and telecommunications equipment.

U.S. Pat. No. 7,733,658 for integrated power supply and platform for military radio by inventors Perkins et al., filed May 15, 2007 and issued Jun. 8, 2010, is directed to a power platform assembly provided to convert available AC power into power suitable to power SINCGARS radio components. The platform includes a horizontal base for supporting up to two SINCGARS radios and a carriage assembly supported above the base to provide support for up to two radio frequency power amplifiers. Connectors, internal wiring, and electrical components inside the platform provide power and electrical connections between components within and connected to the platform. Ancillary electronics and connectors provide for remote audio monitoring of communications via an LS-671 external speaker, or equivalent external speaker arrangement. The platform allows various types of available AC power, as may vary across different regions of the world, to power the radios and radio frequency power amplifiers while allowing others in a secure vicinity of the platform to hear incoming and outgoing voice transmissions without draining the batteries powering the radios.

U.S. Pat. No. 8,059,412 for integrated power supply and platform for military radio by inventors Perkins et al., filed Jan. 26, 2009 and issued November 2011, is directed to an improved power supply and platform for a military radio. The apparatus includes a base that is adapted and arranged for supporting a HARRIS 117 radio and a power amplifier adapted to amplify radio frequency output of the radio. The connectors include an electrical connector for the radio and a connector for the amplifier. A power supply is housed within the assembly. A power supply for the connector to the amplifier is also housed within the assembly. Also included is a wiring harness for a SINCGARS LS/671 device and a LED indicator to identify which radio is in operation for multiple radio configurations.

U.S. Pat. No. 8,149,592 for sealed power supply and platform for military radio by inventors Perkins et al., filed Jun. 15, 2010 and issued Apr. 3, 2012, is directed to an AC/DC power supply and platform for a military radio. The apparatus includes a base that supports at least one SIN-CGARS RT-1523 radio. The base is connected to an AC power supply and at least one DC power supply. The AC supply and DC power supply are configured to switch automatically to the DC power supply should the AC power supply fail. The housing of the platform is sealed from the exterior environment with gaskets.

U.S. Pat. No. 8,462,491 for platform for military radio with vehicle adapter amplifier by inventors Perkins et al., filed Mar. 31, 2011, and issued Jun. 11, 2013, is directed to a platform for a military radio with a vehicle adapter amplifier. The apparatus includes a base for supporting at least one SINCGARS RT-1523 radio. The platform has a first power supply that includes a DC power converter for converting 110/220 alternating current into +28 Volt direct current and a second power supply that converts +28 Volt direct current into +6.75 Volts direct current, +13 Volts direct current and +200 Volt direct current. The platform includes a vehicle adapter power amplifier that provides range extension to said SINCGARS RT-1523 radio.

U.S. Pat. No. 8,531,846 for integrated AC/DC power supply and platform for military radio by inventors Perkins et al., filed Jun. 7, 2010 and issued Sep. 10, 2013, is directed to an AC/DC power supply and platform for a military radio. The apparatus includes a base that supports at least one SINCGARS RT-1523 radio. The base is connected to an AC power supply and at least one DC power supply. The AC supply and DC power supply are configured to switch automatically to the DC power supply should the AC power supply fail.

U.S. Pat. No. 8,638,011 for portable power manager operating methods by inventors Robinson et al., filed Jun. 15, 2010 and issued Jan. 28, 2014, is directed to various aspects of invention providing portable power manager operating methods. One aspect of the invention provides a method for operating a power manager having a plurality of device ports for connecting with external power devices and a power bus for connecting with each device port. The method includes: disconnecting each device port from the power bus when no external power device is connected to the device port; accessing information from newly connected external power devices; determining if the newly connected external power devices can be connected to the power bus without power conversion; if not, determining if the newly connected external power devices can be connected to the power bus over an available power converter; and if so, configuring the available power converter for suitable power conversion.

U.S. Pat. No. 8,885,354 for mount platform for multiple military radios by inventors Perkins et al., filed Mar. 15, 2013 and issued Nov. 11, 2014, is directed to a platform for a military radio with a vehicle adapter amplifier. The apparatus includes a base for supporting dual AN/VRC-110 radio systems. The platform has a first power supply that includes a DC power converter for converting 110/220 alternating current into +28 Volt direct current and a second power supply that converts +28 Volt direct current into +6.75 Volts direct current, +13 Volts direct current and +200 Volt direct current. The platform includes a vehicle adapter power amplifier that provides range extension to said dual AN/VRC-110 radio systems.

U.S. Patent Publication No. 20170110896 for a portable case comprising a rechargeable power source by inventors Gissin et al., filed May 18, 2015 and published Apr. 20, 2017, is directed to a portable case including a processor configured to control the portable case; a charging port; at least one output port; an adjustable energy storage system further including a battery printed circuit board (BPCB) including a plurality of battery packs connectors; and a central battery management microprocessor (CBMM); and a plurality of battery packs configured to be connected to the plurality of battery packs connectors and to provide power to electronic appliance connected to the at least one output port; a user interface configured to enable powering and monitoring of the portable case; and a recharging element, carryable by the portable case, the recharging element configured to be connected to the charging port and recharge at least one of the plurality of battery packs.

SUMMARY OF THE INVENTION

The present invention relates generally to a portable power case including at least one battery that allows the user to disassemble and selectively remove the batteries installed within the portable power case housing.

In one embodiment, the present invention provides systems, methods, and articles for a portable power case including at least one rechargeable battery and a printed circuit board (PCB) disposed within an open interior space of a hard case or housing. The hard case includes a lid and a base. The portable power case includes at least one universal serial bus (USB) port and at least two access ports, at least two leads, or at least one access port and at least one lead connected to the PCB and accessibly positioned on an exterior surface of the hard case. The at least one rechargeable battery is selectively removable from the hard case. The at least one USB port and the at least two access ports, the at least two leads, or the at least one access port and the at least one lead are operable to supply power to at least one electronic device. The at least two access ports, the at least two leads, or the at least one access port and the at least one lead are operable to charge the portable power case using at least one charging device.

In another embodiment, the present invention provides systems, methods, and articles for a portable power case including at least one rechargeable battery and a printed circuit board (PCB) disposed within an open interior space of a hard case or housing. The hard case includes a lid and a base. The portable power case includes at least two access ports, at least two leads, or at least one access port and at least one lead connected to the PCB and accessibly positioned on an exterior surface of the hard case. The at least one rechargeable battery is selectively removable from the hard case. The at least two access ports, the at least two leads, or the at least one access port and the at least one lead are operable to supply power to at least one electronic device. The at least two access ports, the at least two leads, or the at least one access port and the at least one lead are operable to charge the portable power case using at least one charging device. One of the at least one charging device is a vehicle battery. The portable power case is connected to the vehicle battery through a cable with a battery protector. The battery protector prevents the portable power case from draining the vehicle battery.

In yet another embodiment, the present invention provides systems, methods, and articles for a portable power case including at least one rechargeable battery and a printed circuit board (PCB) disposed within an open interior space of a hard case or housing. The hard case includes a lid and a base. The portable power case includes at least two access ports, at least two leads, or at least one access port and at least one lead connected to the PCB and accessibly positioned on an exterior surface of the hard case. The at least one rechargeable battery is selectively removable from the hard case. The at least two access ports, the at least two leads, or the at least one access port and the at least one lead are operable to supply power to at least one electronic device. The at least two access ports, the at least two leads, or the at least one access port and the at least one lead are operable to charge the portable power case using at least one charging device. The PCB includes control electronics configured to determine a state of charge of the portable power case and/or the at least one electronic device.

These and other aspects of the present invention will become apparent to those skilled in the art after a reading of the following description of the preferred embodiment when considered with the drawings, as they support the claimed invention.

BRIEF DESCRIPTION OF THE DRAWINGS

FIG. 11A illustrates a front perspective view of the wearable pouch or skin of the portable battery pack.

FIG. 11B illustrates a side perspective view of the wearable pouch or skin of the portable battery pack.

FIG. 11C illustrates a back perspective view of the wearable pouch or skin of the portable battery pack.

FIG. 11D illustrates a perspective view of an end of the wearable pouch or skin of the portable battery pack.

FIG. 11E illustrates a perspective view of another end of the wearable pouch or skin of the portable battery pack.

FIG. 18A illustrates a top perspective view of the battery lid.

FIG. 18B illustrates a cross-section view of the battery lid.

FIG. 18C illustrates a side perspective view of the battery lid.

FIG. 18D illustrates another cross-section view of the battery lid.

FIG. 19A illustrates a top perspective view of the battery base.

FIG. 19B illustrates a cross-section view of the battery base.

FIG. 19C illustrates a detail view of a part of the cross-section view of the battery base shown in FIG. 19B.

FIG. 19D illustrates a side perspective view of the battery base.

FIG. 19E illustrates another cross-section view of the battery base.

FIG. 19F illustrates another side perspective view of the battery base.

FIG. 26A illustrates an angled perspective view of a rechargeable battery in a housing for mating with a PRC-117F radio.

FIG. 26B illustrates a top view of a rechargeable battery in a housing for mating with a PRC-117F radio.

FIG. 26C illustrates a side view of a rechargeable battery in a housing for mating with a PRC-117F radio including a connector.

FIG. 26D illustrates another side view of a rechargeable battery in a housing for mating with a PRC-117F radio.

DETAILED DESCRIPTION

Figure 1A:
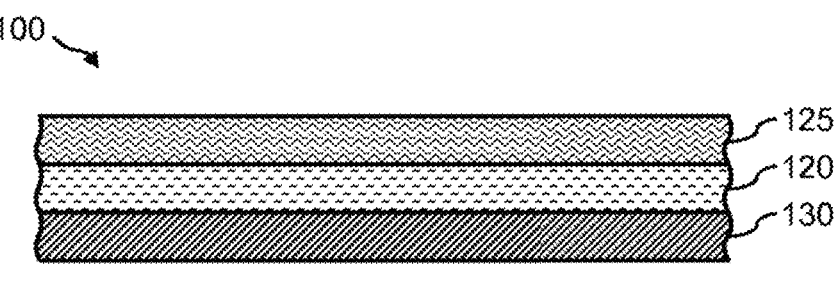
FIG. 1A illustrates a cross-sectional view of one embodiment of structures that include material for dissipating heat from electronic devices and/or clothing.

The present invention is generally directed to a portable power case comprised of at least one battery that allows the user to disassemble and selectively remove the batteries installed within the portable power case housing.

In one embodiment, the present invention provides systems, methods, and articles for a portable power case including at least one rechargeable battery and a printed circuit board (PCB) disposed within an open interior space of a hard case or housing. The hard case includes a lid and a base. The portable power case includes at least one universal serial bus (USB) port and at least two access ports, at least two leads, or at least one access port and at least one lead connected to the PCB and accessibly positioned on an exterior surface of the hard case. The at least one rechargeable battery is selectively removable from the hard case. The at least one USB port and the at least two access ports, the at least two leads, or the at least one access port and the at least one lead are operable to supply power to at least one electronic device. The at least two access ports, the at least two leads, or the at least one access port and the at least one lead are operable to charge the portable power case using at least one charging device.

In another embodiment, the present invention provides systems, methods, and articles for a portable power case including at least one rechargeable battery and a printed circuit board (PCB) disposed within an open interior space of a hard case. The hard case includes a lid and a base. The portable power case includes at least two access ports, at least two leads, or at least one access port and at least one lead connected to the PCB and accessibly positioned an exterior surface of the hard case. The at least one rechargeable battery is selectively removable from the hard case. The at least two access ports, the at least two leads, or the at least one access port and the at least one lead are operable to supply power to at least one electronic device. The at least two access ports, the at least two leads, or the at least one access port and the at least one lead are operable to charge the portable power case using at least one charging device. One of the at least one charging device is a vehicle battery. The portable power case is connected to the vehicle battery through a cable with a battery protector. The battery protector prevents the portable power case from draining the vehicle battery.

In yet another embodiment, the present invention provides systems, methods, and articles for a portable power case including at least one rechargeable battery and a printed circuit board (PCB) disposed within an open interior space of a hard case. The hard case includes a lid and a base. The portable power case includes at least two access ports, at least two leads, or at least one access port and at least one lead connected to the PCB and accessibly positioned on an exterior surface of the hard case. The at least one rechargeable battery is selectively removable from the hard case. The at least two access ports, the at least two leads, or the at least one access port and the at least one lead are operable to supply power to at least one electronic device. The at least two access ports, the at least two leads, or the at least one access port and the at least one lead are operable to charge the portable power case using at least one charging device. The PCB includes control electronics configured to determine a state of charge of the portable power case and/or the at least one electronic device.

In other embodiments, the present invention provides systems, methods, and articles for a portable power case having a heat-shielding or blocking and/or heat-dissipating material layer or coating. The heat-shielding or blocking and/or heat-dissipating material is used to prevent and/or minimize heat transfer and the thermal effects produced from batteries, as well as to prevent and/or minimize heat transfer from external heat-producing articles or objects.

Team operations in remote locations, such as military operations, require radios to allow team members to communicate about danger, injuries, opportunities, etc. Without radios in these environments, more people would be injured or die. These operations also require other equipment (e.g., amplifiers, wearable batteries, mobile phones, tablets) to allow team members to communicate, survey the environment, etc. The radios and other equipment typically require lithium ion batteries. However, the lithium ion batteries may not be able to the power the radios and other equipment for the time necessary to complete the operation on a single charge. As such, a portable power supply may be required to recharge the lithium ion batteries.

Additionally, the team operation may be attacked by enemy forces, requiring the team to quickly escape. Further, shipping large lithium ion batteries or devices with lithium ion batteries is banned or highly regulated in most parts of the world due to the risk of overheating and/or fire. What is needed is a portable power case that allows a user to disassemble and selectively remove the batteries installed within the portable power case housing. As lithium ion batteries were developed in the 1970s and have been in commercial use since the 1990s, there is a long-felt unmet need for a portable power case that is operable to supply power to at least one electronic device, is operable to be charged using at least one charging device, and allows the user to disassemble and selectively remove the batteries installed within the portable power case housing.

None of the prior art provides a portable power case that is operable to supply power to at least one electronic device, is operable to be charged using at least one charging device, and allows the user to disassemble and selectively remove the batteries installed within the portable power case housing.

Certain aspects of the presently disclosed subject matter of the invention, having been stated hereinabove, are addressed in whole or in part by the presently disclosed subject matter, and other aspects will become evident as the description proceeds when taken in connection with the accompanying illustrative examples and figures as best described herein below.

Referring now to the drawings in general, the illustrations are for the purpose of describing a preferred embodiment of the invention and are not intended to limit the invention thereto.

The present invention provides a material for 1) reducing or eliminating heat exposure from external objects or other heat-producing devices and/or 2) dissipating heat from at least one battery or heat-producing electronic device. The heat blocking or shielding and/or heat-dissipating material is incorporated into the housing of a heat-producing device or battery pack housing, or any article of clothing or fabric. In one example, a heat shielding or blocking and/or heat-dissipating material layer is sandwiched between two substrates, wherein the substrates may be flexible, rigid, or a combination of both flexible and rigid.

When applied to clothing, the heat blocking or shielding and/or heat-dissipating material is operable to protect a person's skin from burns from a heat-generating article or source. Surprisingly, one embodiment of the heat blocking or shielding and/or heat-dissipating material layer was discovered when it was in a person's hand but they were not burned by a heat gun when holding the material in hand, between the heat gun and skin. It was later tested and proved completely heat-resistant, heat-shielding, and/or heat-dissipating up to temperatures of heat guns (up to about 1,000 degrees Fahrenheit), propane torches (up to about 3,623 degrees Fahrenheit), and oxygen-fed torches (up to about 5,110 degrees Fahrenheit). These surprising test results combined with other trials generated the embodiments of the present invention and the particular examples that are described herein, in particular for linings or coatings that are constructed and configured especially for heat blocking or shielding and/or heat-dissipating material layer or coating applied to objects for protecting an article from any external heat source, as well as dissipating heat produced by heat-producing devices and their batteries.

Figure 1B:
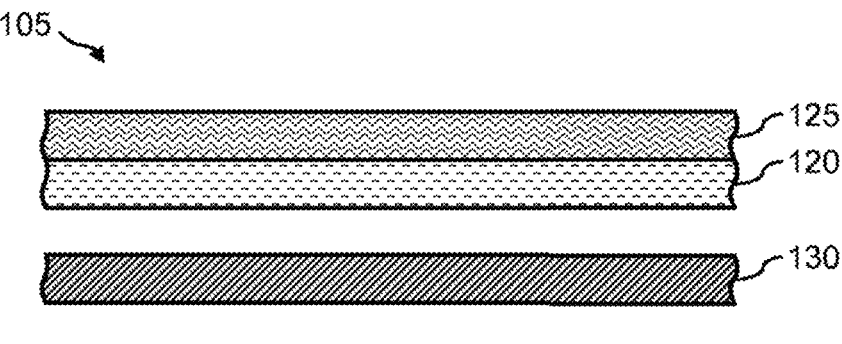
FIG. 1B illustrates a cross-sectional view of another embodiment of structures that include material for dissipating heat from electronic devices and/or clothing.

FIG. 1A and FIG. 1B are cross-sectional views of examples of structures that include the material for dissipating heat from electronic devices and/or clothing. The heat-dissipating material can be used in combination with, for example, one or two substrates. For example, FIG. 1A shows a structure 100 that includes a heat-dissipating layer 120. The heat-dissipating layer 120 can be sandwiched between a first substrate 125 and a second substrate 130.

The heat-dissipating layer 120 can be any material that is suitable for dissipating heat from electronic devices and/or clothing. The heat-dissipating layer 120 can be from about 20 μm thick to about 350 μm thick in one example. In particular embodiments, the heat-dissipating layer 120 can have a thickness ranging from about 1 mil to about 6 mil, including, but not limited to, 1, 2, 3, 4, 5, and 6 mil, or about 25 μm to about 150 μm, including, but not limited to, 25, 50, 75, 100, 125, and 150 μm. Examples of the heat-dissipating layer 120 include anti-static, anti-radio frequency (RF), and/or anti-electromagnetic interference (EMI) materials, such as copper shielding plastic or copper particles bonded in a polymer matrix, as well as anti-tarnish and anti-corrosion materials. A specific example of the heat-dissipating layer 120 is the anti-corrosive material used in Corrosion Intercept Pouches, catalog number 034-2024-10, available from University Products Inc. (Holyoke, Mass.). The anti-corrosive material is described in U.S. Pat. No. 4,944,916 to Franey, which is incorporated by reference herein in its entirety. Such materials can comprise copper shielded or copper impregnated polymers including, but not limited to, polyethylene, low-density polyethylene, high-density polyethylene, polypropylene, and polystyrene. In another embodiment, the heat shielding or blocking and/or heat-dissipating layer is a polymer with aluminum and/or copper particles incorporated therein. In particular, the surface area of the polymer with aluminum and/or copper particles incorporated therein preferably includes a large percent by area of copper and/or aluminum. By way of example and not limitation, the surface area of the heat-dissipating layer includes about 25% by area copper and/or aluminum, 50% by area copper and/or aluminum, 75% by area copper and/or aluminum, or 90% by area copper and/or aluminum. In one embodiment, the heat shielding or blocking and/or heat-dissipating layer is substantially smooth and not bumpy. In another embodiment, the heat shielding or blocking and/or heat-dissipating layer is not flat but includes folds and/or bumps to increase the surface area of the layer. Alternatively, the heat-shielding or blocking and/or heat-dissipating layer 120 includes a fabric having at least one metal incorporated therein or thereon. The fabric further includes a synthetic component, such as by way of example and not limitation, a nylon, a polyester, or an acetate component. Preferably, the at least one metal is selected from the group consisting of copper, nickel, aluminum, gold, silver, tin, zinc, or tungsten.

The first substrate 125 and the second substrate 130 can be any flexible or rigid substrate material. An example of a flexible substrate is any type of fabric. Examples of rigid substrates include, but are not limited to, glass, plastic, and metal. A rigid substrate may be, for example, the housing of any device. In one example, both the first substrate 125 and the second substrate 130 are flexible substrates. In another example, both the first substrate 125 and the second substrate 130 are rigid substrates. In yet another example, the first substrate 125 is a flexible substrate and the second substrate 130 is a rigid substrate. In still another example, the first substrate 125 is a rigid substrate and the second substrate 130 is a flexible substrate. Further, the first substrate 125 and the second substrate 130 can be single-layer or multi-layer structures.

Figure 1C:
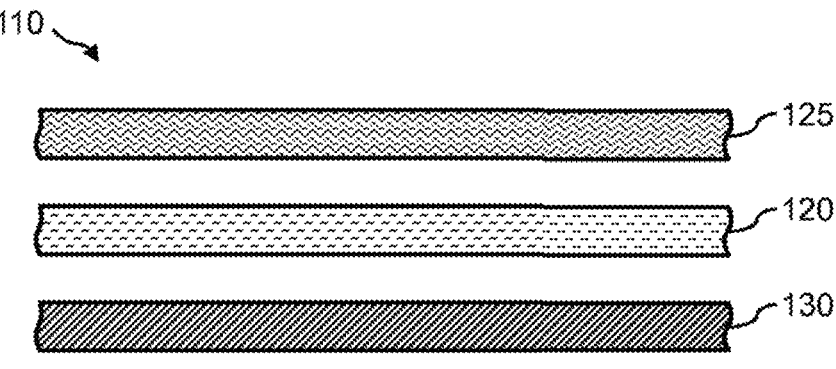
FIG. 1C illustrates a cross-sectional view of yet another embodiment of structures that include material for dissipating heat from electronic devices and/or clothing.
Figure 1D:
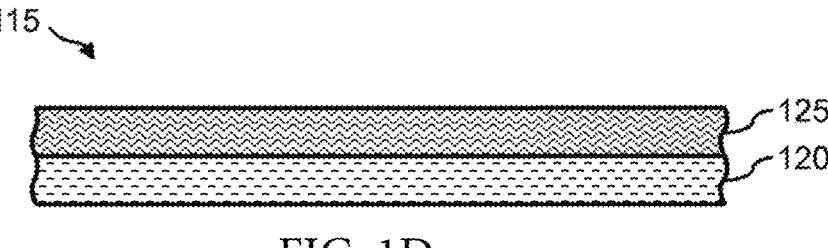
FIG. 1D illustrates a cross-sectional view of yet another embodiment of structures that include material for dissipating heat from electronic devices and/or clothing.

In structure 100 of FIG. 1A, the heat-shielding or blocking and/or heat-dissipating layer 120, the first substrate 125, and the second substrate 130 are bonded or otherwise attached together, by way of example and not limitation, by adhesive, laminating, stitching, or hook-and-loop fastener system. In another example and referring now to FIG. 1B, in a structure 105, the first substrate 125 is bonded to one side of the heat shielding or blocking and/or heat-dissipating layer 120, whereas the second substrate 130 is not bonded or otherwise attached to the other side of the heat shielding or blocking and/or heat-dissipating layer 120. In yet another example and referring now to FIG. 1C, in a structure 110, the first substrate 125 is provided loosely against one side of the heat shielding or blocking and/or heat-dissipating layer 120 and the second substrate 130 is provided loosely against the other side of the heat-dissipating layer 120. The first substrate 125 and the second substrate 130 are not bonded or otherwise attached to the heat shielding or blocking and/or heat-dissipating layer 120. In still another example and referring now to FIG. 1D, in a structure 115, the heat shielding or blocking and/or heat-dissipating layer 120 is provided in combination with the first substrate 125 only, either bonded or loosely arranged. In FIG. 1D, if the two layers are loosely arranged, the heat-dissipating layer 120 is not bonded or otherwise attached to the first substrate 125. The presently disclosed material is not limited to the structures 100, 105, 110, 115. These structures are exemplary only.

The heat-shielding or blocking and/or heat-dissipating layer 120 can be used as a protective shield against heated objects and also for reducing the heat profile of objects. For example, in military applications, the heat shielding or blocking and/or heat-dissipating layer 120 can be used to reduce the heat profile of devices or clothing for military personnel to reduce the risk of their being detected by thermal imaging.

Other examples of applications and/or uses of the heat-shielding or blocking and/or heat-dissipating layer 120 include, but are not limited to, insulating battery packs, for example in any battery housing or electronic device housing; protecting device and/or users from undesirable external heat; forming sandwich structures; form fitting to a particular device; enclosing electronic materials to prevent corrosion or feathering; medical applications to protect patients from heated devices used in surgical procedures, for example, in robotics (e.g., for use in disposable, sterile drapes); forming solar panels; lining tents (e.g., to prevent heat from going in or out); forming heat shields or guards for mufflers on, for example, motorcycles, lawn mowers, leaf blowers, or weed eaters; lining gloves to protect from flames, handling ice, and/or for preparing food (including pastry preparation).

Other examples of protective flexible heat shielding applications in which the heat-dissipating layer 120 can be used include gloves (e.g., fire pit gloves, gloves/forearm shields for operating two-stroke engine yard equipment), integrated in uniforms (e.g., nurses/scrub technicians in operating rooms vs. electro cautery), motorcyclist (clothing) protection from tail pipes, protective shielding in radio pouches (e.g., protecting person from radio heat, protecting radio from heating battery, protecting battery from heating radio, protecting battery from external heat sources), protection on the bottom of a laptop (inside the laptop housing), protection layer from heat of laptop for laps (e.g., lap tray) and expensive furniture (e.g., furniture pad), and portable protective heat shield (e.g., protect sensitive electronics and persons, varies in sizes).

Figure 2A:
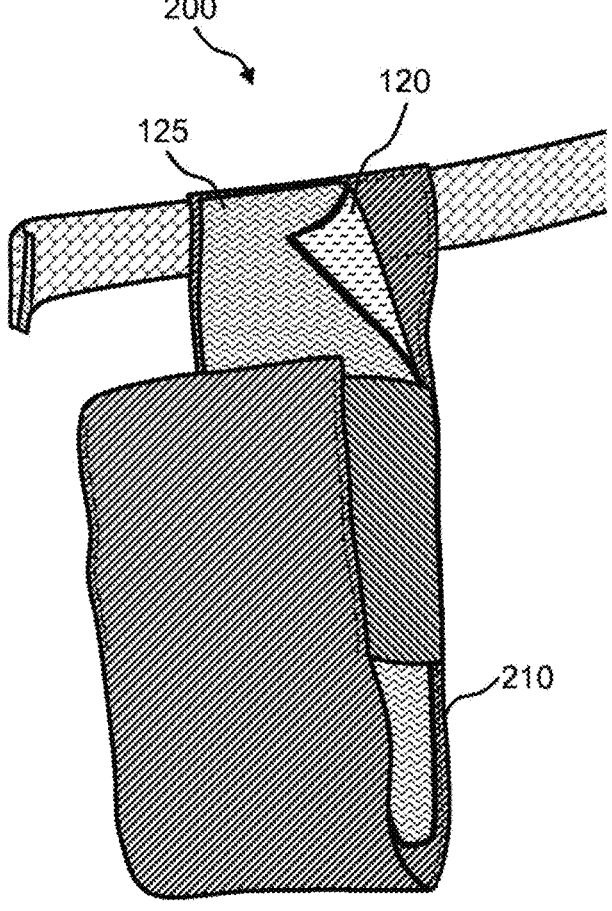
FIG. 2A is a view of a radio holder article held in a pouch.

FIG. 2A is a perspective view of a radio holder article 200 into which the heat-shielding or blocking and/or heat-dissipating layer 120 is installed. The radio holder article 200 is an example of equipment that may be used by military personnel. The radio holder article 200 is but one example of using the heat-shielding or blocking and/or heat-dissipating layer 120 for dissipating heat from an article. Military radios often get hot and can cause burns to the user.

Figure 2B:
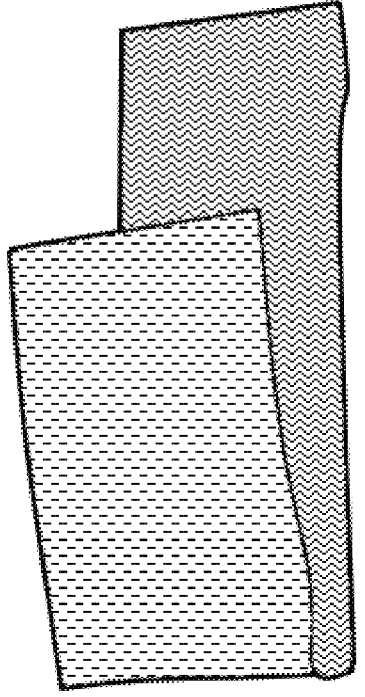
FIG. 2B is a view of the radio holder article of FIG. 2A removed from the pouch.

The radio holder article 200 can be removably held in a pouch 210 and worn on a user's belt 230. FIG. 2B is a view of the radio holder article 200 removed from the pouch 210. In this example, a structure, such as the structure 115 of FIG. 1D, is formed separately and then inserted into the pouch 210 of the radio holder article 200. In another example, in the case of the structure 105 of FIG. 1B, the radio holder article 200 itself serves as the second substrate 130. This allows the radio holder article 200 to be easily removed from the pouch 210. It also provides for retrofitting the pouch with heat protection from the heat-shielding or blocking and/or heat-dissipating material layer or coating.

Alternatively, the radio holder article 200 is permanently held in the pouch 210. The pouch 210 is formed using a structure, such as the structure 100 of FIG. 1A. The pouch 210 includes a pouch attachment ladder system (PALS) adapted to attach the pouch to a load-bearing platform (e.g., belt, rucksack, vest). In a preferred embodiment, the pouch 210 is MOLLE-compatible. "MOLLE" means Modular Lightweight Load-carrying Equipment, which is the current generation of load-bearing equipment and backpacks utilized by a number of North Atlantic Treaty Organization (NATO) armed forces.

In this example, the heat-shielding or blocking and/or heat-dissipating layer 120 protects the user from heat from the radio (not shown), the heat shielding or blocking and/or heat-dissipating layer 120 protects the radio (not shown) from any external heat source (e.g., a hot vehicle), and the heat shielding or blocking and/or heat-dissipating layer 120 reduces the heat profile of the radio (not shown).

In a preferred embodiment, the substrate 225 can be formed of any flexible, durable, and waterproof or at least water resistant material. For example, the substrate 225 can be comprised of polyester, polyvinyl chloride (PVC)-coated polyester, vinyl-coated polyester, nylon, canvas, PVC-coated canvas, or polycotton canvas. The exterior finish of the substrate 225 can be any color, such as white, brown, or green, or any pattern, such as camouflage, as provided herein, or any other camouflage in use by the military.

Representative camouflages include, but are not limited to, universal camouflage pattern (UCP), also known as ACUPAT or ARPAT or Army Combat Uniform; MultiCam, also known as Operation Enduring Freedom Camouflage Pattern (OCP); Universal Camouflage Patter-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Overwhite Snow digital camouflage, and Tactical Assault Camouflage (TACAM).

Figure 3:
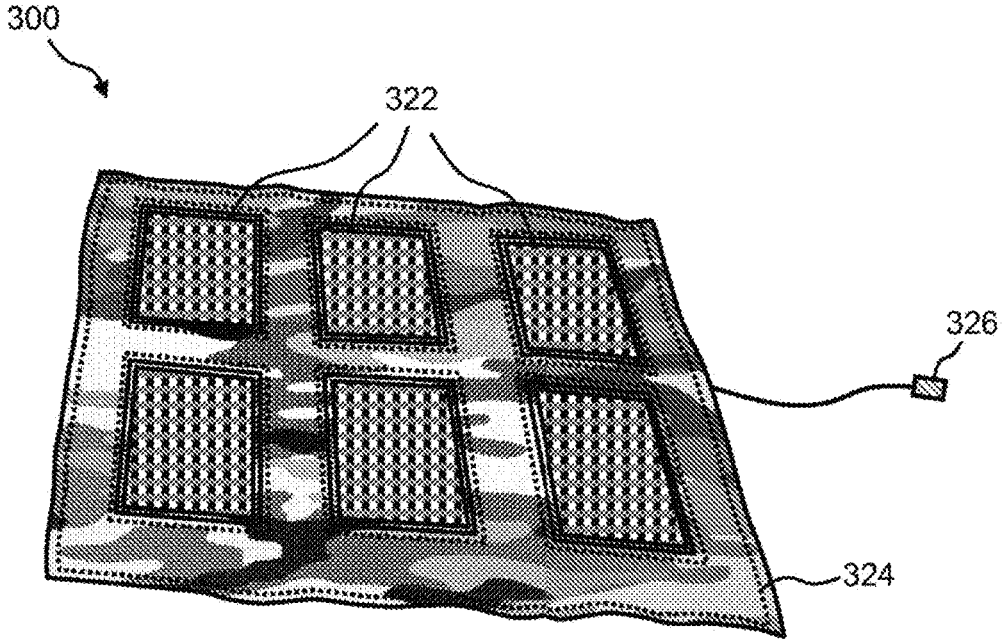
FIG. 3 is a perspective view of an example of a flexible solar panel.
Figure 4:
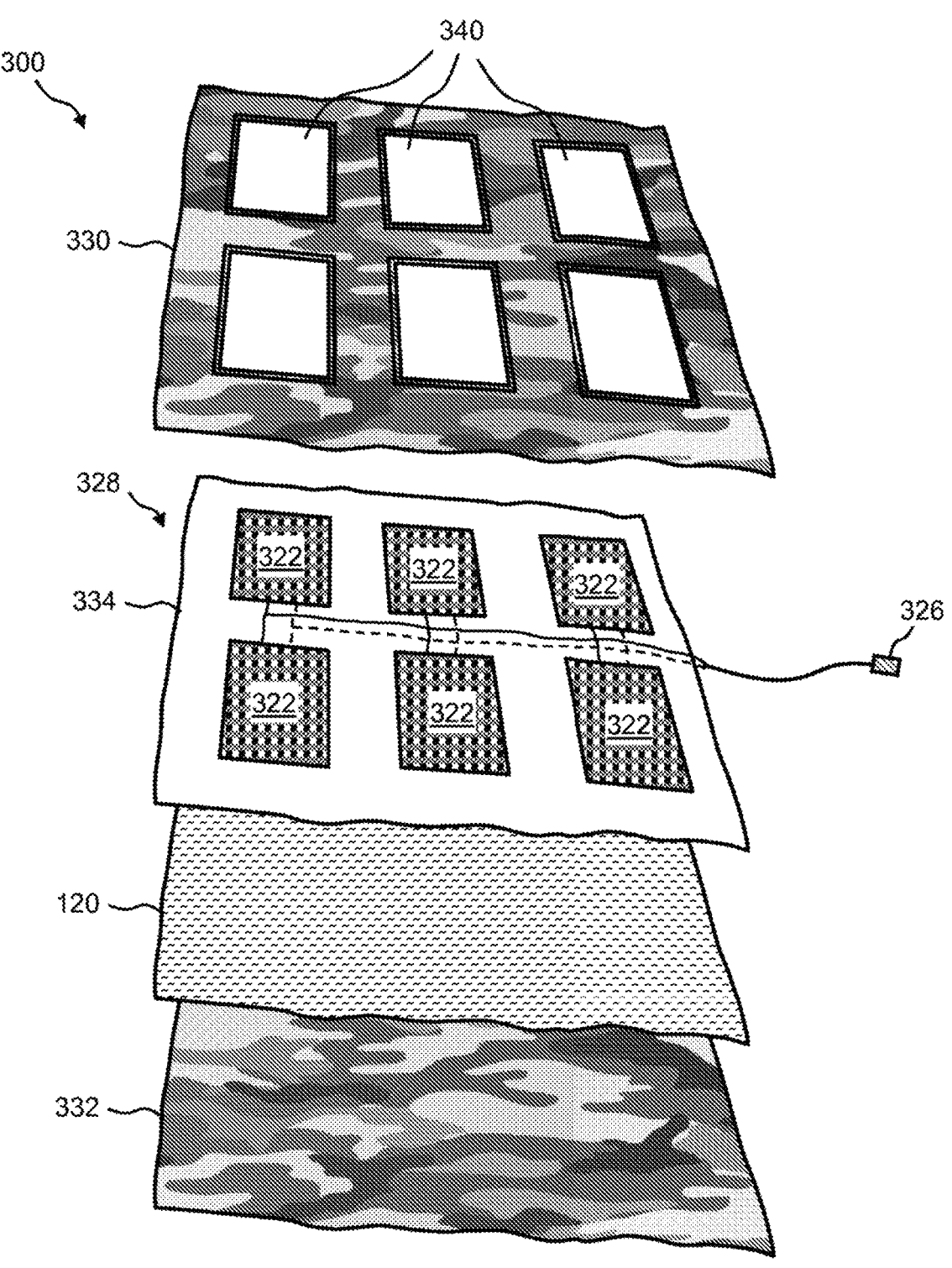
FIG. 4 is an exploded view of an example of a flexible solar panel.

FIG. 3 and FIG. 4 are a perspective view and an exploded view, respectively, of a flexible solar panel article 300 into which the heat-shielding or blocking and/or heat-dissipating layer 120 is installed. The flexible solar panel article 300 is another example of equipment that may be used by military personnel. The flexible solar panel article 300 is but another example of using the heat shielding or blocking and/or heat-dissipating layer 120 for shielding or blocking external heat to and/or dissipating heat from an article.

In this example, the flexible solar panel article 300 is a flexible solar panel that can be folded up and carried in a backpack and then unfolded and deployed as needed. The flexible solar panel article 300 is used, for example, to charge rechargeable batteries or to power electronic equipment directly.

The flexible solar panel article 300 is a multilayer structure that includes multiple solar modules 322 mounted on a flexible substrate, wherein the flexible substrate with the multiple solar modules 322 is sandwiched between two layers of fabric. Windows are formed in at least one of the two layers of fabric for exposing the solar modules 322.

A hem 324 may be provided around the perimeter of the flexible solar panel article 300. In one example, the flexible solar panel article 300 is about 36×36 inches. The output of any arrangement of solar modules 322 in the flexible solar panel article 300 is a direct current (DC) voltage. Accordingly, the flexible solar panel article 300 includes an output connector 326 that is wired to the arrangement of solar modules 322. The output connector 326 is used for connecting any type of DC load to the flexible solar panel article 300. In one example, the flexible solar panel article 300 is used for supplying power a device, such as a DC-powered radio. In another example, the flexible solar panel article 300 is used for charging a battery.

The flexible solar panel article 300 includes a solar panel assembly 328 that is sandwiched between a first fabric layer 330 and a second fabric layer 332. The first fabric layer 330 and the second fabric layer 332 can be formed of any flexible, durable, and substantially waterproof or at least water resistant material, such as but not limited to, polyester, PVC-coated polyester, vinyl-coated polyester, nylon, canvas, PVC-coated canvas, and polycotton canvas. The first fabric layer 330 and the second fabric layer 332 can be any color or pattern, such as the camouflage pattern shown in FIG. 3 and FIG. 4.

The solar panel assembly 328 of the flexible solar panel article 300 includes the multiple solar modules 322 mounted on a flexible substrate 334. A set of windows or openings 340 is provided in the first fabric layer 330 for exposing the faces of the solar modules 322. The flexible substrate 334 is formed of a material that is lightweight, flexible (i.e., foldable or rollable), printable, and substantially waterproof or at least water resistant.

In the flexible solar panel article 300, the heat-dissipating layer 120 is incorporated into the layers of fabric that form the flexible solar panel article 300, in similar fashion to the structure 100 of FIG. 1A. Namely, the heat-dissipating layer 120 is provided at the back of solar modules 322, between the flexible substrate 334 and the second fabric layer 332. In this example, the first fabric layer 330, the flexible substrate 334, the heat-dissipating layer 120, and the second fabric layer 332 are held together by stitching and/or by a hook-and-loop fastener system.

In this example, the heat-shielding or blocking and/or heat-dissipating layer 120 protects the user from heat from the back of the flexible solar panel article 300, the heat-shielding or blocking and/or heat-dissipating layer 120 protects the back of the flexible solar panel article 300 from any external heat source (not shown), and the heat-dissipating layer 120 reduces the heat profile of the flexible solar panel article 300.

Figure 5:
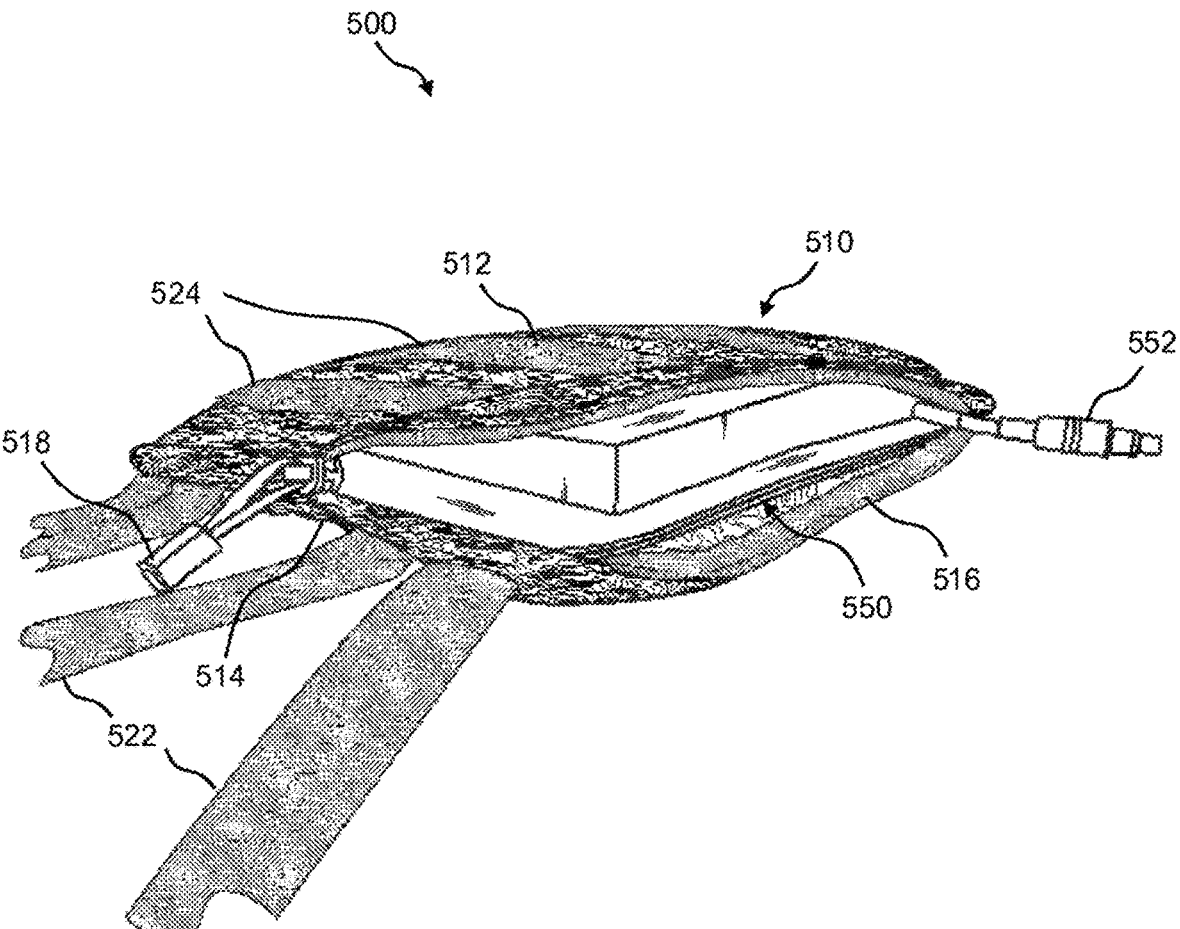
FIG. 5 is a perspective view of an example of a portable battery pack.
Figure 6:
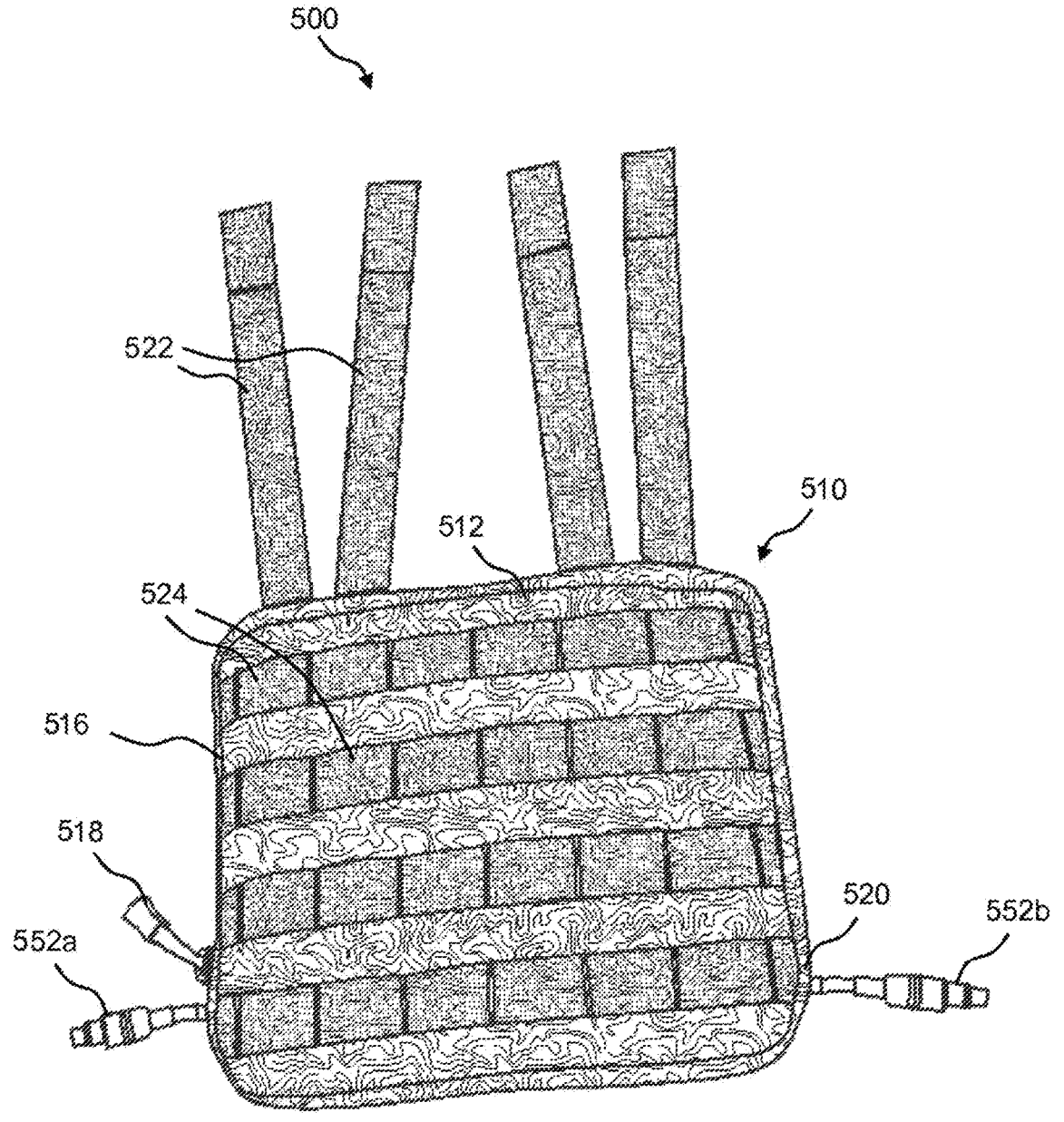
FIG. 6 is another perspective view of an example of a portable battery pack.
Figure 7:
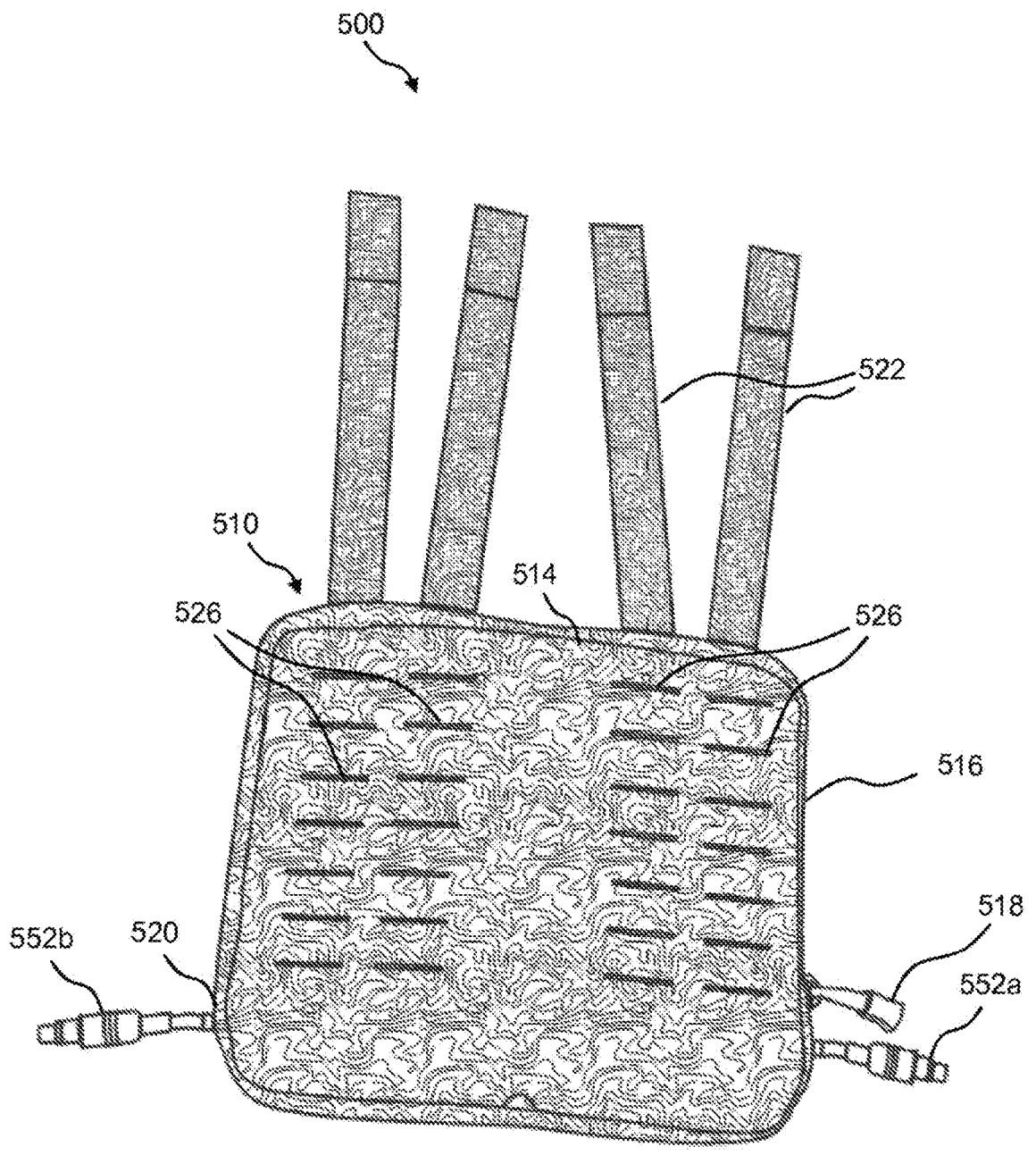
FIG. 7 is yet another perspective view of an example of a portable battery pack.

FIGS. 5-7 are perspective views of a portable battery pack 500 into which the heat dissipating material is installed. The portable battery pack 500 is an example of equipment that may be used by military personnel. The portable battery pack 500 is but one example of using the heat-shielding or blocking and/or heat-dissipating layer 120 for dissipating heat from an article. In a preferred embodiment, the portable battery pack comprises a portable battery pack such as that disclosed in U.S. Publication No. 20160118634 or U.S. application Ser. No. 15/720,270, each of which is incorporated herein by reference in its entirety.

Portable battery pack 500 comprises a pouch 510 for holding a battery 550. Pouch 510 is a wearable pouch or skin that can be sized in any manner that substantially corresponds to a size of battery 550. In one example, pouch 510 is sized to hold a battery 550 that is about 9.75 inches long, about 8.6 inches wide, and about 1 inch thick.

Pouch 510 is formed of any flexible, durable, and substantially waterproof or at least water resistant material. For example, pouch 510 can be formed of polyester, polyvinyl chloride (PVC)-coated polyester, vinyl-coated polyester, nylon, canvas, PVC-coated canvas, or polycotton canvas. The exterior finish of pouch 510 can be any color, such as white, brown, or green, or any pattern, such as camouflage, as provided herein, or any other camouflage in use by the military. For example, in FIG. 5, FIG. 6, and FIG. 7, pouch 510 is shown to have a camouflage pattern.

Representative camouflages include, but are not limited to, universal camouflage pattern (UCP), also known as ACUPAT or ARPAT or Army Combat Uniform; MultiCam, also known as Operation Enduring Freedom Camouflage Pattern (OCP); Universal Camouflage Patter-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Over-white Snow digital camouflage, and Tactical Assault Camouflage (TACAM).

Pouch 510 has a first side 512 and a second side 514. Pouch 510 also comprises an opening 516, which is the opening through which battery 550 is fitted into pouch 510. In one example, opening 516 is opened and closed using a zipper, as such pouch 510 includes a zipper tab 518. Other mechanisms, however, can be used for holding opening 516 of pouch 510 open or closed, such as, a hook and loop system (e.g., VELCRO®), buttons, snaps, hooks, and the like. Further, an opening 520 (see FIG. 6, FIG. 7, FIG. 9) is provided on the end of pouch 510 that is opposite opening 516. For example, opening 520 can be a 0.5-inch long slit or a 0.75-inch long slit in the edge of pouch 510.

In one embodiment, the pouch is a multi-layer structure, such as the structure 100 of FIG. 1A, including at least one layer of the heat-dissipating layer. In this embodiment, the heat-dissipating layer is permanently attached to the pouch. Alternatively, a structure, such as the structure 115 of FIG. 1D, is formed separately and then inserted into the pouch 510 of the portable battery pack 500. This allows the user to retrofit an existing pouch with heat protection. The retrofit structure comprises a structure, such as the structure 115 of FIG. 1D, for protecting the first side 512 and/or the second side 514. The retrofit structure comprises a large structure that is operable to wrap around the battery 550 in an alternative embodiment.

In one example, battery 550 is a rechargeable battery that comprises two leads 552 (e.g., leads 552a, 552b). Each lead 552 can be used for both the charging function and the power supply function. In other words, leads 552a, 552b are not dedicated to the charging function only or the power supply function only, both leads 552a, 552b can be used for either function at any time. In one example, one lead 552 can be used for charging battery 550 while the other lead 552 can be used simultaneously for supplying power to equipment, or both leads 552 can be used for supplying power to equipment, or both leads 552 can be used for charging battery 550. In a preferred embodiment, the leads 552 are a female circular type of connector (TAJIMI™ part number R04-P5f).

Each lead 552 is preferably operable to charge and discharge at the same time. In one example, a Y-splitter with a first connector and a second connector is attached to a lead 552. The Y-splitter allows the lead 552 to supply power to equipment via the first connector and charge battery 550 via the second connector at the same time. Thus, the leads 552 are operable to allow power to flow in and out of the battery simultaneously.

With respect to using battery 550 with pouch 510, first the user unzips opening 516, then the user inserts one end of battery 550 that has, for example, lead 552b through opening 516 and into the compartment inside pouch 510. At the same time, the user guides the end of lead 552b through opening 520, which allows the housing of battery 550 to fit entirely inside pouch 510, as shown in FIG. 5. Lead 552a is left protruding out of the unzipped opening 516. Then the user zips opening 516 closed, leaving zipper tab 518 snugged up against lead 552a, as shown in FIG. 6 and FIG. 7. Namely, FIG. 6 shows portable battery pack 500 with side 512 of pouch 510 up, whereas FIG. 7 shows portable battery pack 500 with side 514 of pouch 510 up.

Pouch 510 of portable battery pack 500 can be MOLLE-compatible. "MOLLE" means Modular Lightweight Load-carrying Equipment, which is the current generation of load-bearing equipment and backpacks utilized by a number of NATO armed forces. Namely, pouch 510 incorporates a pouch attachment ladder system (PALS), which is a grid of webbing used to attach smaller equipment onto load-bearing platforms, such as vests and backpacks. For example, the PALS grid consists of horizontal rows of 1-inch (2.5 cm) webbing, spaced about one inch apart, and reattached to the backing at 1.5-inch (3.8 cm) intervals. Accordingly, a set of straps 522 (e.g., four straps 522) are provided on one edge of pouch 510 as shown. Further, four rows of webbing 524 are provided on side 512 of pouch 510, as shown in FIG. 7. Additionally, four rows of slots or slits 526 are provided on side 514 of pouch 510, as shown in FIG. 7.

Figure 8:
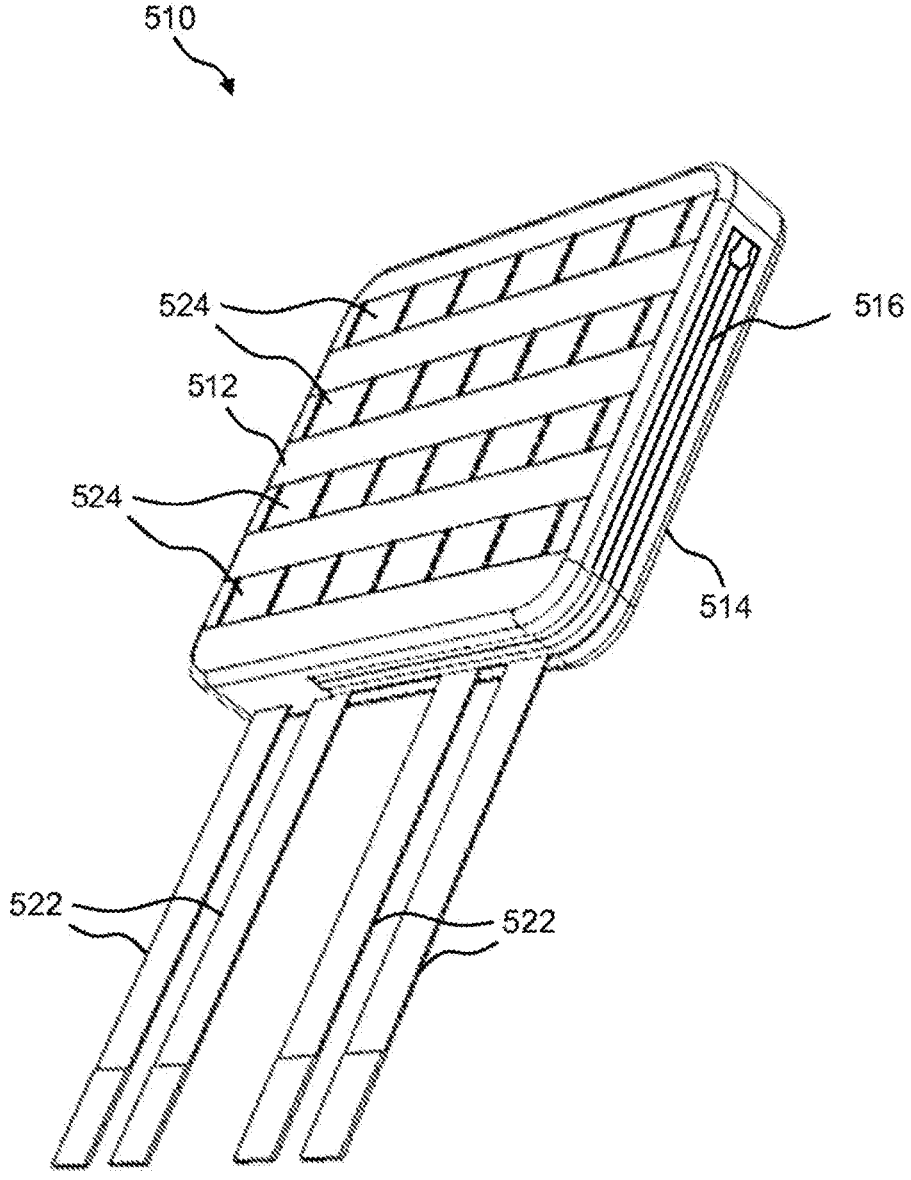
FIG. 8 is a perspective view of an example of a wearable pouch of a portable battery pack.
Figure 9:
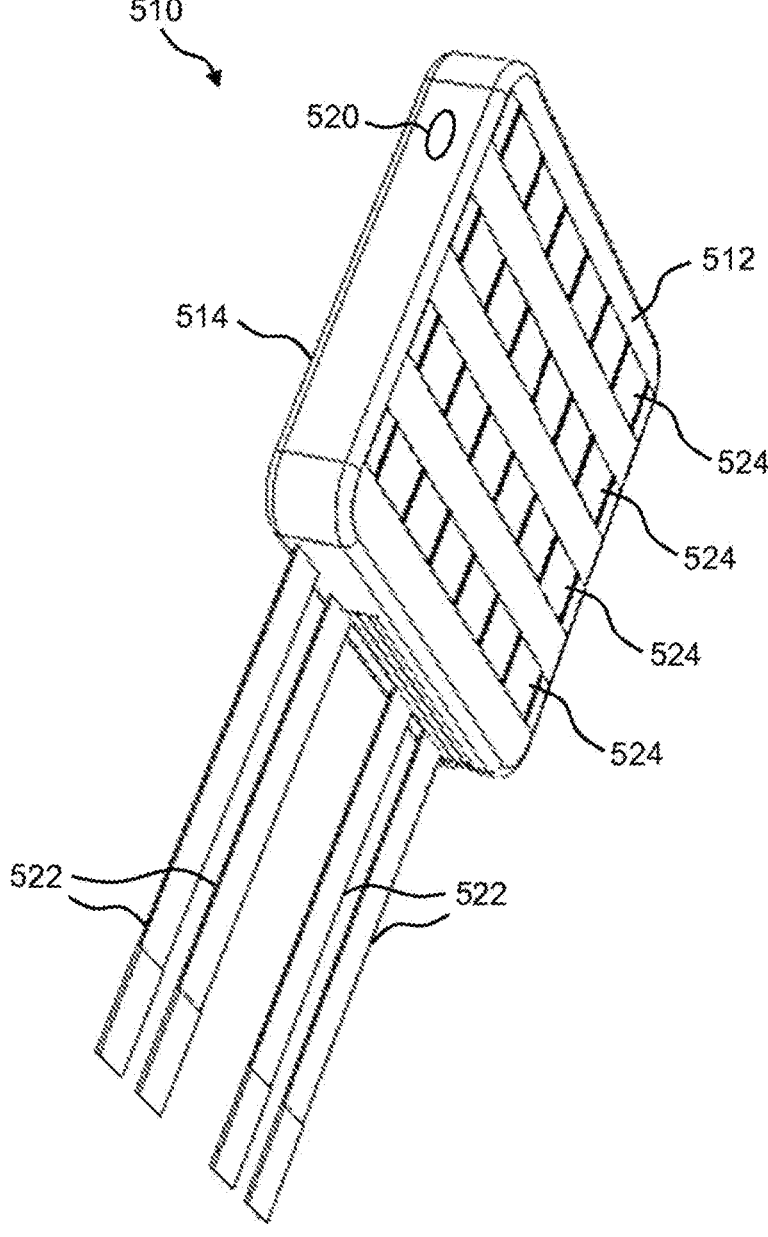
FIG. 9 is another perspective view of an example of a wearable pouch of a portable battery pack.
Figure 10:
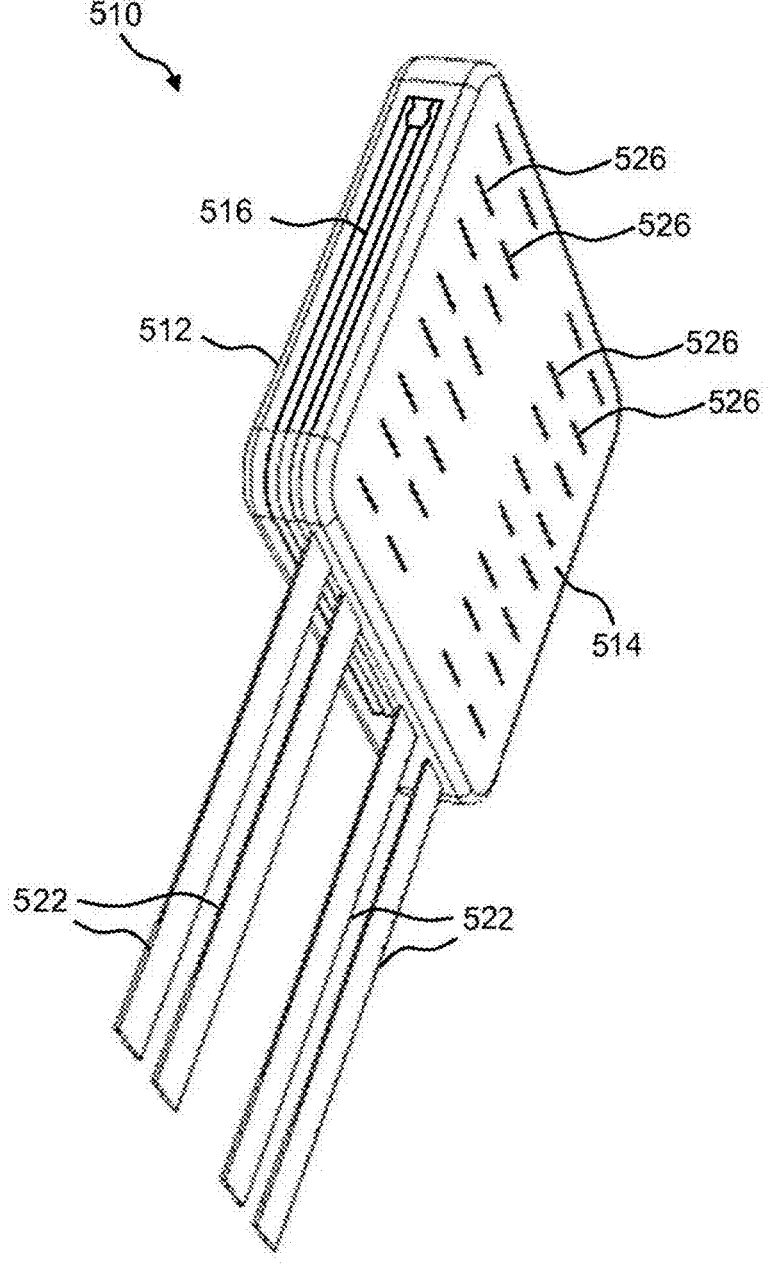
FIG. 10 is yet another perspective view of an example of a wearable pouch of a portable battery pack.

FIGS. 8-10 are perspective views of an example of wearable pouch 510 of the portable battery pack 500. Namely, FIG. 8 shows details of side 512 of pouch 510 and of the edge of pouch 510 that includes opening 516. FIG. 8 shows opening 516 in the zipper closed state. Again, four rows of webbing 524 are provided on side 512 of pouch 510. FIG. 9 also shows details of side 512 of pouch 510, but showing the edge of pouch 510 that includes opening 520. FIG. 10 shows details of side 514 of pouch 510 and shows the edge of pouch 510 that includes opening 516. FIG. 10 shows opening 516 in the zipped closed state. Again, four rows of slots or slits 526 are provided on side 514 of pouch 510.

FIGS. 11A-11E illustrate various other views of wearable pouch 110 of the portable battery pack 100. FIG. 11A shows a view (i.e., "PLAN-A") of side 112 of pouch 110. FIG. 11B shows a side view of pouch 110. FIG. 11C shows a view (i.e., "PLAN-B") of side 114 of pouch 110. FIG. 11D shows an end view (i.e., "END-A") of the non-strap end of pouch 110. FIG. 11E shows an end view (i.e., "END-B") of the strap 112-end of pouch 110.

Figure 12A:
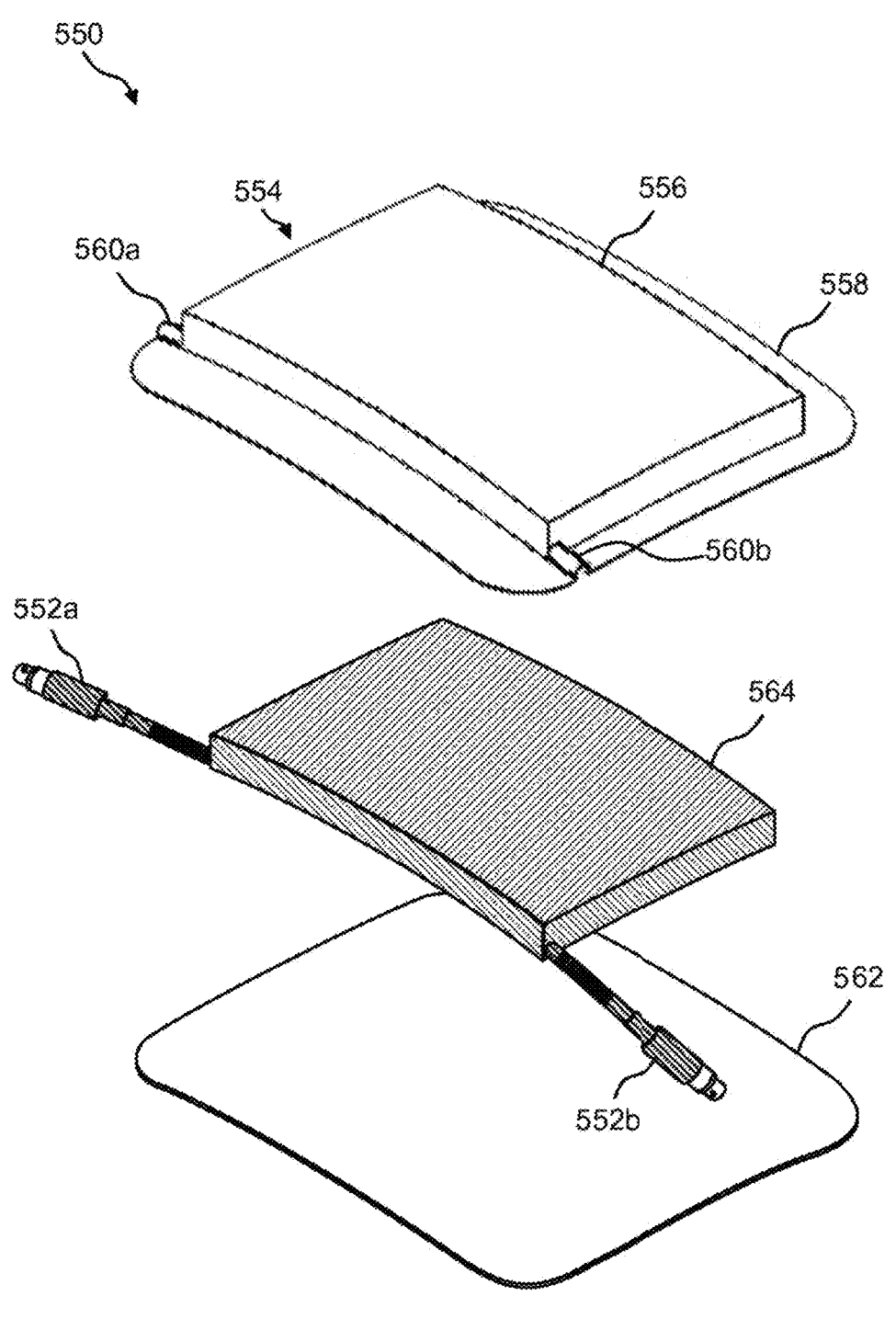
FIG. 12A illustrates an exploded view of an example of a battery of a portable battery pack.

FIG. 12A is an exploded view of an example of battery 550 of the portable battery pack 500. Battery 550 includes a battery element 564 that is housed between a battery cover 554 and a back plate 562. Battery element 564 supplies leads 552a, 552b. In one example, the output of battery element 564 can be from about 5 volts DC to about 90 volts DC at from about 0.25 amps to about 10 amps.

Figure 12B:
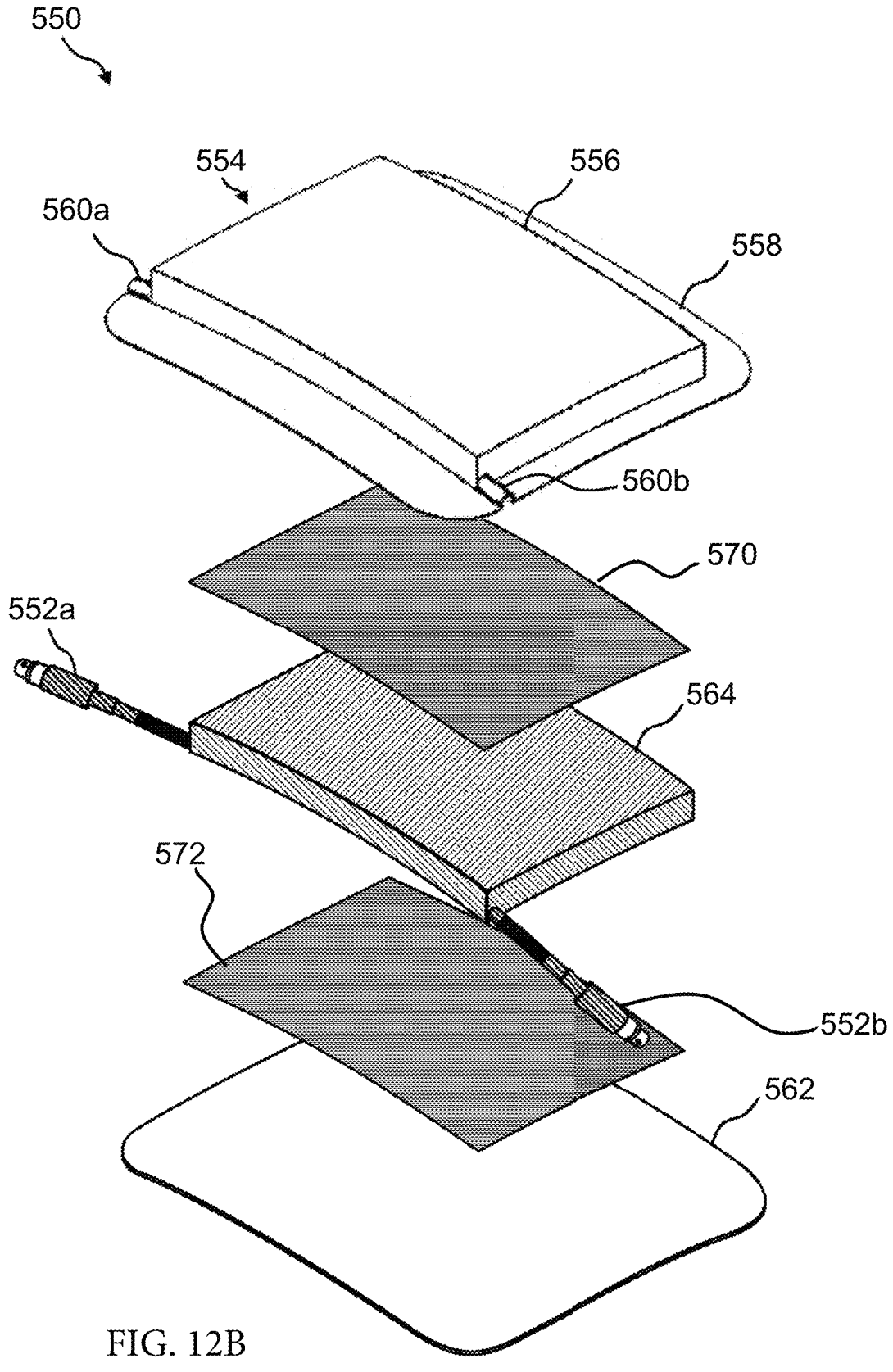
FIG. 12B illustrates an exploded view of an example of a battery of a portable battery pack into which the heat dissipating material is installed.

FIG. 12B illustrates an exploded view of an example of a battery 550 of the portable battery pack 500 into which the heat dissipating material is installed. Battery 550 includes a battery element 564 that is housed between a battery cover 554 and a back plate 562. A first heat-dissipating layer 570 is between the battery cover 554 and the battery element 564. The first heat-dissipating layer 570 protects the battery from external heat sources (e.g., a hot vehicle). A second heat-dissipating layer 572 is between the battery element 564 and the back plate 562. The second heat-dissipating layer 572 protects the user from heat given off by the battery element 564.

Battery cover 554 comprises a substantially rectangular compartment 556 that is sized to receive battery element 564. A top hat style rim 558 is provided around the perimeter of compartment 556. Additionally, two channels 560 (e.g., channels 560a, 560b) are formed in battery cover 554 (one on each side) to accommodate the wires of leads 552a, 552b passing therethrough.

The leads 552 are preferably flexible and omnidirectional. Each lead 552 includes a connector portion and a wiring portion. The connector portion can be any type or style of connector needed to mate to the equipment to be used with battery 550 of portable battery pack 500. The wiring portion is electrically connected to the battery element 564.

The wiring portion is fitted into a channel 560 formed in battery cover 554 such that the connector portion extends away from battery cover 554. A spring is provided around the wiring portion, such that a portion of the spring is inside battery cover 554 and a portion of the spring is outside battery cover 554. In one example, the spring is a steel spring that is from about 0.25 inches to about 1.5 inches long. The wiring portion of lead 552 and the spring are held securely in the channel 560 of the battery cover 554 via a clamping mechanism.

The presence of the spring around the wiring portion of lead 552 allows lead 552 to be flexed in any direction for convenient connection to equipment from any angle. The presence of the spring around the wiring portion of lead 552 also allows lead 552 to be flexed repeatedly without breaking and failing. The design of leads 552 provides benefit over conventional leads and/or connectors of portable battery packs that are rigid, wherein conventional rigid leads allow connection from one angle only and are prone to breakage if bumped.

Battery cover 554 and back plate 562 can be formed of plastic using, for example, a thermoform process or an injection molding. Back plate 562 can be mechanically attached to rim 558 of battery cover 554 via, for example, an ultrasonic spot welding process or an adhesive. Additionally, a water barrier material, such as silicone, may be applied to the mating surfaces of rim 558 and back plate 562. Battery cover 554, back plate 562, and battery element 564 can have a slight curvature or contour for conforming to, for example, the user's vest, backpack, or body armor. In one example, the outward curve of body armor was reverse engineered so that the portable battery pack matches the curvature of the load bearing equipment. Advantageously, this means that the portable battery pack does not jostle as the operator moves, which results in less energy expenditure when the operator moves.

Figure 13:
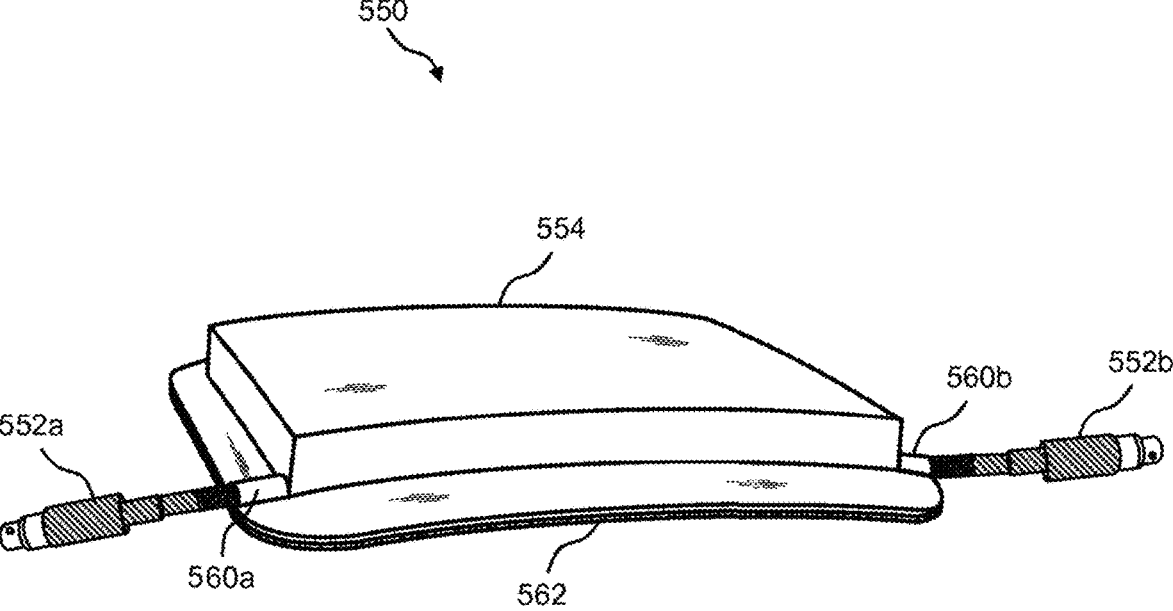
FIG. 13 is a perspective view of a battery of a portable battery pack.
Figure 14:
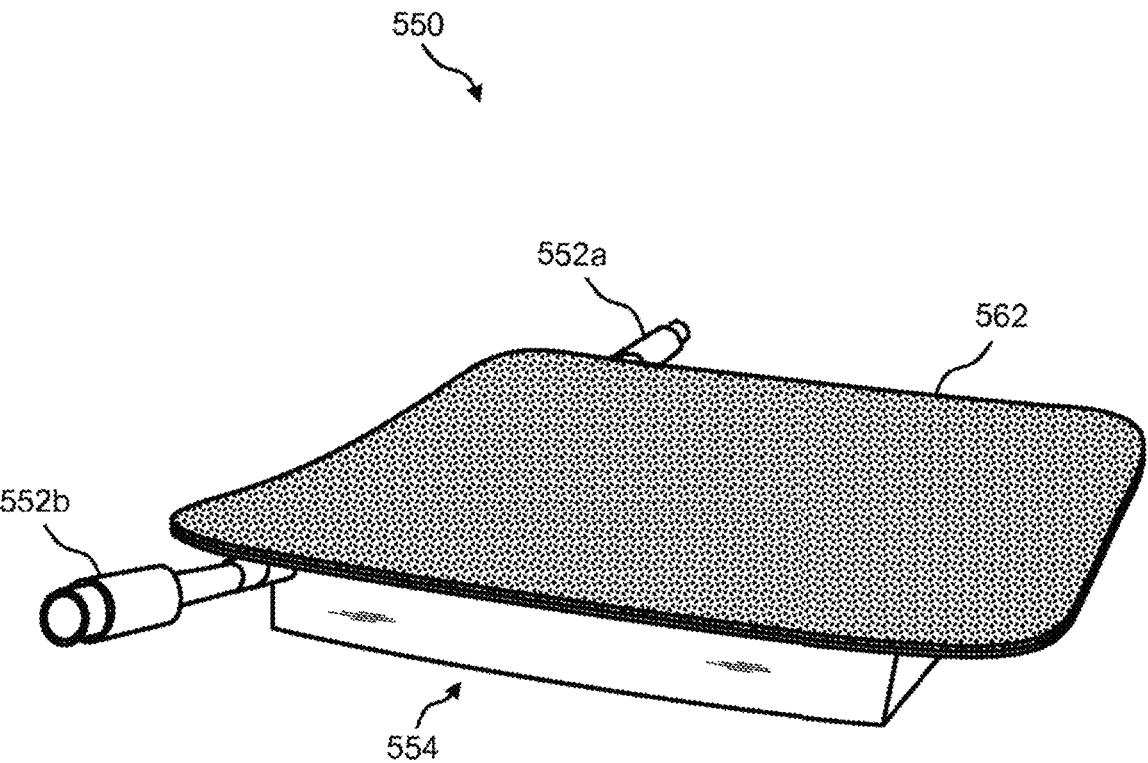
FIG. 14 is another perspective view of a battery of a portable battery pack.

FIG. 13 and FIG. 14 are perspective views of battery 550 of the portable battery pack 500 when fully assembled. Namely, FIG. 13 show a view of the battery cover 554-side of battery 550, while FIG. 14 shows a view of the back plate 562-side of battery 550.

Figure 15:
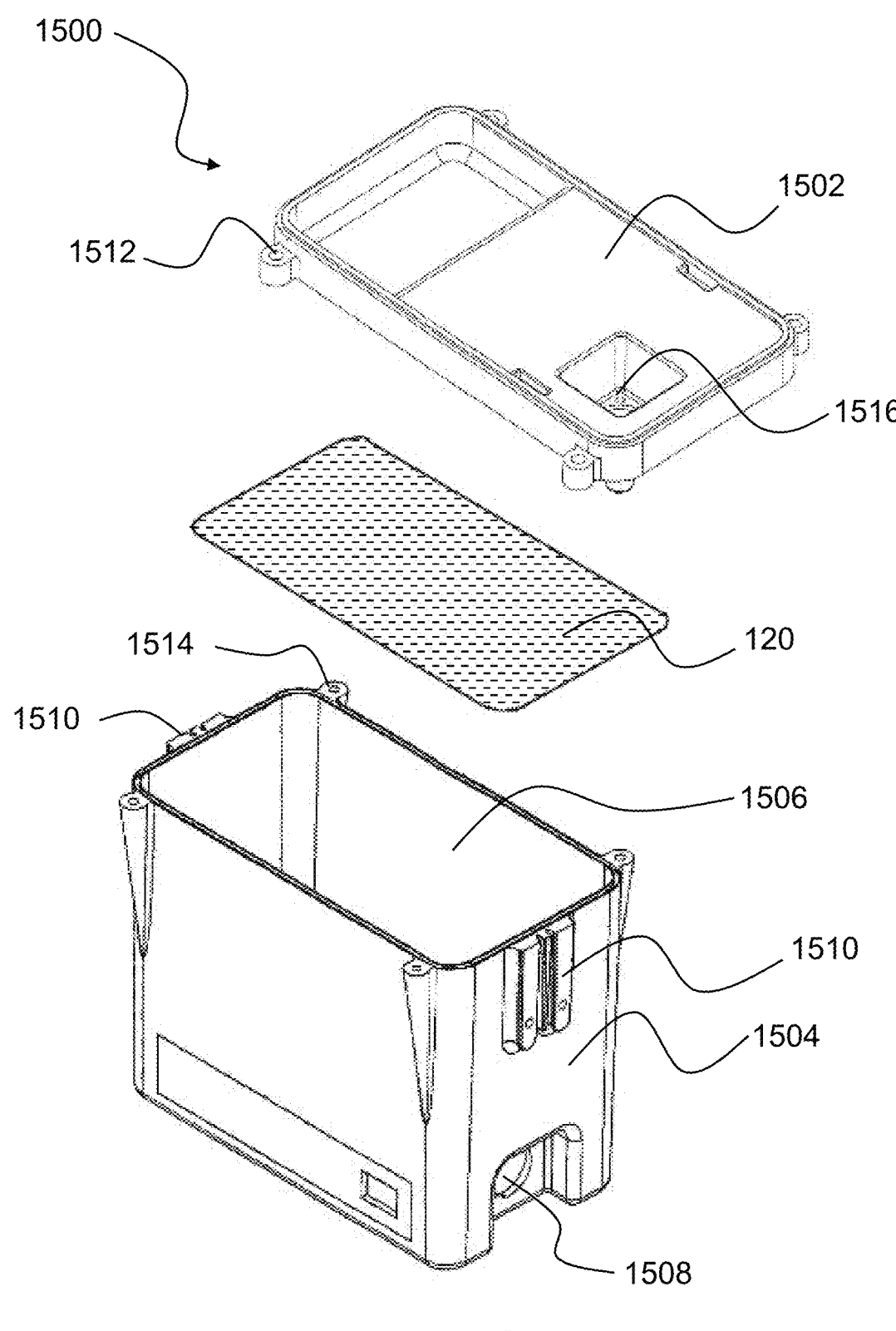
FIG. 15 illustrates an exploded view of an example of a battery into which the heat dissipating material is installed.

FIG. 15 illustrates an exploded view of an example of a housing of a battery 1500 into which the heat-shielding or blocking and/or heat-dissipating material is provided as a coating or layer. The battery 1500 is an example of equipment that may be used by military personnel. The battery 1500 is but one example of using the heat-shielding or blocking, heat-dissipating layer 120 for dissipating heat from an article.

The battery 1500 includes a lid 1502 and a base 1504. The base 1504 has a mounting plaque 1510 for mounting a latch on the base. The base 1504 has a recessed hole 1508 for a connector on both sides of the base 1504. The lid 1502 includes holes 1512 to attach the lid to the base 1504. The base 1504 includes holes 1514 to attach the lid to the base of the housing. Screws (not shown) are placed through holes 1512 and 1514 to attach the lid to the base. The lid 1502 includes a hole 1516 for mounting a connector.

In one embodiment, the battery housing or base 1504 with sides depending upwards therefrom is a unitary and integrally formed piece of plastic formed via injection molding. Advantageously, when the heat-shielding or blocking and/or heat-dissipating material is utilized in conjunction with the base, the base can be manufactured from much thinner plastic than in prior art battery housings because the heat-shielding or blocking and/or heat-dissipating material effectively blocks, shields from, and dissipates heat. In contrast, prior art plastic battery housings require thicker plastic to provide heat blocking, shielding, and dissipation. When used in conjunction with the heat-shielding or blocking and/or heat-dissipating material, the thin plastic material requirement of the present invention provides for cost and/or weight savings over the prior art. In fact, some embodiments of the housing of the present invention use materials and types of materials which traditionally have been disfavored because of the heat generated from battery cells. Such materials include by way of example not limitation, aluminum, titanium, nickel, magnesium, microlattice metals, composite metal foams, and combinations thereof. Notably, many of these materials were previously disfavored for the base because of the heat transfer and dissipation from the battery cells. Materials which provide other advantages such as bullet resistance, such as composite metal foams, are also used for the base in one embodiment of the present invention.

The battery housing or base 1504 for removably holding at least one battery cell is coated with a paint 1506 for reducing electromagnetic interference. In a preferred embodiment, the paint 1506 includes copper. Although the base 1504 of the battery 1500 is coated with the paint 1506, which functionally protects the bottom and sides of the battery from external heat, the top of the battery is exposed to external heat when attached to heat generating equipment (e.g., radio). Since external heat can damage the battery and/or cause it to overheat, the heat-shielding or blocking and/or heat-dissipating material layer or coating is functionally constructed and configured within the interior of the housing or base to protect the removable battery cells disposed therein. In this particular example, the radio in constant use generates a significant heat profile and the heat-shielding material is operable to block that external heat emanating from the radio. The material is further functional to dissipate heat generated by the at least one battery during operation of the radio, which draws power from the at least one battery, and reduces the heat profile of the at least one battery cell disposed within the housing or base. Reducing the exposure of the battery cells to heat results in longer and more reliable battery performance.

In another example of embodiments of the present invention, the heat-shielding or blocking and/or heat-dissipating material completely covers the interior of a housing having a plurality of battery cells removably disposed therein. Other examples include a heat-shielding or blocking and/or heat-dissipating material layer having anti-static, anti-radio frequency (RF), anti-electromagnetic interference (EMI), anti-tarnish, and/or anti-corrosion materials and properties that effectively protect battery-operated devices and/or the batteries that power them from damage or diminished operation.

The battery housing or base 1504 includes a plurality of sealed battery cells or individually contained battery cells, i.e. batteries with their own casings, removably disposed therein. In a preferred embodiment, the battery cells are electrochemical battery cells, and more preferably, include lithium ion rechargeable batteries. In one embodiment, the battery cells are lithium iron phosphate (LFP). In another embodiment, the battery cells are all-solid-state cells (e.g., using glass electrolytes and alkaline metal anodes), such as those disclosed in U.S. Publication Nos. 20180013170, 20180102569, 20180097257, 20180287150, 20180305216, 20180287222, 20180127280, 20160368777, and 20160365602, each of which is incorporated herein by reference in its entirety. In one embodiment, the battery cells are 18350, 14430, 14500, 18500, 16650, 18650, 21700, or 26650 cylindrical cells. The plurality of battery cells may be constructed and configured in parallel, series, or a combination. Preferably, the plurality of battery cells is removably disposed within the base or battery housing or container. For example, the plurality of battery cells can be replaced if they no longer hold a sufficient charge.

In an alternative embodiment, one or more of the plurality of battery cells is sealed within the base. In another embodiment, the lid 1502 is permanently secured to the base 1504.

Figure 16:
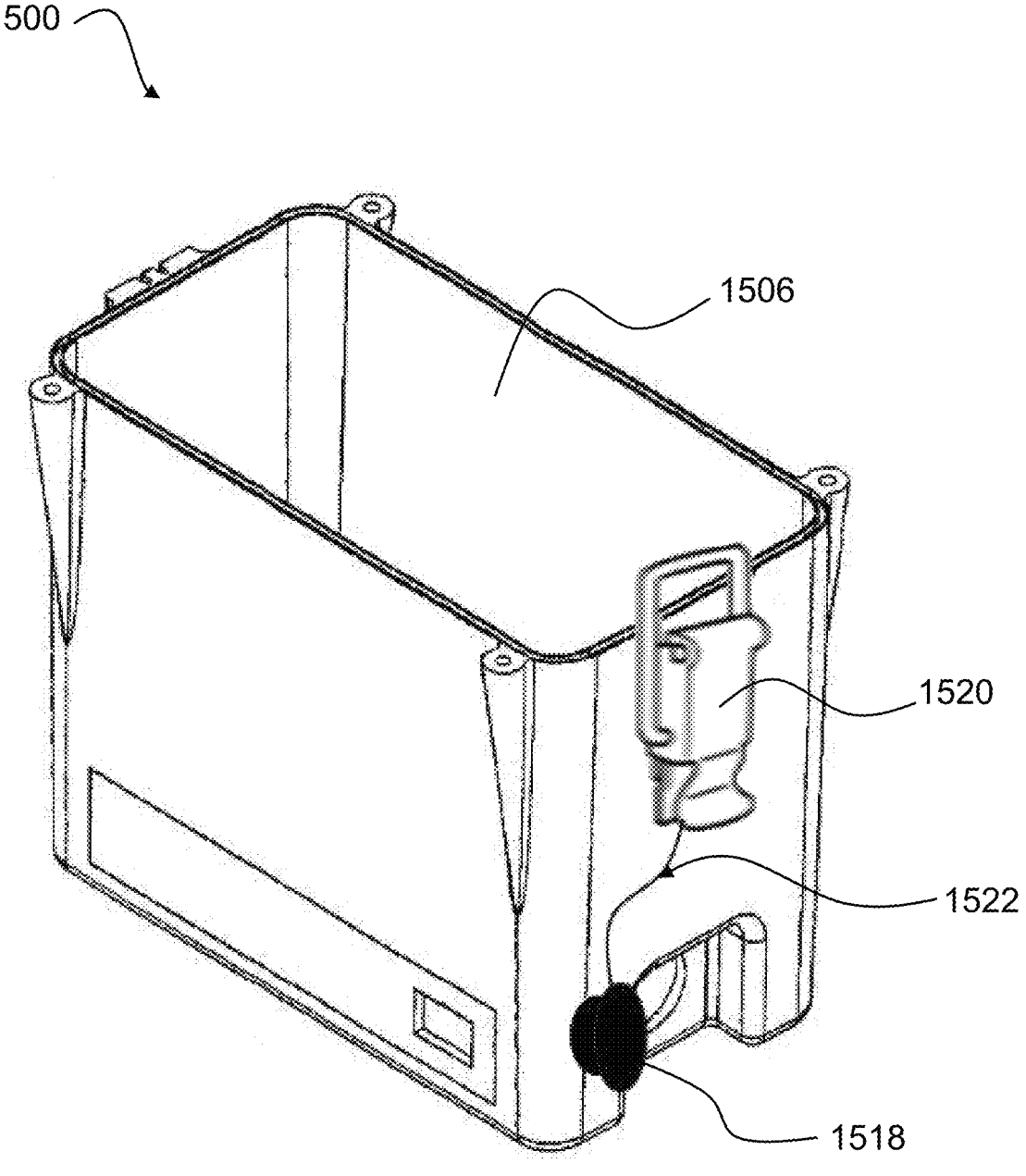
FIG. 16 illustrates a view of an example of a battery base.

FIG. 16 illustrates a view of an example of a battery base 1504. The base 1504 is shown with a latch 1520. The latch 1520 is operable to attach the battery 1500 to a military radio (e.g., AN/PRC-117G) with a corresponding catch. A dust cap 1518 is attached to the battery base 1504 via a lanyard 1522 attached to the mounting plaque of the latch. The length of the lanyard 1522 is such that no part of the dust cap 1518 is capable of moving underneath the battery 1500. Batteries often have the dust cap attached to the housing via a dress nut, which allows the dust cap to move underneath the battery. When the dust cap is underneath the battery, the battery (and any equipment attached to the battery) may become unstable and tip over. If the dust cap is underneath the battery, it may lead to the dust cap being torn from the housing. The battery connector would no longer be protected from dust and other environmental contaminants, causing battery failure in the field.

Figure 17:
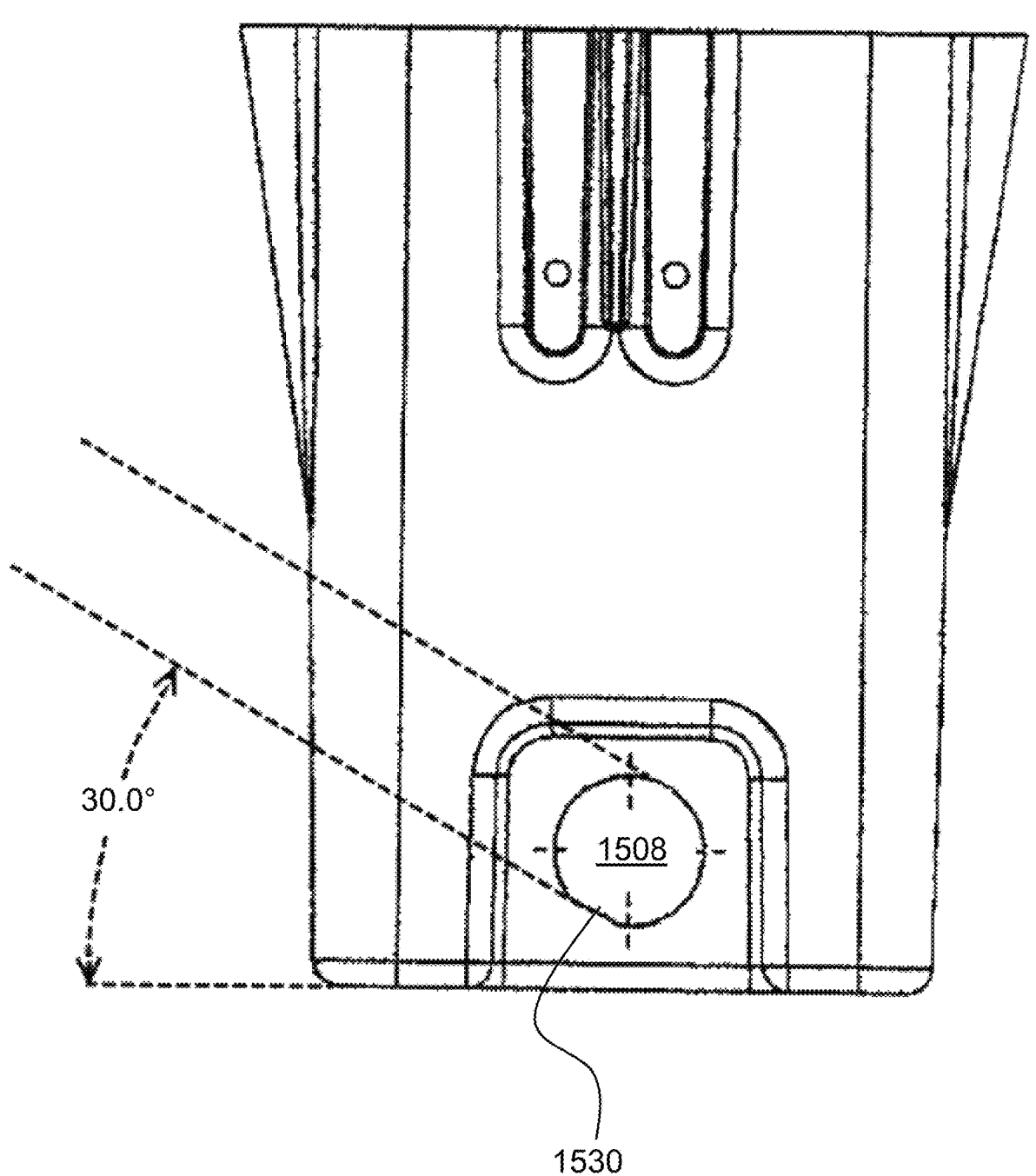
FIG. 17 illustrates another view of an example of a battery base.

FIG. 17 illustrates another view of an example of a battery base 1504. In a preferred embodiment, the recessed hole 1508 includes a flat side 1530 for installing a connector with a keyway. A right-angle cable is used to connect the battery to external power consuming devices and/or external power sources. The keyway ensures that the right-angle cable does not interfere with latches used to attach the battery to the radio. The keyway in FIG. 17 forces the cable to a 30.0° angle. In another embodiment, the keyway forces the cable at an angle between 5° and 15° away from the latch. Other angles are compatible with the present invention.

FIGS. 18A-D illustrate various other views of the lid.

FIGS. 19A-F illustrate various other views of the base.

Figure 20:
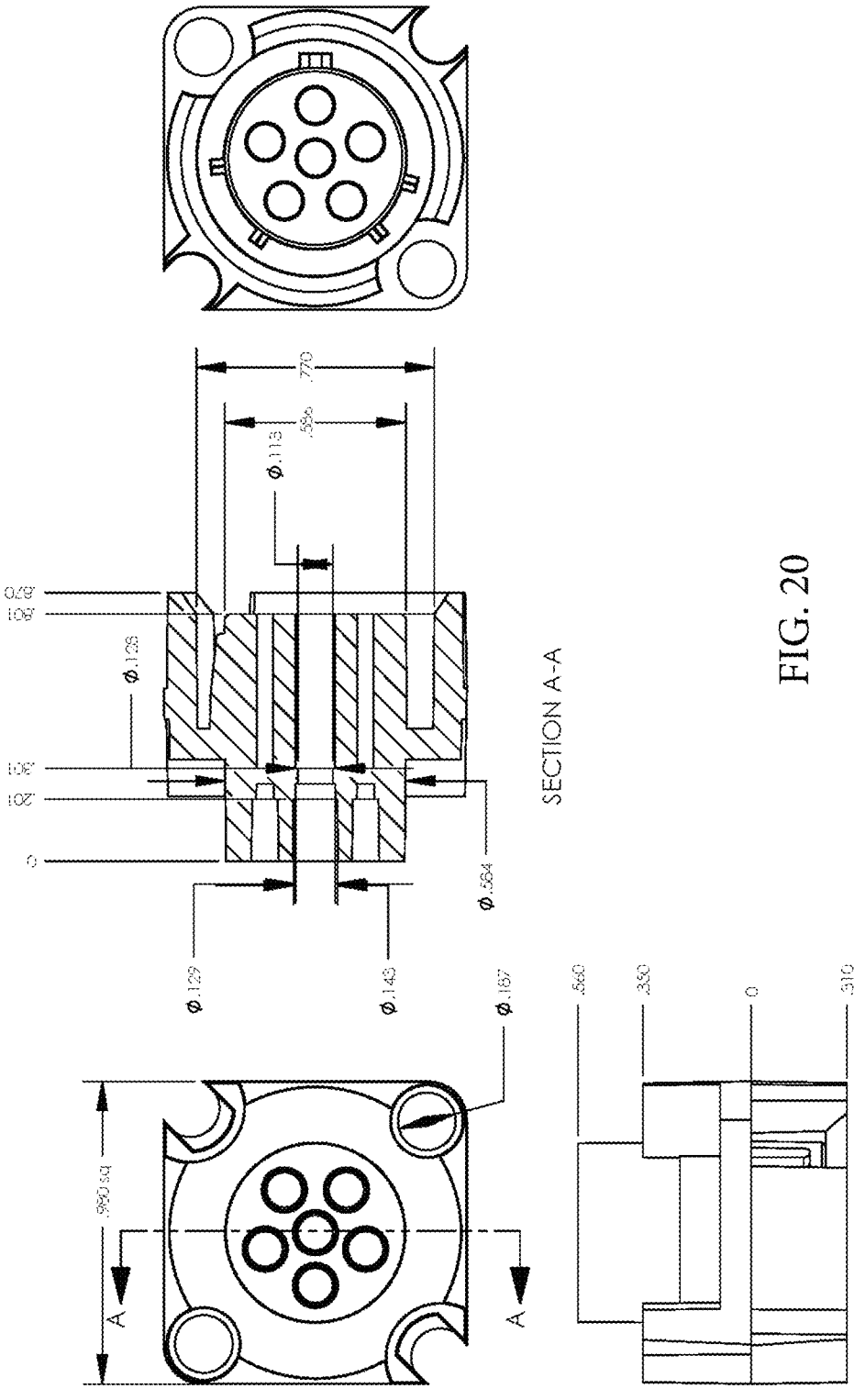
FIG. 20 illustrates a view of a BA-5590 female connector.

FIG. 20 illustrates a view of a BA-5590 female connector. In a preferred embodiment, the BA-5590 female connector is installed in the hole 1516 of the lid. The base of the connector in FIG. 20 is 0.25 inches shorter than other similar female connectors, which results in less wasted space inside the battery housing. The shorter connector allows the base to be 0.25 inches shorter, which results in cost, weight, and volume savings over the prior art.

Figure 21:
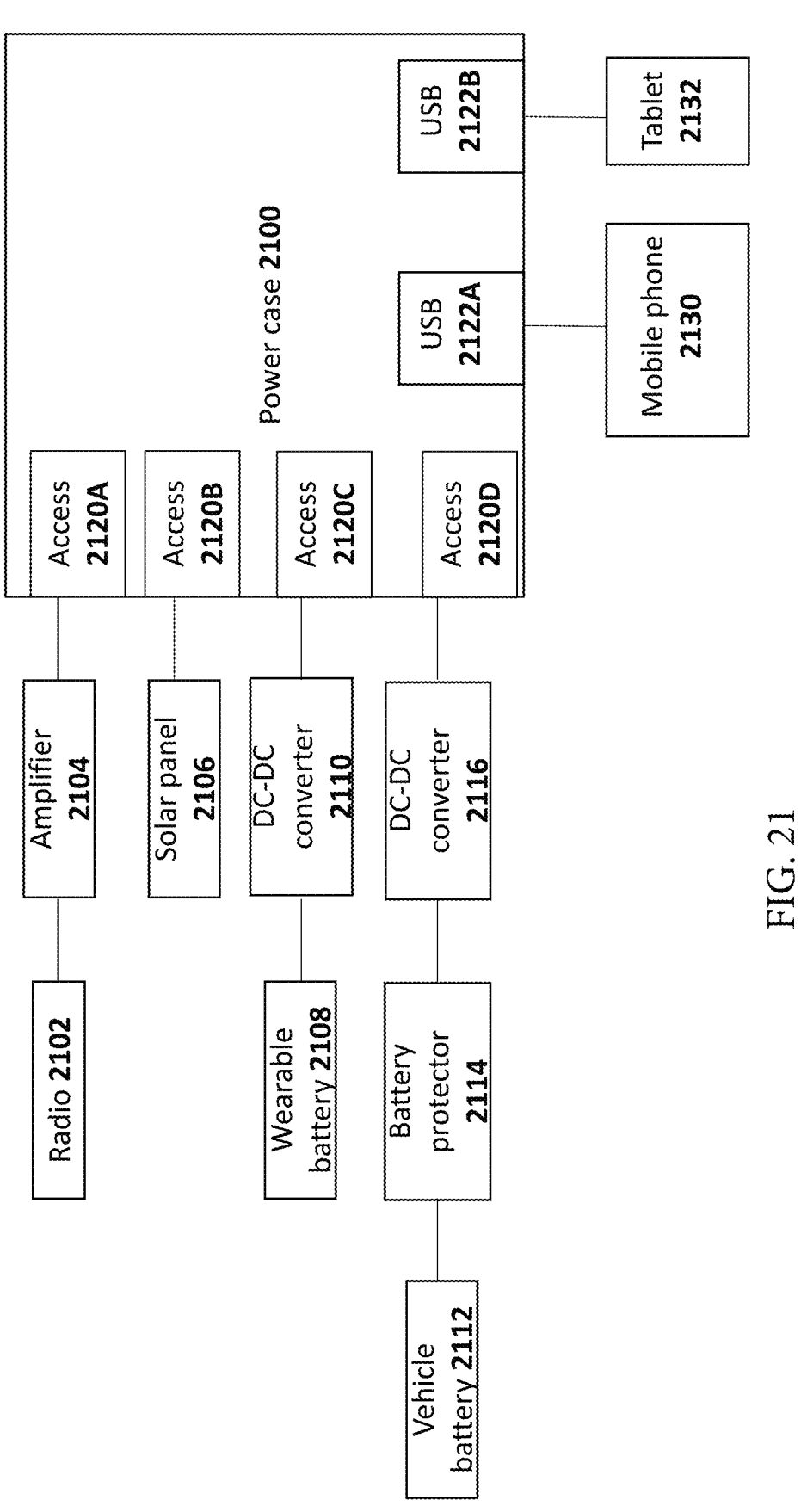
FIG. 21 illustrates a block diagram of a portable power case into which the heat dissipating material is installed.

FIG. 21 illustrates a block diagram of one embodiment of a portable power case into which the heat dissipating material is installed. The portable power case 2100 is an example of equipment that may be used by military personnel. The portable power case 2100 is but one example of using the heat-shielding or blocking and/or heat-dissipating layer 120 for dissipating heat from and/or reducing the thermal and EMI effects of an article.

The portable power case has at least two access ports, at least two leads, or at least one access port and at least one lead accessibly positioned on the exterior surface of the hard case. The portable power case 2100 in FIG. 21 has four access ports 2120A-2120D and two USB ports 2122A-2122B. The portable power case 2100 is operable to connect to an amplifier 2104 through an access port (e.g., 2120A). The amplifier 2104 connects to a radio 2102. The portable power case 2100 is operable to be charged using a solar panel 2106 when connected to an access port (e.g., 2120B). The portable power case 2100 is operable to charge a wearable battery 2108. The portable power case 2100 and the wearable battery 2108 are connected through a DC-DC converter cable 2110 that is in contact with an access port (e.g., 2120C). The portable power case 2100 is operable to be charged using a vehicle battery 2112. The vehicle battery 2112 is operable to charge the portable power case 2100 for a brief period after the ignition of the vehicle is turned off. The system includes a battery protector 2114 connected to an access port (e.g., 2120D) to prevent the vehicle battery from being drained. The battery protector 2114 is connected to the access port 2120D through a DC-DC converter cable 2116. The USB ports 2122A-2122B are operable to charge electronic devices, including, but not limited to, a mobile phone 2130 and/or a tablet 2132.

In a preferred embodiment, the amplifier is a 50 W wideband vehicular amplifier adapter (e.g., RF-7800UL-V150 by Harris Corporation) or a power amplifier for the Falcon III VHF handheld radio (e.g., RF-7800V-V50x by Harris Corporation). In a preferred embodiment, the radio is a PRC-117G. In an alternative embodiment, the radio is a Link 16 radio (e.g., BATS-D AN/PRC-161 Handheld Link 16 Radio). Alternative radios and/or amplifiers are compatible with the present invention.

The portable power case preferably includes at least one battery that is selectively removable from the portable power case. In a preferred embodiment, the at least one battery is in a housing for mating with a military radio (e.g., PRC-117G, PRC-117F). Alternatively, one or more of the at least one battery is a wearable battery. The batteries in the portable power case housing can be split apart amongst members of a team for transport to a location. This is advantageous in that it allows a large quantity of lithium ion batteries to arrive by air that otherwise could not be transported due to regulations. Team members can also use a single battery for a single military radio should rapid egress become necessary. This allows for maintaining communication even though the larger case and amplifier are abandoned. Further, the cables that attach to the outside of the portable power case are compatible with the batteries inside the portable power case, such that a second set of cables is not needed to power equipment if the batteries are removed from the portable power case. Additionally, if the portable power case is damaged in a combat related incident (e.g., damaged by an improvised explosive device or gunfire), the individual batteries could still work and provide power on their own.

In an alternative embodiment, one or more of the at least one battery does not have a housing for the plurality of battery cells, which reduces the weight and dimensions of the portable power case 2100. Soldiers often carry 60-100 lbs. of gear in their rucksack or attached to their vest. Additional weight slows soldiers down and also makes it more likely that they will suffer injuries to their body (e.g., injuries to the back, shoulders, hips, knees, ankles, and feet). Advantageously, removing the housing for one or more of the at least one battery allows the portable power case to be sized to fit in a rucksack. In one embodiment, the one or more of the at least one battery without a housing is sealed within the portable power case to prevent a user from tampering with the plurality of battery cells. In another embodiment, the plurality of battery cells is sealed in flashspun high-density polyethylene (e.g., DUPONT™ TYVEK®), heat shrink tubing, or polyimide film (e.g., DUPONT™ KAPTON®). In yet another embodiment, one or more of the at least one battery is made of at least one pouch cell. Pouch cells provide efficient use of space and lighter weight, but may result in a reduction of run time and overall lifespan.

Figure 22A:
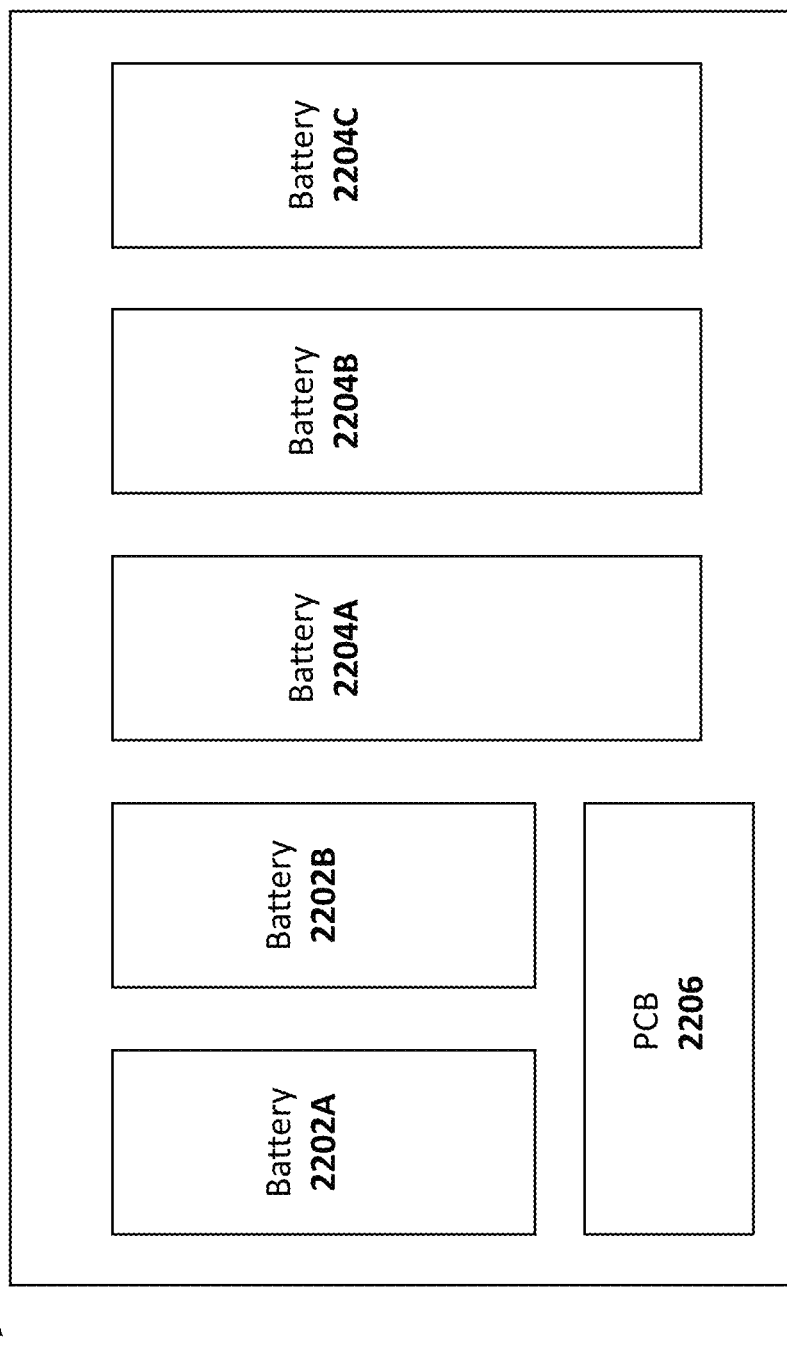
FIG. 22A illustrates a block diagram showing the inside of one embodiment of the portable power case.

FIG. 22A illustrates a block diagram showing the inside of one embodiment of the portable power case 2100. The portable power case 2100 includes two batteries 2202A-2202B and three batteries 2204A-2204C disposed within an open interior space of the hard case. In a preferred embodiment, the batteries 2202A-2202B are 29.4V lithium ion rechargeable batteries in a housing for mating with a PRC-117G radio. In a preferred embodiment, the batteries 2204A-2204C are 29.4V lithium ion rechargeable batteries in a housing for mating with a PRC-117F radio. Alternative voltages, housings, and/or number of batteries are compatible with the present invention. The batteries 2202A-2202B and 2204A-2204C are removably connected to a PCB 2206 by a harness. The harness consists of cables with connectors that allow the batteries 2202A-2202B and 2204A-2204C to easily connect to the PCB 2206 by simply pushing a connector into a corresponding battery. The harness reduces the complexity of electrically connecting the batteries and the PCB. The harness preferably uses slip away connectors that allow for the quick insert and quick release when multiple batteries are put in parallel. In one embodiment, the slip away connectors are based on a FISCHER® SOV 105 A087 connector. In a preferred embodiment, the batteries 2202A-2202B and 2204A-2204C include a heat-dissipating layer between the lid and the plurality of electrochemical battery cells.

In an alternative embodiment, the portable power case 2100 has connectors for the at least one battery hard mounted to the base of the hard case. This allows the at least one battery to mate on top of the hard-mounted connectors and reduces the cables within the case.

The PCB 2206 is disposed within an open interior space of the hard case. The PCB 2206 is preferably mounted in the base of the portable power case 2100. In a preferred embodiment, the PCB 2206 is secured to the base of the portable power case 2100 via posts that float the PCB 2206 above the bottom of the hard case. The PCB 2206 is preferably protected from the at least one battery by foam. In one embodiment, the foam is a polyethylene foam (e.g., ETHAFOAM®).

Figure 22B:
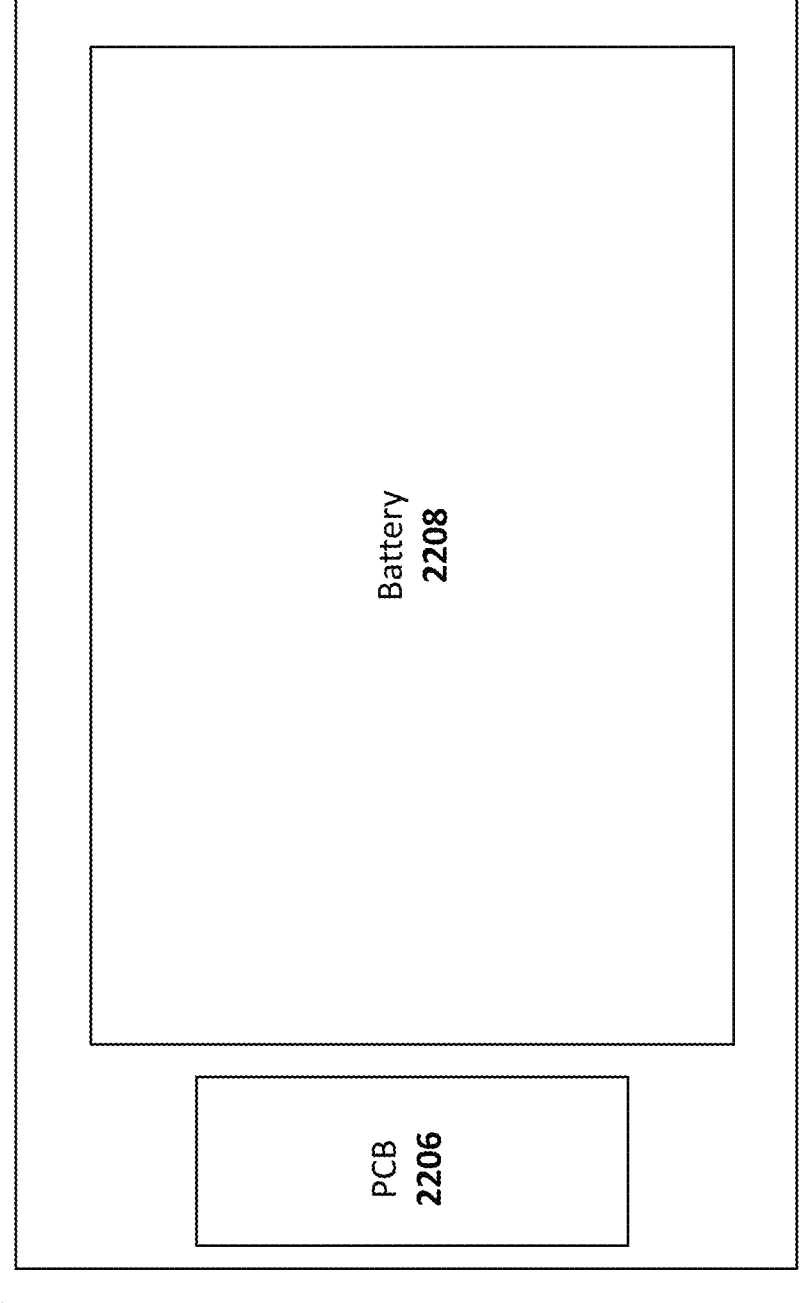
FIG. 22B illustrates a block diagram showing the inside of another embodiment of the portable power case.

FIG. 22B illustrates a block diagram showing the inside of another embodiment of the portable power case 2100. The portable power case 2100 includes a battery 2208 disposed within an open interior space of the hard case. Advantageously, including a single battery within the portable power case 2100 reduces both the dimensions and the weight of the portable power case 2100. In a preferred embodiment, the battery 2208 is a lithium iron phosphate (LFP) battery. The LFP battery is preferably a 1.3 kWh battery. The voltage of the LFP battery is preferably 24V. The current of the LFP battery is preferably 60A. Alternative battery compositions, kilowatt hours, voltages, currents, and/or number of batteries are compatible with the present invention. The battery 2208 is removably connected to a PCB 2206 by a harness. The harness consists of at least one cable with connectors that allow the battery 2208 to easily connect to the PCB 2206 by simply pushing a connector into a corresponding battery connector. The harness reduces the complexity of electrically connecting the batteries and the PCB. The harness preferably uses at least one friction fit connector. Alternatively, the harness uses at least one locking connector. In one embodiment, the connector is an SB®120 by Anderson Power (e.g., Part Nos. 6810G1, P6810G1).

Figure 23A:
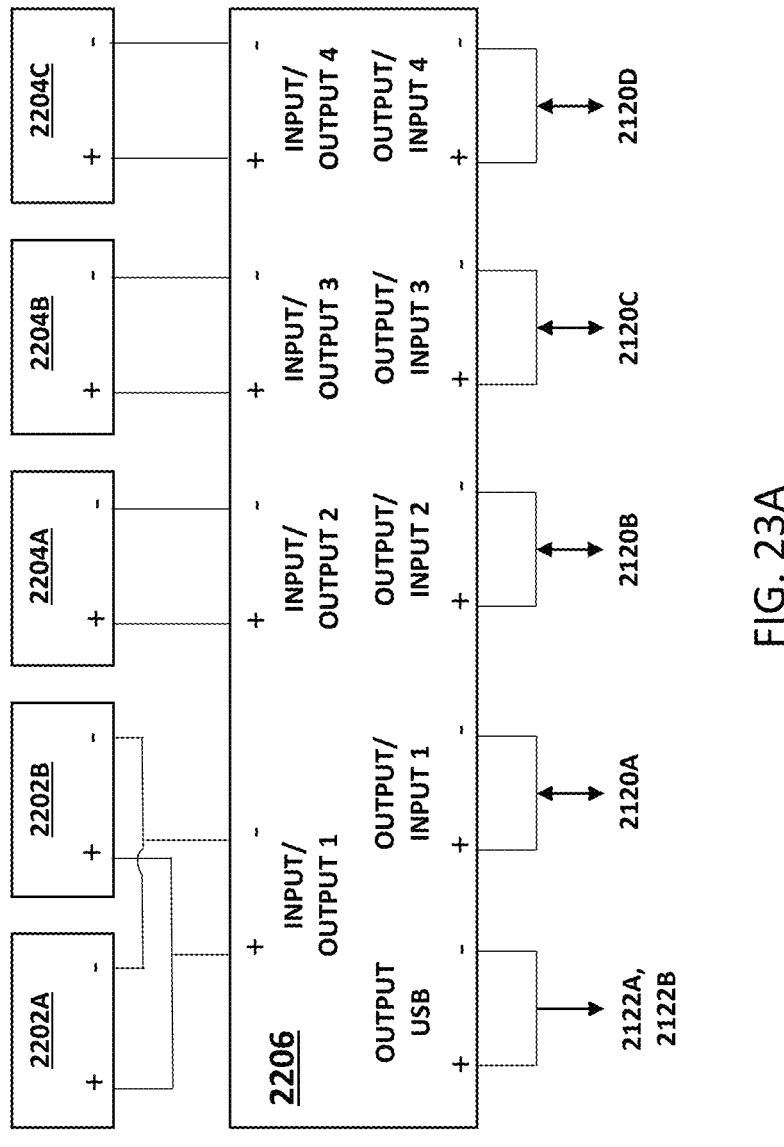
FIG. 23A illustrates a block diagram of the connections to the printed circuit board (PCB).

FIG. 23A illustrates a block diagram of the connections to the PCB in a preferred embodiment. The PCB 2206 has four input/output ports. Batteries 2202A and 2202B are in parallel with each other and connected to the PCB at INPUT/OUTPUT 1. Battery 2204A is connected to the PCB at INPUT/OUTPUT 2. Battery 2204B is connected to the PCB at INPUT/OUTPUT 3. Battery 2204C is connected to the PCB at INPUT/OUTPUT 4. The four input/output ports are in parallel with each other. In a preferred embodiment, a capacitor is installed between each of the batteries in parallel to reduce the risk of shorting the connectors. The PCB 2206 has four output/input ports and an output USB port. OUTPUT/INPUT 1 is connected to access port 2120A, OUTPUT/INPUT 2 is connected to access port 2120B, OUTPUT/INPUT 3 is connected to access port 2120C, OUTPUT/INPUT 4 is connected to access port 2120D, and OUTPUT USB is connected to USB ports 2122A and 2122B. Each access port 2120A-2120D can be used to charge the batteries and supply power to at least one power consuming device. In a preferred embodiment, access ports 2120A-2120D have the same output voltage.

In an alternative embodiment, access ports 2120A-2120D include at least two different output voltages. The PCB includes at least one voltage converter for achieving the at least two different output voltages. In one example, an access port has an output voltage equivalent to the input voltage of the at least one battery (e.g., 29.4V) and a second access port has a lower output voltage (e.g., 16.8V). The PCB includes a voltage converter to convert the input voltage of the at least one battery to the lower output voltage of the second access port.

Figure 23B:
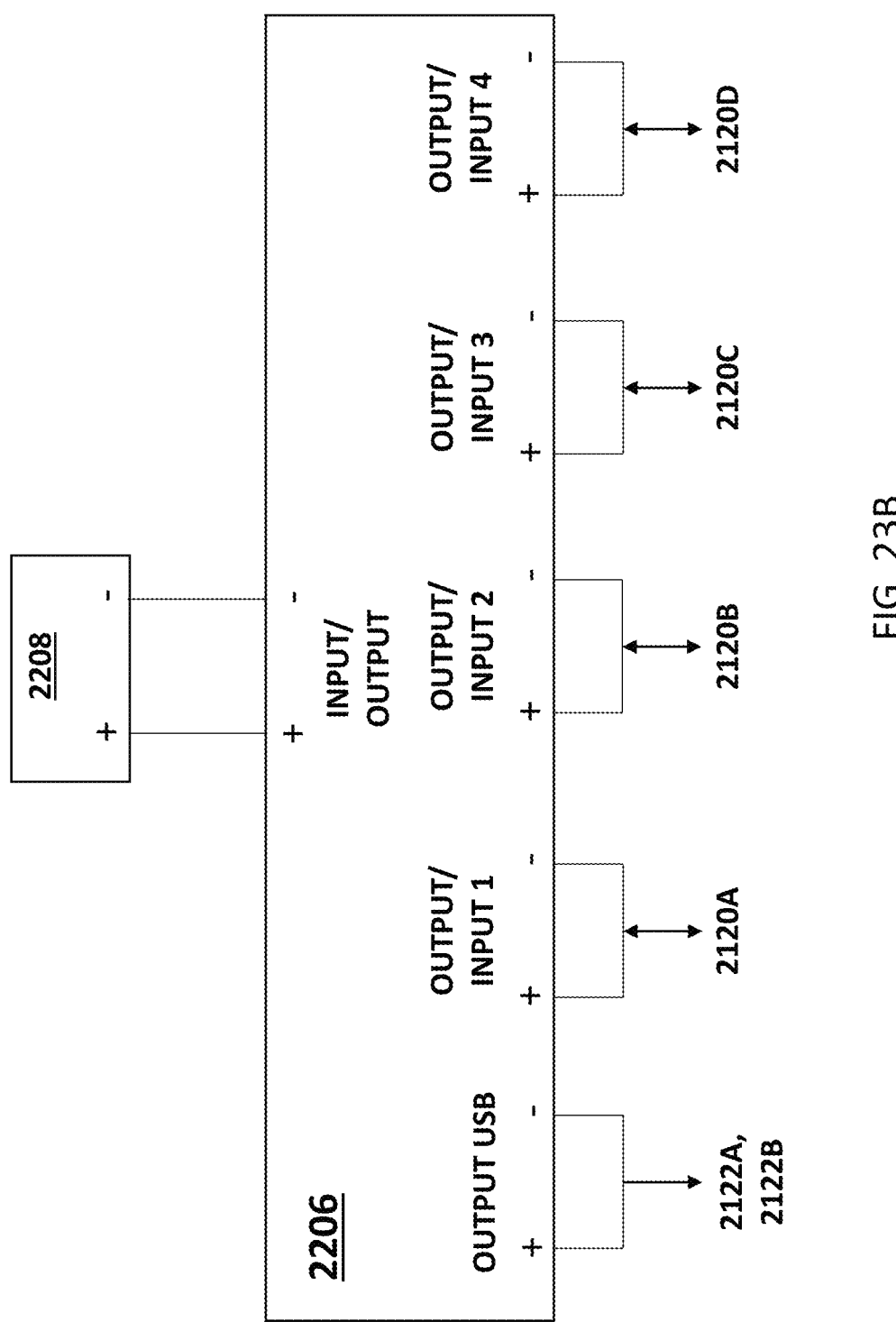
FIG. 23B illustrates another block diagram of the connections to the PCB.

FIG. 23B illustrates a block diagram of the connections to the PCB in another preferred embodiment. Battery 2208 is connected to the PCB 2206 at INPUT/OUTPUT. The PCB 2206 has four output/input ports and an output USB port. OUTPUT/INPUT 1 is connected to access port 2120A, OUTPUT/INPUT 2 is connected to access port 2120B, OUTPUT/INPUT 3 is connected to access port 2120C, OUTPUT/INPUT 4 is connected to access port 2120D, and OUTPUT USB is connected to USB ports 2122A and 2122B. Each access port 2120A-2120D can be used to charge the battery 2208 and supply power to at least one power consuming device. In a preferred embodiment, access ports 2120A-2120D have the same output voltage. Alternatively, access ports 2120A-2120D include at least two output voltages.

Figure 23C:
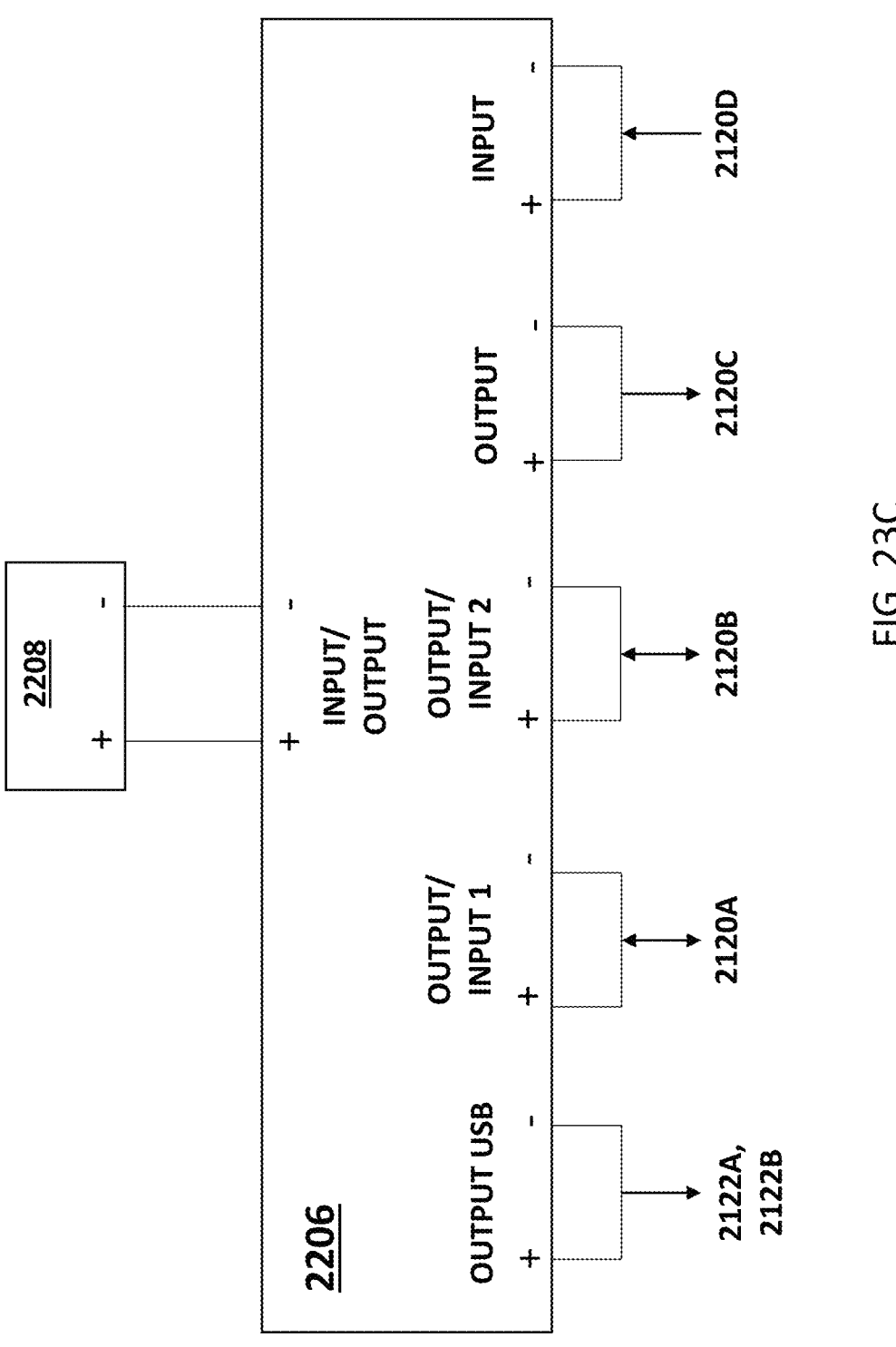
FIG. 23C illustrates yet another block diagram of the connections to the PCB.

In an alternative embodiment, the access ports include at least one output/input port, at least one input port, and/or at least one output port. FIG. 23C illustrates a block diagram of the connections to the PCB in an alternative embodiment. Battery 2208 is connected to the PCB 2206 at INPUT/OUTPUT. The PCB 2206 has two output/input ports, an output port, an input port, and an output USB port. OUTPUT/INPUT 1 is connected to access port 2120A and OUTPUT/INPUT 2 is connected to access port 2120B. Both access ports 2120A and 2120B can be used to charge the battery 2208 and supply power to at least one power consuming device. OUTPUT is connected to access port 2120C. Access port 2120C is operable to supply power to at least one power consuming device. INPUT is connected to access port 2120D. Access port 2120D is operable to charge the battery 2208. OUTPUT USB is connected to USB ports 2122A and 2122B. In a preferred embodiment, access ports 2120A-2120D have the same output and/or input voltage. Alternatively, access ports 2120A-2120D include at least two output and/or input voltages.

In yet another embodiment, the at least one battery is connected to the at least two access ports, the at least two leads, the at least one access port and the at least one lead, and/or the at least one USB port via a battery management system. The battery management system protects the at least one battery from operating outside of a safe operating area by including at least one safety cutoff. The at least one safety cutoff relates to voltage, temperature, state of charge, state of health, and/or current. In another embodiment, the battery management system calculates a charge current limit, a discharge current limit, an energy delivered since last charge, a charge delivered, a charge stored, a total energy delivered since first use, a total operating time since first use, and/or a total number of cycles.

The PCB does not use ferrite beads to reduce noise in one embodiment. In a first trial, ferrite beads were installed and the connectors failed. In a second trial, two ferrite beads were installed in parallel and the connectors failed. The connectors worked after the ferrite beads were removed. The ferrite beads did not have sufficient current capability. The PCB uses capacitors to protect the batteries in another embodiment.

In one embodiment, the PCB includes at least one processor. By way of example, and not limitation, the processor may be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof that can perform calculations, process instructions for execution, and/or other manipulations of information.

One or more of the at least one processor is incorporated into control electronics used to determine the state of charge (SOC) of the portable power case in one embodiment. Examples of state of charge indicators are disclosed in U.S. Publication Nos. 20170269162 and 20150198670, each of which is incorporated herein by reference in its entirety.

Figure 24:
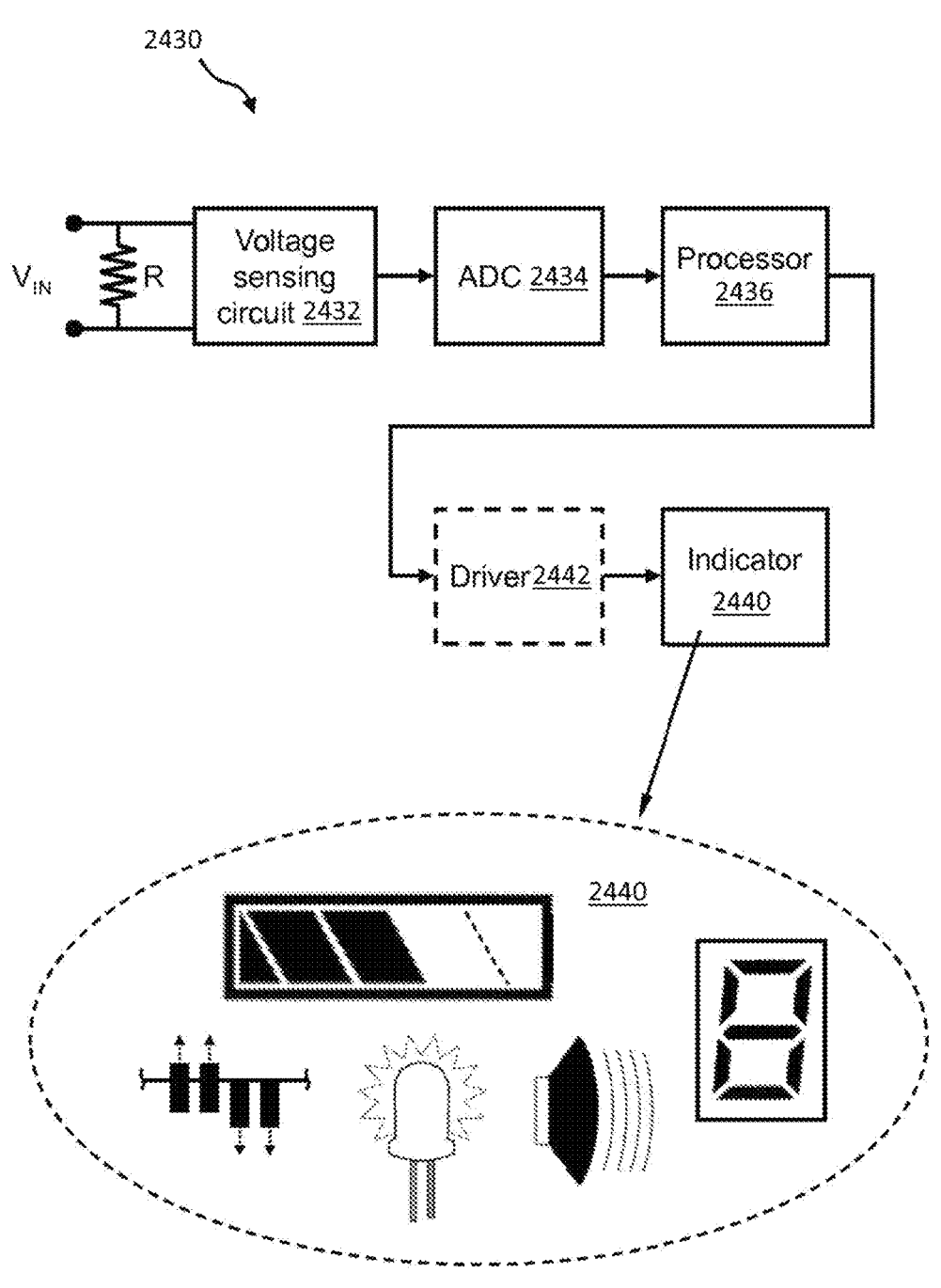
FIG. 24 illustrates a block diagram of one embodiment of the control electronics for a state of charge (SOC) indicator incorporated into the portable power case.

FIG. 24 illustrates a block diagram of one embodiment of the control electronics for a state of charge indicator incorporated into the portable power case. In this example, the control electronics 2430 includes a voltage sensing circuit 2432, an analog-to-digital converter (ADC) 2434, a processor 2436, the indicator 2440, and optionally a driver 2442.

The voltage sensing circuit 2432 can be any standard voltage sensing circuit, such as those found in volt meters. An input voltage VIN is supplied via the power BUS. In one embodiment, the voltage sensing circuit 2432 is designed to sense any direct current (DC) voltage in the range of from about 0 volts DC to about 50 volts DC. In one embodiment, the voltage sensing circuit 2432 includes standard amplification or de-amplification functions for generating an analog voltage that correlates to the amplitude of the input voltage VIN that is present. The ADC 2434 receives the analog voltage from the voltage sensing circuit 2432 and performs a standard analog-to-digital conversion.

The processor 2436 manages the overall operations of the SOC indicator. The processor 2436 is any controller, microcontroller, or microprocessor that is capable of processing program instructions.

The indicator 2440 is any visual, audible, or tactile mechanism for indicating the state of charge of the portable power case. A preferred embodiment of a visual indicator is at least one 5-bar liquid crystal display (LCD), wherein five bars flashing or five bars indicates greatest charge and one bar or one bar flashing indicates least charge. Another example of a visual indicator is at least one seven-segment numeric LCD, wherein the number 5 flashing or the number 5 indicates greatest charge and the number 1 or the number 1 flashing indicates least charge. Alternatively, the at least one LCD displays the voltage of the portable power case as measured by the control electronics.

The at least one LCD is preferably covered with a transparent material. In a preferred embodiment, the cover is formed of a clear plastic (e.g., poly(methyl methacrylate)). This provides an extra layer of protection for the at least one LCD, much like a screen protector provides an extra layer of protection for a smartphone. This increases the durability of the at least one LCD. The portable power case includes a waterproof sealant (e.g., silicone) around the cover.

Alternatively, a visual indicator is at least one LED. One preferred embodiment of a visual indicator is a set of light-emitting diodes (LEDs) (e.g., 5 LEDs), wherein five lit LEDs flashing or five lit LEDs indicates greatest charge and one lit LED or one lit LED flashing indicates least charge. In one embodiment, the LEDs are red, yellow, and/or green. In one example, two of the LEDs are green to indicate a mostly full charge on the portable power case, two of the LEDs are yellow to indicate that charging will soon be required for the portable power case, and one LED is red to indicate that the portable power case is almost drained. In a preferred embodiment, at least three bars, lights, or numbers are used to indicate the state of charge.

In one embodiment, the at least one LED is preferably covered with a transparent material. In a preferred embodiment, the cover is formed of a clear plastic (e.g., poly(methyl methacrylate)). This provides an extra layer of protection for the at least one LED. This increases the durability of the at least one LED. The portable power case includes a waterproof sealant (e.g., silicone) around the cover.

One example of an audible indicator is any sounds via an audio speaker, such as beeping sounds, wherein five beeps indicates greatest charge and one beep indicates least charge. Another example of an audible indicator is vibration sounds via any vibration mechanism (e.g., vibration motor used in mobile phones), wherein five vibration sounds indicates greatest charge and one vibration sound indicates least charge.

One example of a tactile indicator is any vibration mechanism (e.g., vibration motor used in mobile phones), wherein five vibrations indicate greatest charge and one vibration indicate least charge. Another example of a tactile indicator is a set of pins that rise up and down to be felt in Braille-like fashion, wherein five raised pins indicates greatest charge and one raised pin indicates least charge.

In one example, the processor 2436 is able to drive indicator 2440 directly. In one embodiment, the processor 2436 is able to drive directly a 5-bar LCD or a seven-segment numeric LCD. In another example, however, the processor 2436 is not able to drive indicator 2440 directly. In this case, the driver 2442 is provided, wherein the driver 2442 is specific to the type of indicator 2440 used in the control electronics 2430.

Additionally, the processor 2436 includes internal programmable functions for programming the expected range of the input voltage VIN and the correlation of the value the input voltage VIN to what is indicated at the indicator 2440. In other words, the discharge curve of the portable power case can be correlated to what is indicated at indicator 2440. In one embodiment, the processor 2436 is programmed based on a percent discharged or on an absolute value present at the input voltage VIN.

In one embodiment, the PCB includes at least one antenna, which allows the portable power case to send information (e.g., state of charge information) to at least one remote device (e.g., smartphone, tablet, laptop computer, satellite phone) and/or receive information (e.g., software updates, activation of kill switch) from at least one remote device. The at least one antenna provides wireless communication, standards-based or non-standards-based, by way of example and not limitation, radiofrequency, BLUETOOTH®, ZIGBEE®, WI-FI®, Near Field Communication (NFC), a Link 16 network, a mesh network, or similar standards used by a military or commercial entity. In one embodiment, the wireless communications are encrypted. In another embodiment, the antenna provides communications over the Secret Internet Protocol Router Network (SIPRNet).

Figure 25A:
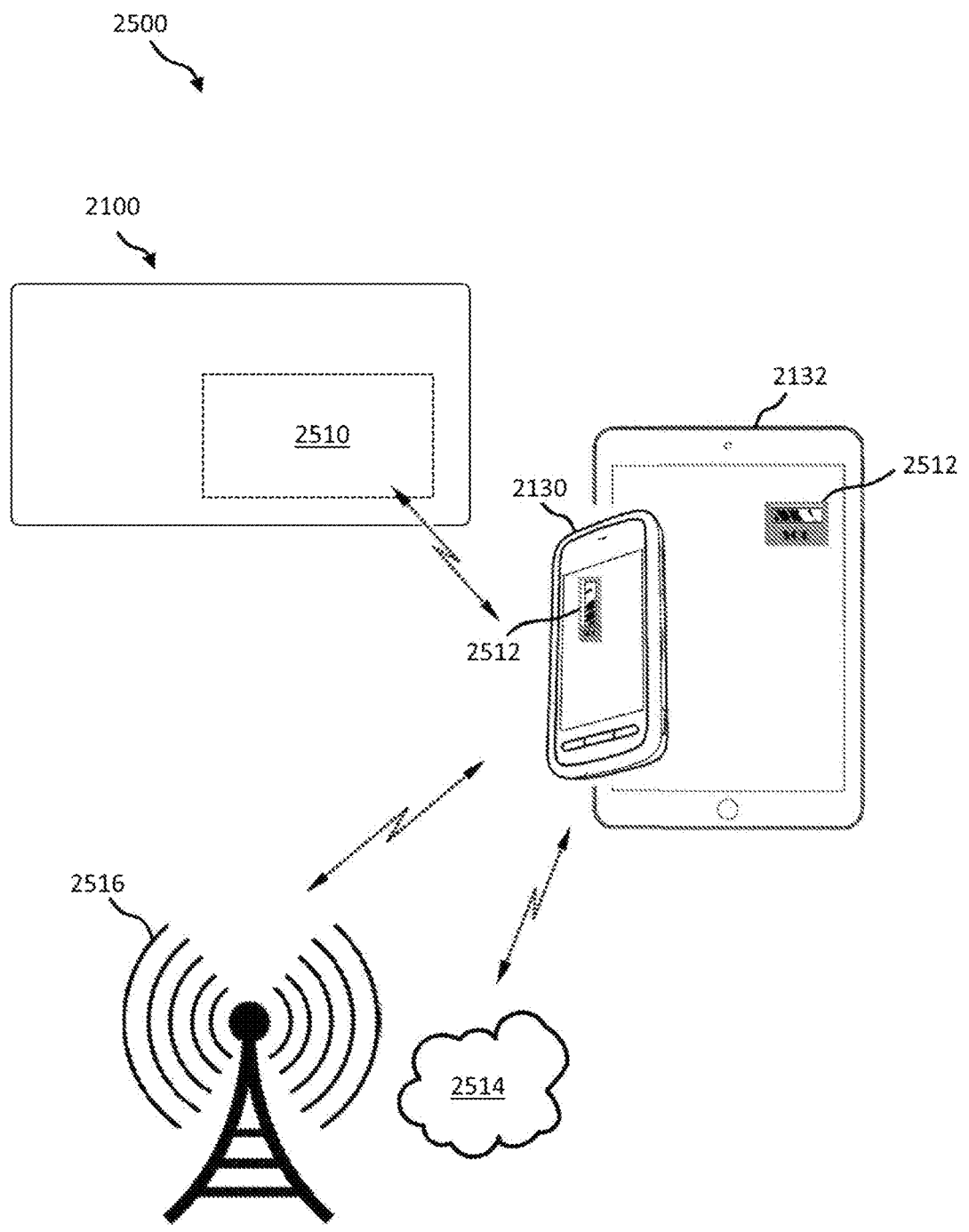
FIG. 25A illustrates a block diagram of an example of an SOC system that includes a mobile application for use with a portable power case.

FIG. 25A illustrates a block diagram of an example of an SOC system 2520 that includes a mobile application for use with a portable power case. The SOC system 2520 includes a portable power case 2100 having a communications interface 2510.

The communications interface 2510 is any wired and/or wireless communication interface for connecting to a network and by which information may be exchanged with other devices connected to the network. Examples of wired communication interfaces include, but are not limited to, USB ports, RS232 connectors, RJ45 connectors, Ethernet, and any combinations thereof. Examples of wireless communication interfaces include, but are not limited to, an Intranet connection, Internet, ISM, BLUETOOTH® technology, WI-FI®, WIMAX®, IEEE 802.11 technology, radio frequency (RF), Near Field Communication (NFC), ZIG-BEE®, Infrared Data Association (IrDA) compatible protocols, Local Area Networks (LAN), Wide Area Networks (WAN), Shared Wireless Access Protocol (SWAP), any combinations thereof, and other types of wireless networking protocols.

The communications interface 2510 is used to communicate, preferably wirelessly, with at least one remote device, such as but not limited to, a mobile phone 2130 or a tablet 2132. The mobile phone 2130 can be any mobile phone that (1) is capable of running mobile applications and (2) is capable of communicating with the portable power case. The mobile phone 2130 can be, for example, an ANDROID™ phone, an APPLE® IPHONE®, or a SAMSUNG® GALAXY® phone. Likewise, the tablet 2132 can be any tablet that (1) is capable of running mobile applications and (2) is capable of communicating with the portable power case. The tablet 2132 can be, for example, the 3G or 4G version of the APPLE® IPAD®.

Further, in SOC system 2500, the mobile phone 2130 and/or the tablet 2132 is in communication with a cellular network 2516 and/or a network 2514. The network 2514 can be any network for providing wired or wireless connection to the Internet, such as a local area network (LAN), a wide area network (WAN), a mesh network, SIPRNet, a Link 16 network, or other military or commercial network.

An SOC mobile application 2512 is installed and running at the mobile phone 2130 and/or the tablet 2132. The SOC mobile application 2512 is implemented according to the type (i.e., the operating system) of mobile phone 2130 and/or tablet 2132 on which it is running. The SOC mobile application 2512 is designed to receive SOC information from the portable power case. The SOC mobile application 2512 indicates graphically, audibly, and/or tactilely, the state of charge to the user (not shown).

Figure 25B:
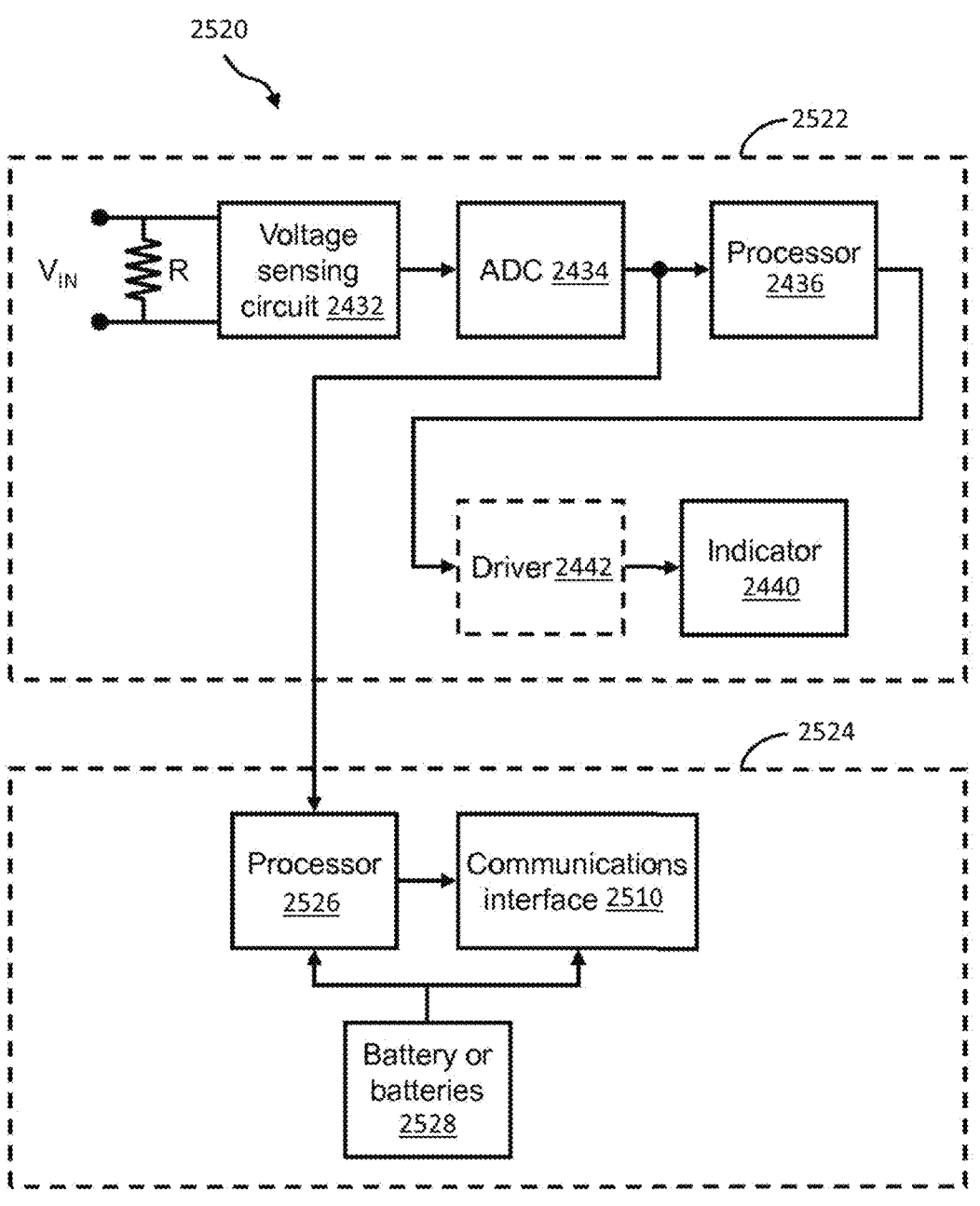
FIG. 25B illustrates a block diagram of an example of control electronics of the portable power case that is capable of communicating with the SOC mobile application.

FIG. 25B illustrates a block diagram of an example of SOC system 2520 of the portable power case that is capable of communicating with the SOC mobile application 2512. In this example, the SOC system 2520 includes an SOC portion 2522 and a communications portion 2524. The SOC portion 2522 is substantially the same as the control electronics 2430 shown in FIG. 24. The communications portion 2524 handles the communication of the SOC information to the SOC mobile application 2512 at, for example, the mobile phone 2130 and/or the tablet 2132.

The communications portion 2524 includes a processor 2526 that is communicatively connected to the communications interface 2510. The digital output of the ADC 2434 of the SOC portion 2522, which is the SOC information, feeds an input to the processor 2526. The processor 2526 can be any controller, microcontroller, or microprocessor that is capable of processing program instructions. One or more batteries 2528 provide power to the processor 2526 and the communications interface 2510. The one or more batteries 2528 can be any standard cylindrical battery, such as quadruple-A, triple-A, or double-A, or a battery from the family of button cell and coin cell batteries. A specific example of a battery 2528 is the CR2032 coin cell 3-volt battery.

In SOC system 2520, the SOC portion 2522 and the communications portion 2524 operate substantially independent of one another. Namely, the communications portion 2524 is powered separately from the SOC portion 2522 so that the communications portion 2524 is not dependent on the presence of the input voltage VIN at the SOC portion 2522 for power. Therefore, in this example, the communications portion 2524 is operable to transmit information to the SOC mobile application 2512 at any time. However, in order to conserve battery life, in one embodiment the processor 2526 is programmed to be in sleep mode when no voltage is detected at the input voltage VIN at the SOC portion 2522 and to wake up when an input voltage VIN is detected. Alternatively, the processor 2526 is programmed to periodically measure the SOC and send SOC information to the SOC mobile application 2512 on the at least one remote device periodically, such as every hour, regardless of the state of input voltage VIN.

Figure 25C:
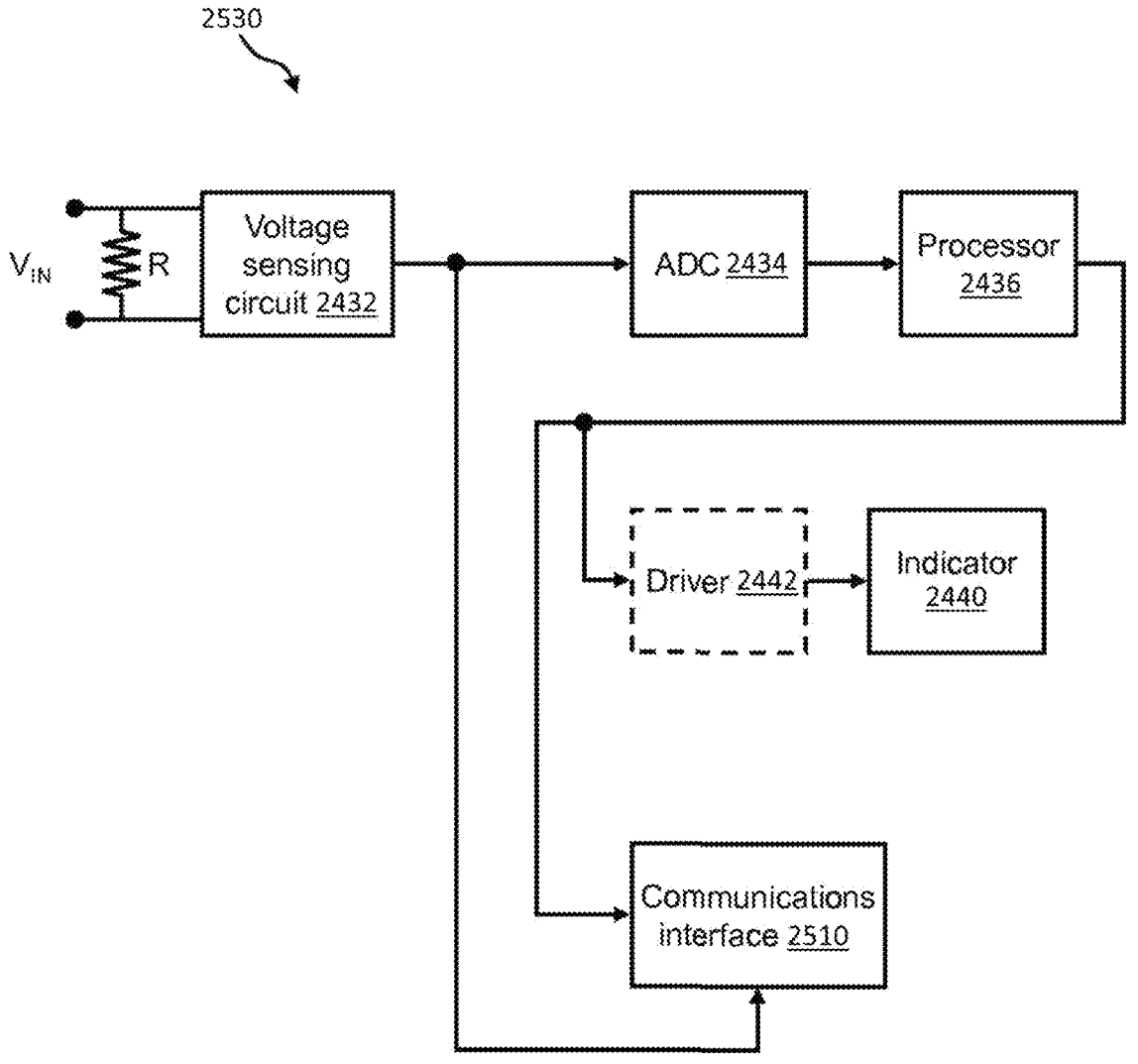
FIG. 25C illustrates a block diagram of another example of control electronics of the portable power case that is capable of communicating with the SOC mobile application.

FIG. 25C illustrates a block diagram of another example of control electronics 2530 of the portable power case that is capable of communicating with the SOC mobile application 2512. In this example, the operation of the communications interface 2510 is dependent on the presence of a voltage at input voltage VIN. This is because, in control electronics 2530, the communications interface 2510 is powered from the output of voltage sensing circuit 2432. Further, the processor 2436 provides the input (i.e., the SOC information) to the communications interface 2510. A drawback of the control electronics 2530 of FIG. 25C as compared with the SOC system 2520 of FIG. 25B, is that it is operable to transmit SOC information to the SOC mobile application 2512 only when the portable power case has a charge.

In one embodiment, the portable power case includes a kill switch to deactivate the portable power case. For example, if a team of soldiers came under attack, one or more of the batteries within the portable power case housing could be removed and the kill switch activated to render the portable power case and any remaining batteries in the portable power case inoperable. A kill switch could also be used to render the portable power case inoperable at a designated expiration date for safety purposes.

In another embodiment, the PCB includes a global positioning system (GPS) chip. The GPS chip allows the portable power case to be located from a remote location. In one example, the GPS chip allows a search and rescue team to locate hikers or campers lost in the woods. The GPS chip also allows for the remote activation of a kill switch from anywhere in the world. For example, if the team of soldiers came under attack and removed one or more of the batteries within the portable power case housing, command could then remotely activate the kill switch to render the portable power case and any remaining batteries in the portable power case inoperable.

In a preferred embodiment, the batteries 2202A-2202B are 29.4V lithium ion rechargeable batteries in a housing for mating with a PRC-117G radio. FIG. 18A illustrates a top perspective view of a battery lid of a rechargeable battery for mating with a PRC-117G radio. FIG. 18B illustrates a cross-section view of the battery lid. FIG. 18C illustrates a side perspective view of the battery lid. FIG. 18D illustrates another cross-section view of the battery lid.

FIG. 19A illustrates a top perspective view of a battery base of a rechargeable battery for mating with a PRC-117G radio. FIG. 19B illustrates a cross-section view of the battery base. FIG. 19C illustrates a detail view of a part of the cross-section view of the battery base shown in FIG. 19B. FIG. 19D illustrates a side perspective view of the battery base. FIG. 19E illustrates another cross-section view of the battery base. FIG. 19F illustrates another side perspective view of the battery base. The batteries 2202A-2202B preferably contain a coating or layer of the heat-shielding or blocking and/or heat-dissipating material. In an alternative embodiment, at least one of the batteries 2202A-2202B does not have a housing, which reduces the weight and dimensions of the portable power case 2100.

In a preferred embodiment, the batteries 2204A-2204C are 29.4V lithium ion rechargeable batteries in a housing for mating with a PRC-117F radio. FIG. 26A illustrates an angled perspective view of a rechargeable battery in a housing for mating with a PRC-117F radio. FIG. 26B illustrates a top view of a rechargeable battery in a housing for mating with a PRC-117F radio. FIG. 26C illustrates a side view of a rechargeable battery in a housing for mating with a PRC-117F radio including a connector. FIG. 26D illustrates another side view of a rechargeable battery in a housing for mating with a PRC-117F radio. The batteries 2204A-2204C preferably contain a coating or layer of the heat-shielding or blocking and/or heat-dissipating material. In an alternative embodiment, at least one of the batteries 2204A-2204C does not have a housing, which reduces the weight and dimensions of the portable power case 2100.

The portable power case is enclosed in a hard case (e.g., PELICAN® 1500) in a preferred embodiment. The hard case is formed of polypropylene in one embodiment. Alternatively, the hard case is formed of polycarbonate. The hard case is preferably waterproof or water resistant. In one embodiment, the portable power case is sized to fit in a jerrycan holder attached to a vehicle.

Figure 27A:
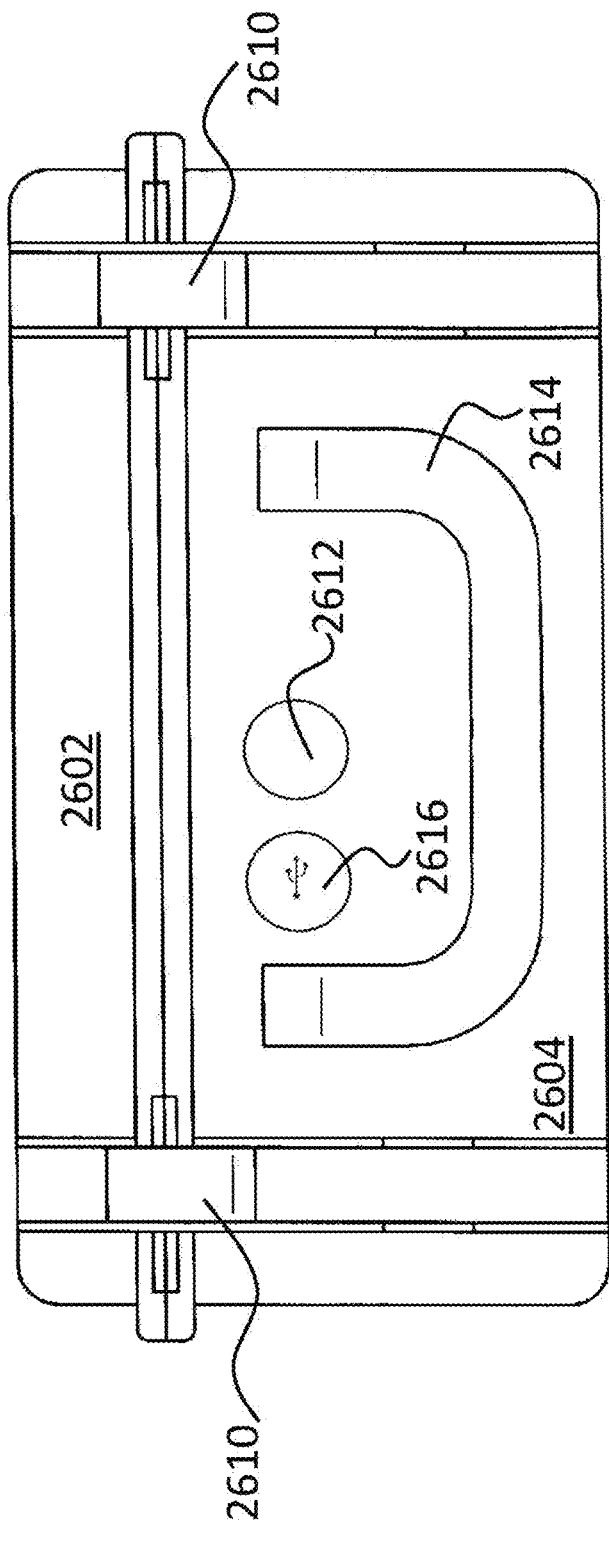
FIG. 27A illustrates a view of the exterior of one embodiment of the portable power case.

FIG. 27A illustrates a view of the exterior of one embodiment of the portable power case. The case includes a top portion 2602 (e.g., a lid) and a bottom portion 2604 (e.g., a base). The top portion 2602 and the bottom portion 2604 form a housing having an interior surface, an exterior surface, and an open interior space. The case includes latches 2610 for securing the contents of the case, a pressure purge valve 2612, and a handle 2614. The latches include a self-fusing silicone tape (e.g., RESCUE TAPE™) in a preferred embodiment to prevent the latches from rattling, which could give away a soldier's position and/or distract the soldier. A cap 2616 is provided to protect the USB ports.

In a preferred embodiment, the at least one battery and the at least one PCB are disposed within the open interior space of the bottom portion 2604 of the portable power case. In an alternative embodiment, one or more of the at least one PCB are disposed within the open interior space of the top portion 2602 of the portable power case.

Figure 27B:
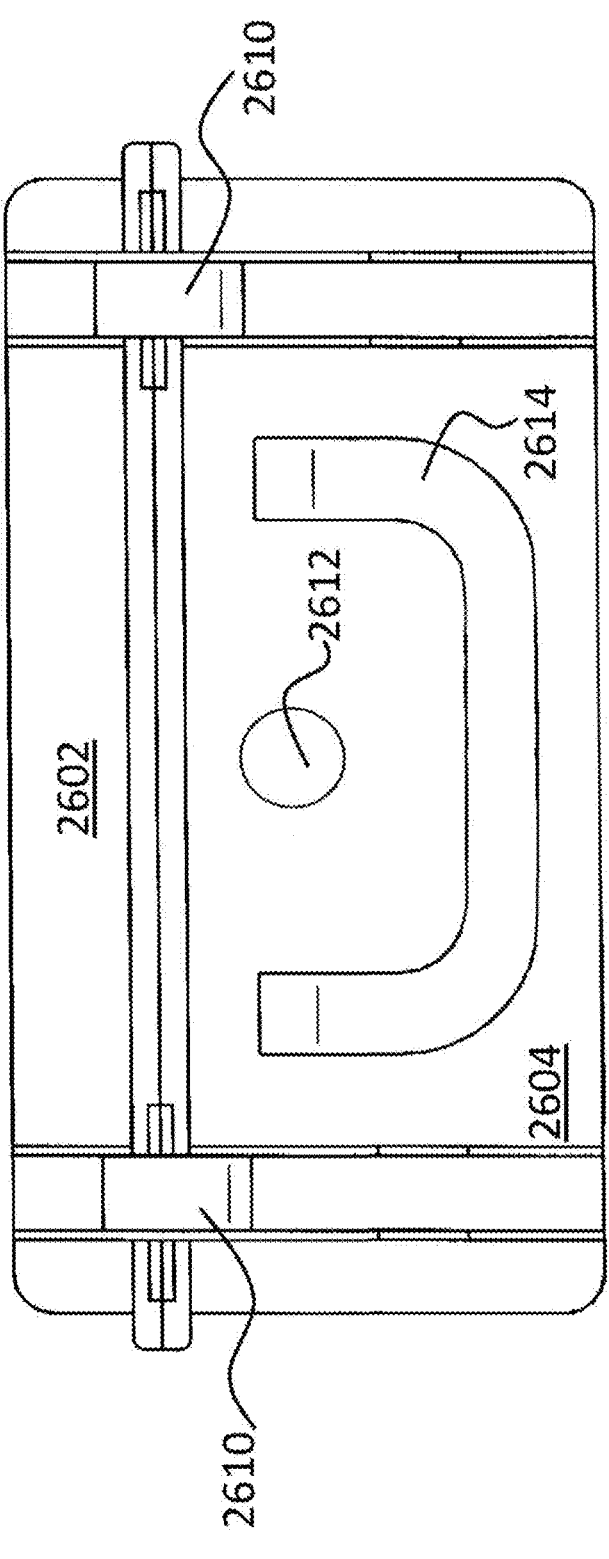
FIG. 27B illustrates a view of the exterior of another embodiment of the portable power case.

FIG. 27B illustrates a view of the exterior of another embodiment of the portable power case. The case in FIG. 27B differs from the case in FIG. 27A in that the USB ports are not positioned on the front of the case.

The portable power case has mounting attachments (e.g., single stud fittings or double stud fittings) compatible with L-track tie down systems in one embodiment. L-track tie down systems are often installed in military vehicles and aircraft. Additionally or alternatively, the portable power case has mounting attachments compatible with A-track, E-track, F-track, and/or kaptive beam tie down systems. In a preferred embodiment, the mounting attachments are attached to the bottom portion 2604 of the portable power case.

Figure 27C:
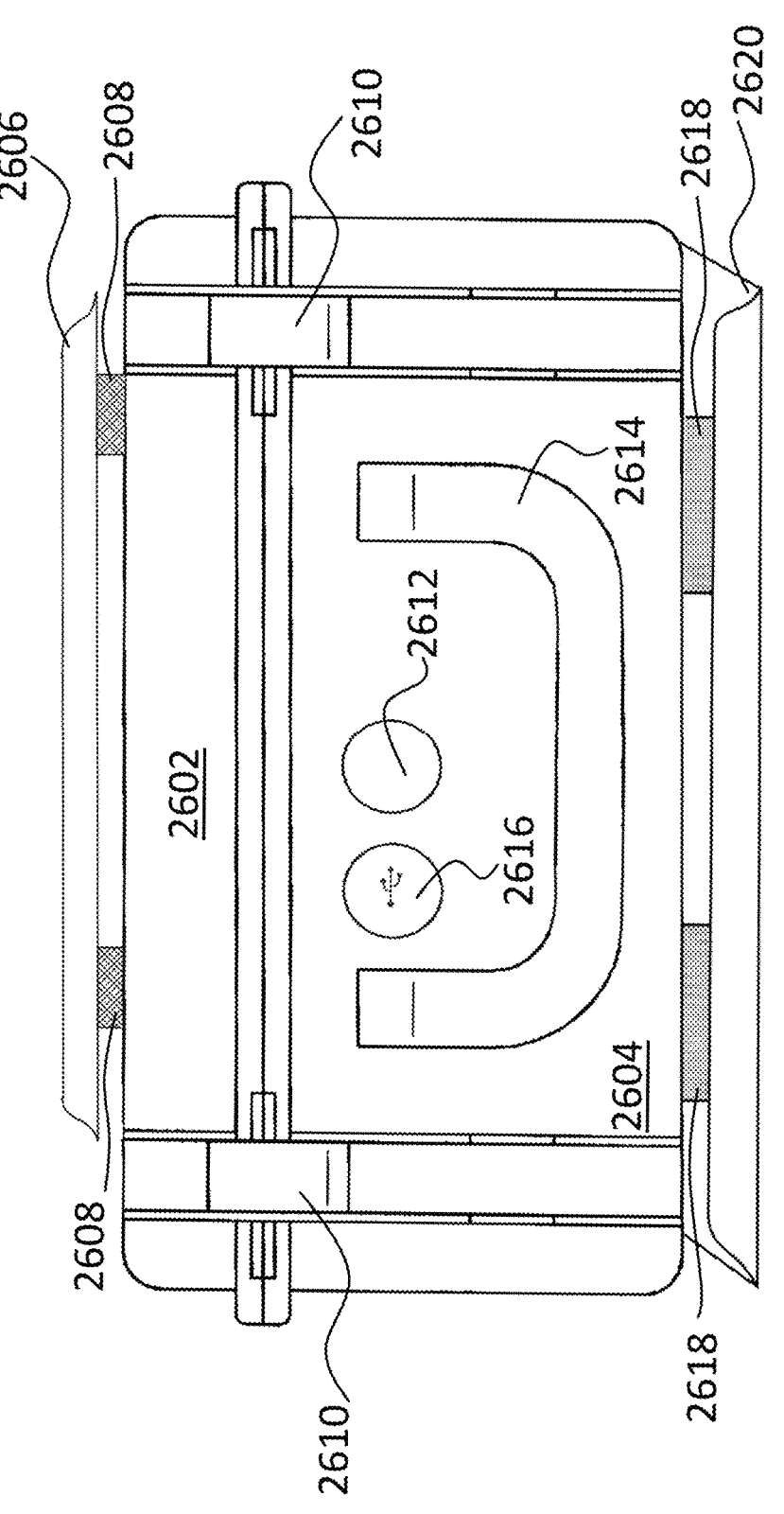
FIG. 27C illustrates a view of the exterior of yet another embodiment of the portable power case.

FIG. 27C illustrates a view of the exterior of yet another embodiment of the portable power case. A base for mounting at least one amplifier and at least one radio 2606 is attached to the top portion 2602 through shock absorbing cylinders 2608. A base for securing the portable power case to a vehicle 2620 is attached to the bottom portion 2604 through shock absorbing cylinders 2618.

In a preferred embodiment, the base for mounting at least one amplifier and at least one radio 2606, the shock absorbing cylinders 2618, and the base for securing the portable power case to a vehicle 2620 are formed from a shock mount interface assembly (e.g., HARRIS® 12050-3050-01). Alternative mounts are compatible with the present invention.

In an alternative embodiment, the portable power case includes the base for mounting at least one amplifier and at least one radio 2606 attached to the top portion 2602 through shock absorbing cylinders 2608. In one embodiment, the portable power case has mounting attachments compatible with L-track, A-track, E-track, F-track, and/or kaptive beam tie down systems. In a preferred embodiment, the mounting attachments are attached to the bottom portion 2604 of the portable power case.

Figure 28:
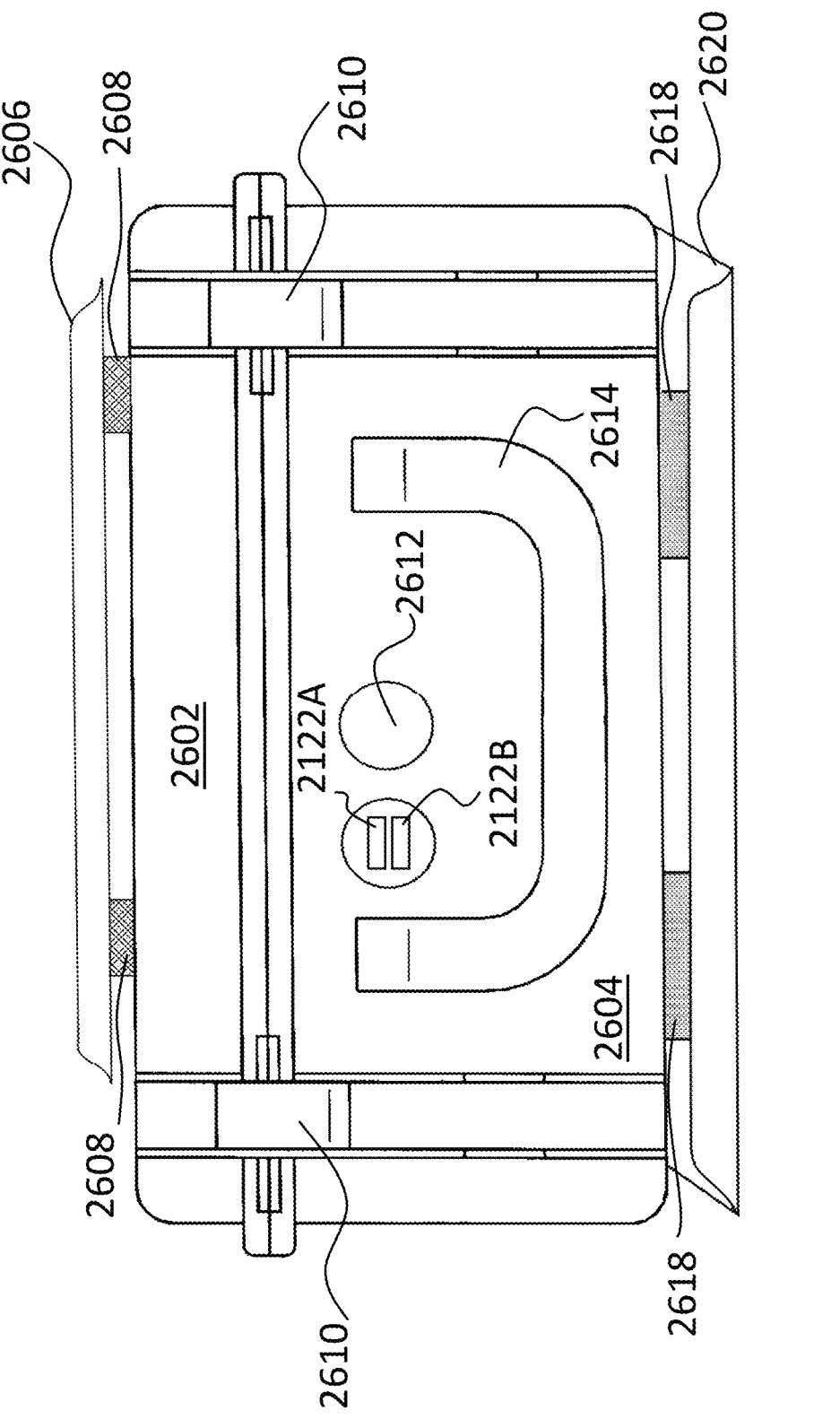
FIG. 28 illustrates a view of the portable power case showing the USB ports.

FIG. 28 illustrates a view of the portable power case with the cap (not shown) removed to show the USB ports. USB ports 2122A and 2122B are accessible on the front of the hard case.

Figure 29:
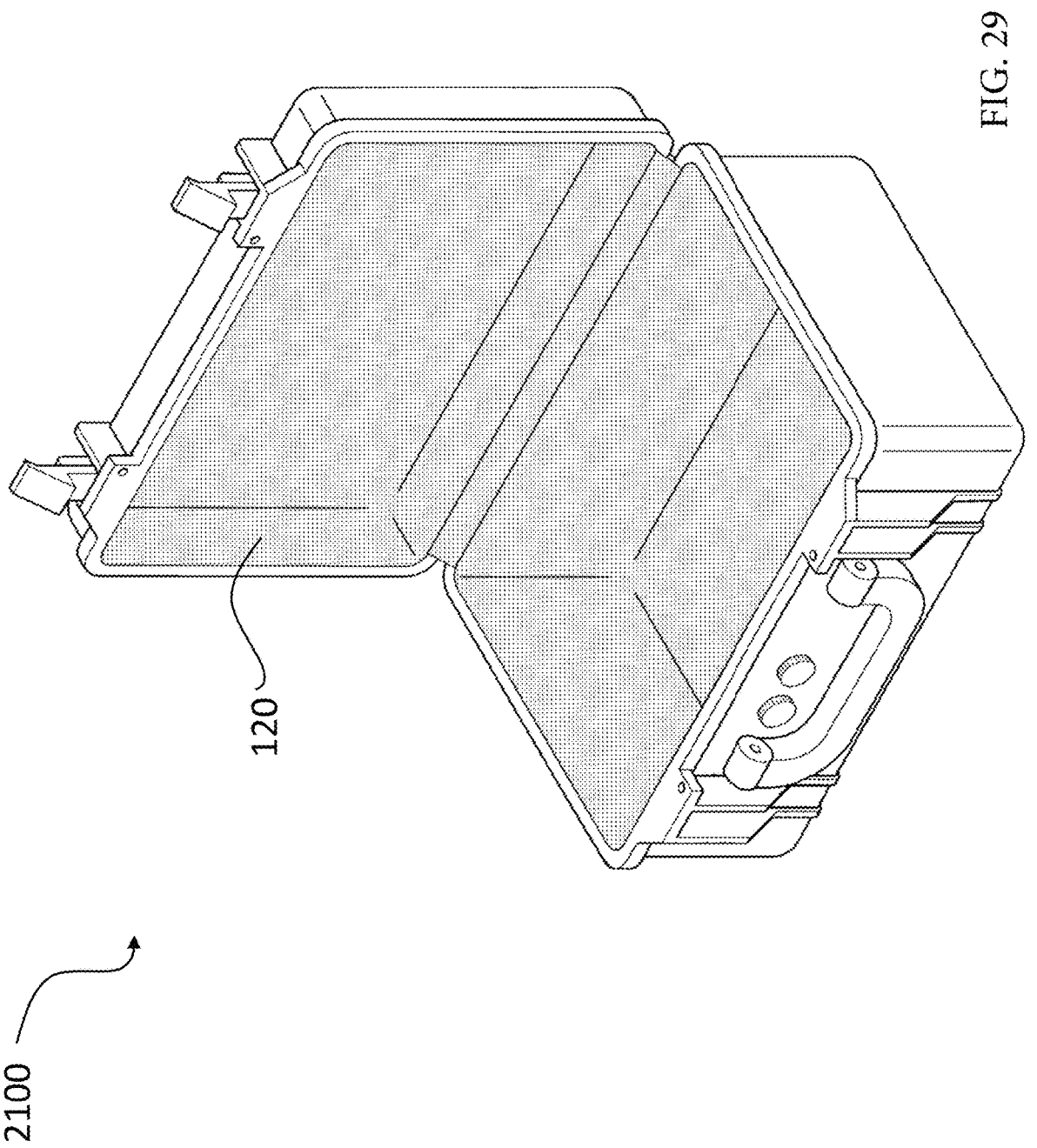
FIG. 29 illustrates one example of the portable power case lined with material resistant to heat.

The hard case is lined with foam in one embodiment. Additionally or alternatively, the case is lined with a material that is resistant to heat and/or electromagnetic interference. FIG. 29 shows one example of the portable power case 2100 lined with material resistant to heat 120. The amplifier and radio give off a significant amount of heat. The heat resistant material prevents heat transfer from the amplifier and radio to the batteries. If a lithium ion battery overheats, it reduces performance of the battery, reduces the life span of the battery, and may result in a fire. Further, the batteries within the portable power case generate heat. Lining the portable power case with a material resistant to heat decreases the heat profile of soldiers, making them less vulnerable to enemy thermal imaging technology.

Additionally, the heat resistant material may also be anti-electromagnetic interference material. The anti-electromagnetic interference material lining creates a Faraday cage and prevents disruption by electromagnetic radiation. In an alternative embodiment, the case may be coated with an electromagnetic interference and/or radio frequency interference shielding paint including copper, silver, nickel, and/or graphite.

The portable power case provides for modularity that allows the user to disassemble and selectively remove the batteries installed within the portable power case housing in a preferred embodiment. This modularity allows the user to comply with Survival, Evasion, Resistance, and Escape (SERE) training. In case of attack, each of the batteries can be used to power the at least one radio and/or the at least one amplifier, as well as other gear, because each battery has its own battery management circuit.

As previously mentioned, shipping lithium ion batteries or devices with lithium ion batteries is banned or highly regulated in most parts of the world due to the risk of overheating and/or fire. Advantageously, this modularity makes it easier to ship or transport the portable power case because the batteries can be transported individually. In one example, the portable power case includes two batteries. A first battery can be shipped in the portable power case, while a second battery can be shipped separately from the portable power case. Then the case is reassembled and separate batteries placed back in the harness within the portable power case at the destination.

The portable power case has at least two access ports, at least two leads, or at least one access port and the at least one lead accessibly positioned on the exterior surface of the hard case. The at least two access ports, at least two leads, or at least one access port and the at least one lead are operable to charge the portable power case and supply power to electronic devices. In a preferred embodiment, the portable power case has four access ports or four leads. Each access port or lead can be used for both the charging function and the power supply function. The access ports or leads are not dedicated to the charging function only or the power supply function only. The access ports or leads can be used for either function at any time. For example, if the portable power case has four access ports, all four access ports can be used for the charging the portable power case, three access ports can be used for charging the portable power case and one access port can be used to supply power to an electronic device, two access ports can be used for charging the portable power case and two access ports can be used to supply power to electronic devices, one access port can be used for charging the portable power case and three access ports can be used to supply power to electronic devices, or all four access ports can be used to supply power to electronic devices.

Each access port and/or lead is preferably operable to charge and discharge at the same time. In one example, a Y-splitter with a first connector and a second connector is attached to a lead. The Y-splitter allows the lead to supply power to equipment via the first connector and charge a battery via the second connector at the same time. In another example, a Y-splitter with a first connector and a second connector is attached to an access port. The Y-splitter allows the access port to supply power to equipment via the first connector and charge a battery via the second connector at the same time. Thus, each access port and/or lead is operable to allow power to flow in and out of the portable power case simultaneously.

In one embodiment, the at least two access ports, the at least two leads, or the at least one access port and the at least one lead prioritize the charging of electronic devices. In one example, the portable power case has two access ports. The second access port will stop charging an electronic device when the available power in the portable power case is lower than a designated threshold. In another example, the portable power case has four access ports. The fourth access port will stop charging an electronic device when the available power in the portable power case is lower than a first designated threshold, the third access port will stop charging an electronic device when the available power in the portable power case is lower than a second designated threshold, and the second access port will stop charging an electronic device when the available power in the portable power case is lower than a third designated threshold.

The portable power case can supply power to electronic devices that are different for each access port or lead. In one example, the portable power case is supplying power to a wearable battery and an amplifier. In another example, the portable power case is supplying power to four wearable batteries.

In one embodiment, the portable power case provides power in an order of priority of the device and automatically cuts out devices of lower mission priority in order to preserve remaining power for higher priority devices. In one example, a radio has a first (i.e., top) priority, a tablet has a second priority, a mobile phone has a third priority, and a laser designator (e.g., Special Operations Forces Laser Acquisition Marker (SOFLAM)) has a fourth priority.

In one embodiment, the portable power case prioritizes at least one device by using at least one smart cable. The at least one smart cable stores information including, but not limited to, a unique identifier (e.g., MAC address) for the at least one device, power requirements of the at least one device, a type of device for the at least one device, and/or a priority ranking for the at least one device.

Additionally, the method used to charge the portable power case can be different for each access port or lead. In one example, the portable power case is charging using a solar panel and an AC adapter. In another example, the portable power case is charging using four AC adapters.

In a preferred embodiment, the at least two access ports, at least two leads, or at least one access port and the at least one lead are the same type of connector (e.g., female FISCHER® SOV 105 A087 connectors or TAJIMI™ Electronics part number R04-P5f) and provide the same output voltage. Alternatively, the at least two access ports, at least two leads, or at least one access port and the at least one lead are made of at least two different types of connectors and/or provide different output voltages. Preferably, the diameter and/or shape of the connector is different for different input voltages. In one example, an access port or lead has a higher output voltage (e.g., 29.4V) and larger diameter, while another access port or lead has a lower output voltage (e.g., 16.8V) and smaller diameter. This coordination of higher voltage with larger diameter and lower voltage with smaller diameter makes it intuitive for an operator to use the correct access port or lead for the correct device (e.g., amplifier, radio, wearable battery, vehicle battery, AC adapter, generator, solar panel, laser designator). Advantageously, this coordination allows an operator to associate the correct access port or lead with the correct device in the dark. Thus, the access port or lead is an inherent voltage selector. Further, the operator can quickly connect devices without knowing an operating voltage, thereby maintaining situational awareness and eyes on combat.

Figures 30A, 30B:
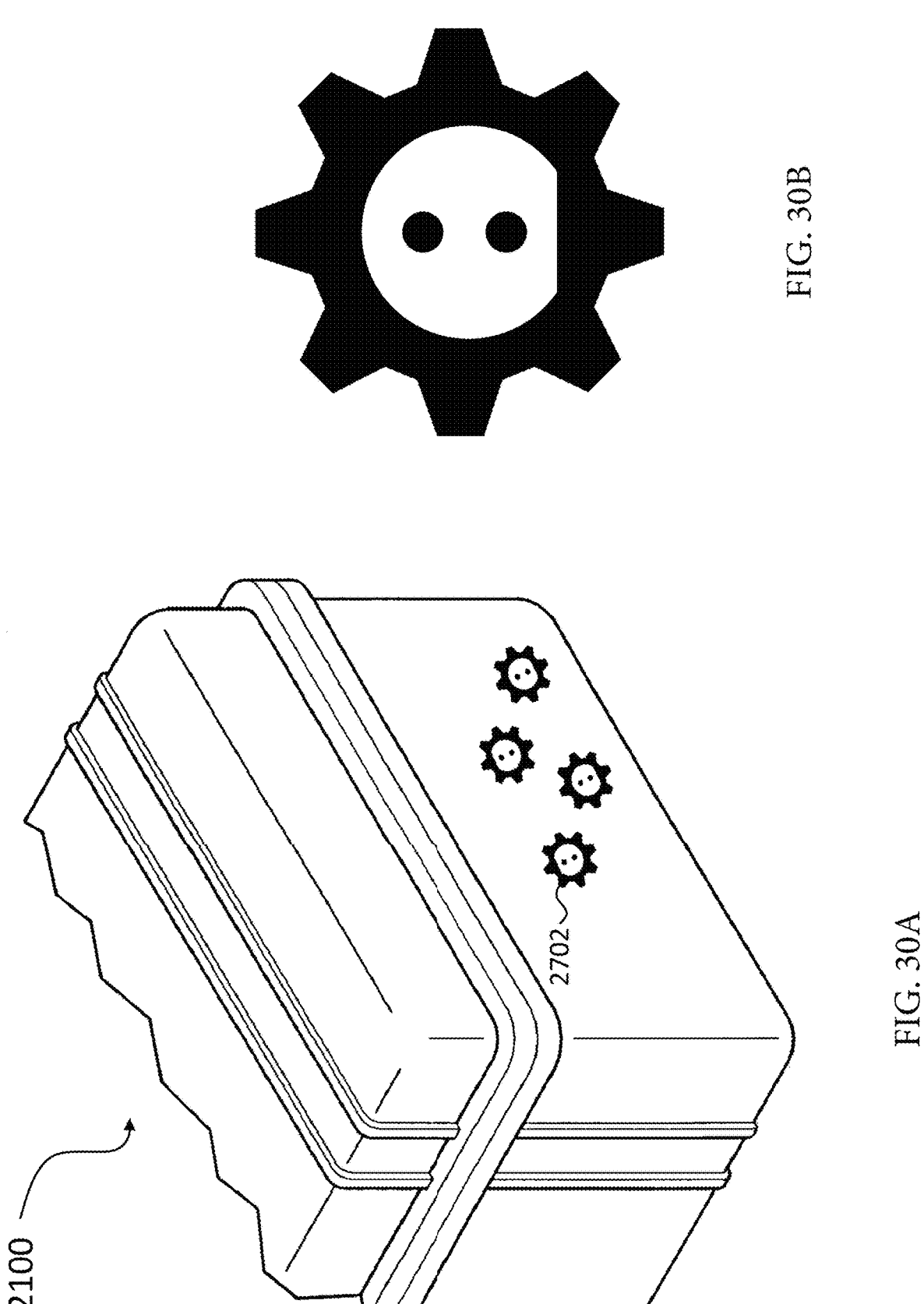
FIG. 30A illustrates one embodiment of the access ports of the portable power case.
FIG. 30B illustrates a keyway of the access ports of the portable power case.

FIG. 30A shows a view of one embodiment of the access ports. The access ports are preferably staggered vertically and horizontally to allow for easy access to the ports. As shown in FIG. 30B, the preferred embodiment includes a keyway (shown as a flat portion of the connector) to ensure correct orientation of cables. In one embodiment, the cables connected to the access ports located on the top row orient downwards and the cables connected to the access ports located on the bottom row orient upwards. Alternatively, the cables connected to the access ports located on the top row orient downwards and the cables connected to the access ports located on the bottom row orient upwards. A gasket 2702 is provided around each of the access ports to seal the interior of the case from the external environment. In a preferred embodiment, the access ports are circular connectors (e.g., female FISCHER® SOV 105 A087 connectors or TAJIMI™ Electronics part number R04-P5f). In one embodiment, a dust cap is provided for each of the access ports to protect the access port from environmental elements when not in use.

In another preferred embodiment, the access ports are all oriented upwards. Advantageously, this embodiment allows an operator to quickly connect devices because the access ports orient in the same direction, thereby allowing the operator to develop motor memory.

Figure 30C:
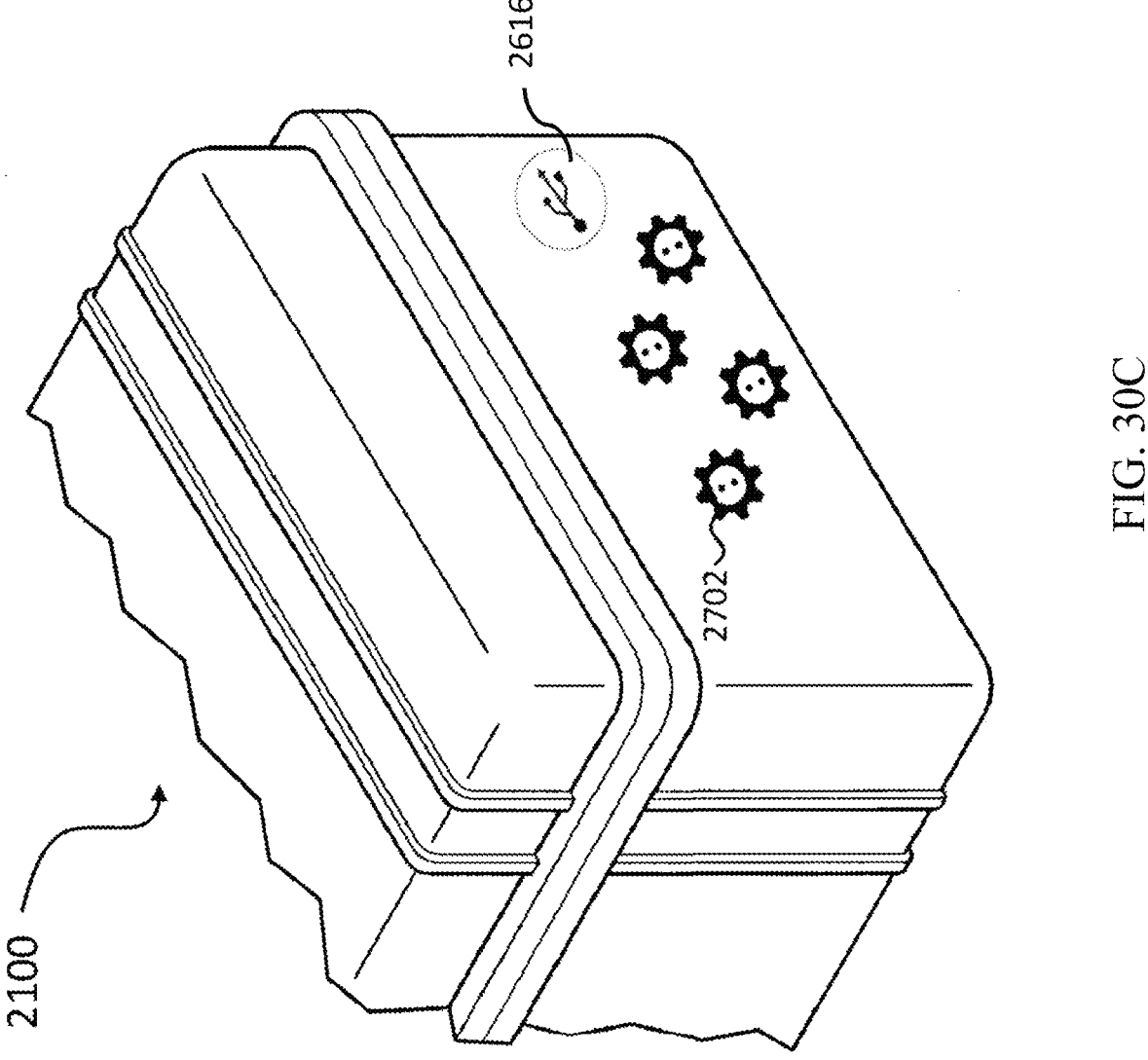
FIG. 30C illustrates one embodiment of the access ports and the USB ports of the portable power case.

FIG. 30C shows a view of one embodiment of the access ports and the USB ports. The access ports are preferably staggered vertically and horizontally to allow for easy access to the access ports. The USB ports are located on the side of the portable power case 2100 in this embodiment. A cap 2616 is provided to protect the USB ports.

Figure 30D:
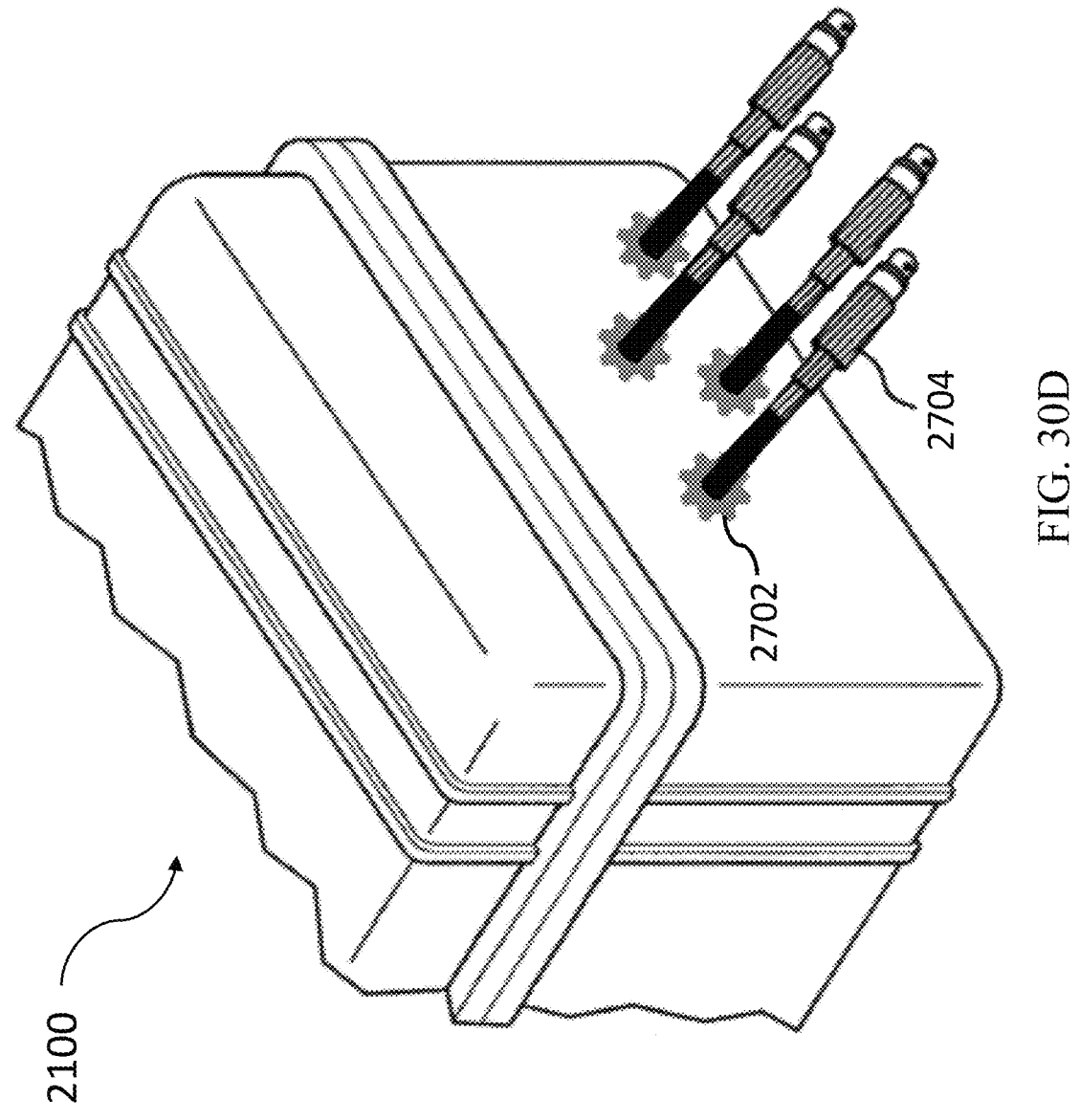
FIG. 30D shows a view of one embodiment of a portable power case with leads.

FIG. 30D shows a view of one embodiment of a portable power case with leads. The leads are preferably staggered vertically and horizontally to allow for easy access to the leads. A gasket 2702 is provided around each of the leads to seal the interior of the case from the external environment.

In one embodiment, a dust cap is provided for each of the leads to protect the leads from environmental elements when not in use.

Figure 30E:
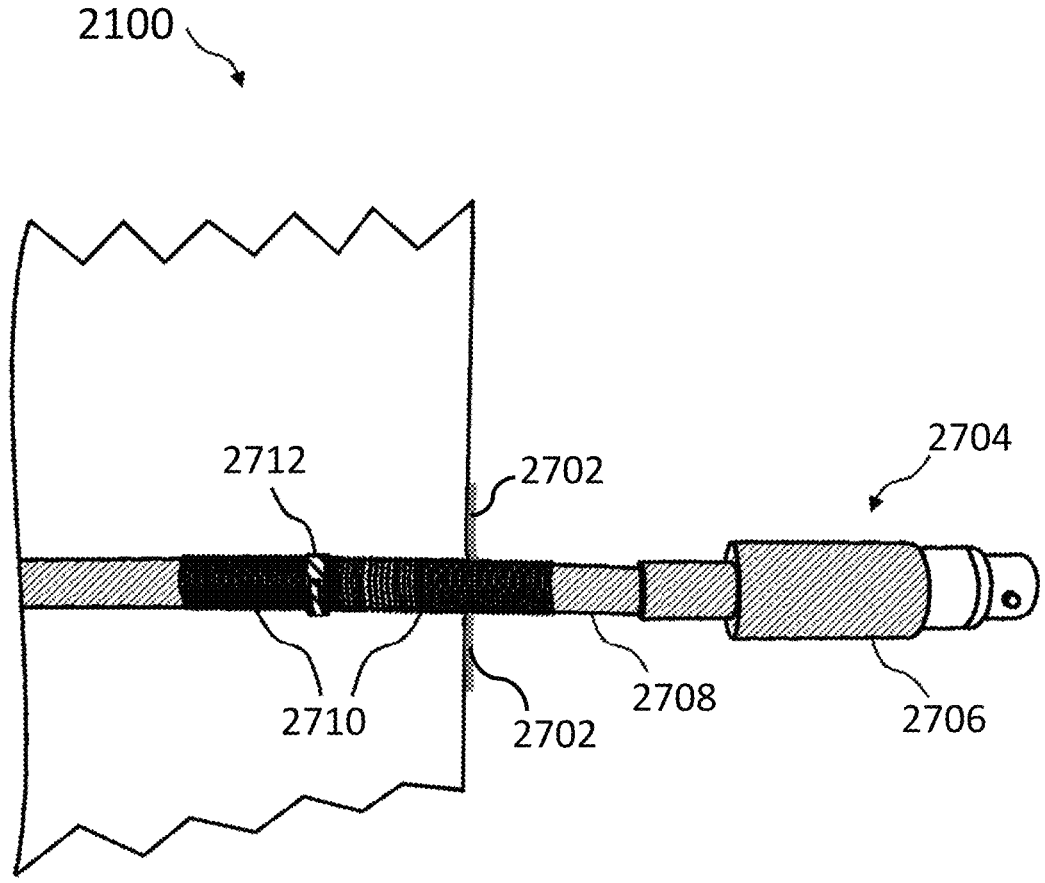
FIG. 30E shows a cutaway view of one embodiment of a portion of the portable power case showing more details of the leads.

FIG. 30E shows a cutaway view of one embodiment of a portion of the portable power case 2100, which shows more details of the leads 2704. An exterior gasket 2702 and an interior gasket 2714 is provided around each of the leads to seal the interior of the case from the external environment. Each lead 2704 has a connector portion 2706 and a wiring portion 2708. Wiring portion 2708 is electrically connected to at least one battery. Connector portion 2706 can be any type or style of connector needed to mate to the equipment to be used with the portable power case 2100. In a preferred embodiment, the connector portion 2706 is a female circular type of connector (e.g., female FISCHER® SOV 105 A087 connector, TAJIMI™ part number R04-P5f). In an alternative embodiment, at least one connector portion 2706 is a male universal serial bus (USB), micro USB, lightning, and/or Firewire connector. In another embodiment, the connector portion 2706 is a connector designed to prevent arc flash (e.g., MELTRIC connectors). In yet another embodiment, the connector portion 2706 has an Ingress Protection (IP) rating of IP2X, IP3X, IP4X, IP5X, IP6X, IPX1, IPX2, IPX3, IPX4, IPX5, IPX6, IPX7, or IPX8. More preferably, the connector portion 2706 has an IP rating of IPX6, IPX7, or IPX8. IP ratings are described in IEC standard 60529, ed. 2.2 (May 2015), published by the International Electrotechnical Commission, which is incorporated herein by reference in its entirety. In one embodiment, the connector portion meets standards described in Department of Defense documents MIL-STD-202E, MIL-STD-202F published February 1998, MIL-STD-202G published 18 Jul. 2003, and/or MIL-STD-202H published 18 Apr. 2015, each of which is incorporated herein by reference in its entirety.

In a preferred embodiment, the leads 2704 are flexible omnidirectional leads. Wiring portion 2708 is fitted into a channel formed in the portable power case 2100 such that connector portion 2706 extends away from the portable power case 2100. A spring 2710 is provided around wiring portion 2708, such that a portion of spring 2710 is inside the portable power case 2100 and a portion of spring 2710 is outside the portable power case 2100. In one example, spring 2710 is a steel spring that is from about 0.25 inches to about 1.5 inches long. Wiring portion 2708 of lead 2704 and spring 2710 are held securely in the channel of the portable power case 2100 via a clamping mechanism 2712. Alternatively, the wiring portion 2708 of lead 2704 and spring 2710 are held securely in the channel of the portable power case 2100 using an adhesive, a retention pin, a hex nut, a hook anchor, and/or a zip tie.

The presence of spring 2710 around wiring portion 2708 of lead 2704 allows lead 2704 to be flexed in any direction for convenient connection to equipment from any angle. The presence of spring 2710 around wiring portion 2708 of lead 2704 also allows lead 2704 to be flexed repeatedly without breaking or failing. The design of leads 2704 provides benefit over conventional leads and/or connectors that are rigid, wherein conventional rigid leads allow connection from one angle only and are prone to breakage if bumped.

In one embodiment, the flexible omnidirectional leads are attached to the portable power case via a panel mount pass through. In a preferred embodiment, the panel mount pass through is formed of metal (e.g., aluminum). Alternatively, the flexible omnidirectional leads are attached to the portable power case with a panel mount gasket. In one embodiment, a gasket is on the inside and/or outside of the portable power case to seal the portable power case from environmental elements (e.g., dust, water). In one embodiment, the gasket is formed of silicone or rubber. In another embodiment, a layer of heat shrink tubing is placed around the wiring portion before the spring is placed around the wiring portion. The heat shrink tubing is preferably flexible. Advantageously, the heat shrink tubing provides additional waterproofing for the battery.

Figure 31:
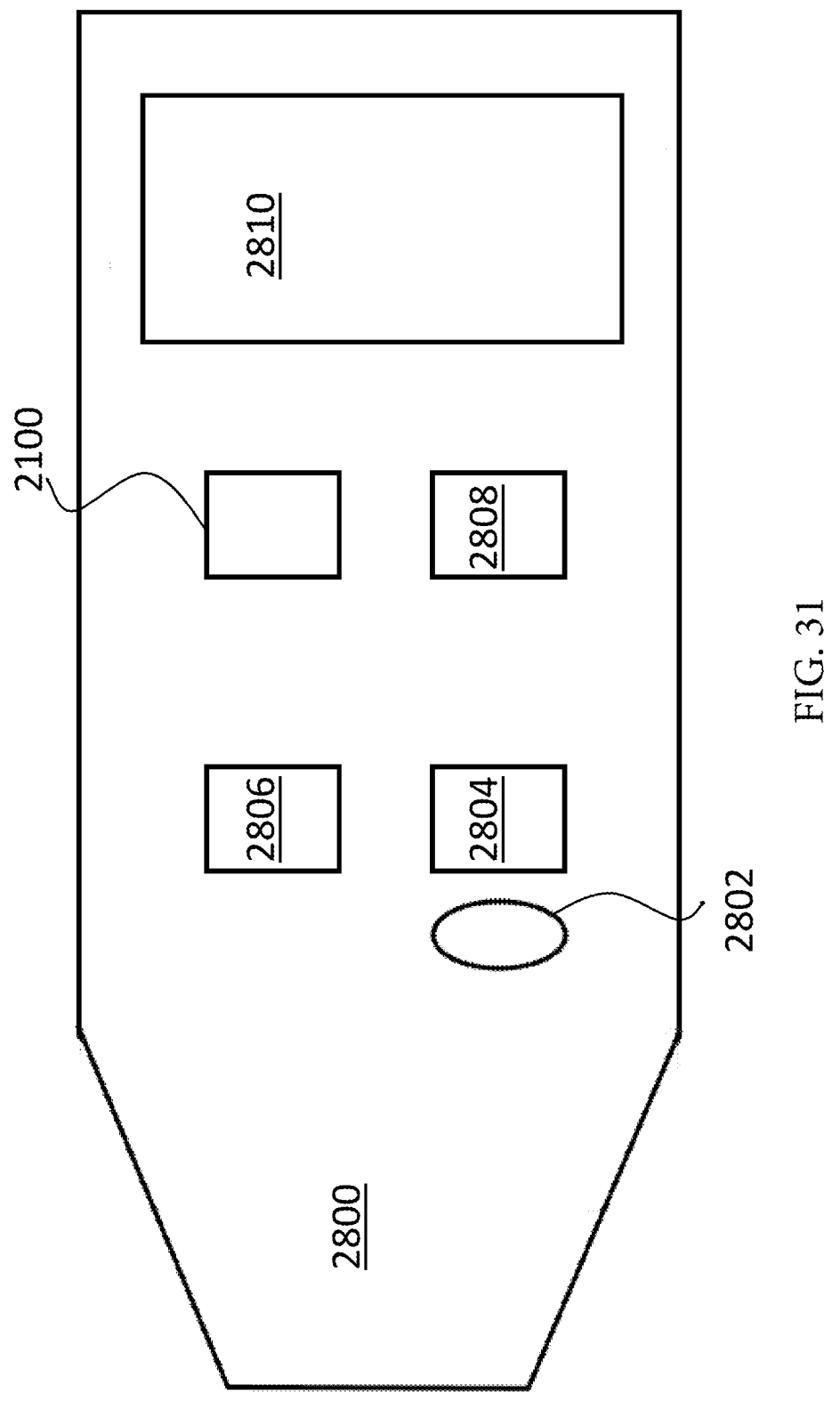
FIG. 31 illustrates a block diagram of a portable power case in an ATV with three passengers.

The at least two access ports, at least two leads, or at least one access port and the at least one lead are positioned on the left side of the case relative to the latches in a preferred embodiment. FIG. 31 illustrates a block diagram of a portable power case in an ATV with three passengers. The ATV 2800 has a steering wheel 2802 and a seat for a driver 2804. A seat for a first passenger 2806 is to the right of the driver. The first passenger is responsible for maintaining the security of the right side of the ATV. A seat for a second passenger 2808 is behind the driver. The second passenger is responsible for maintaining the security of the left side of the ATV. The locations of the first passenger and the second passenger allow for 360-degree visual coverage of the landscape surrounding the ATV. The portable power case 2100 is located to the right of the second passenger. Placing the access ports and/or leads on the left side of the case relative to the latches prevents the second passenger and/or gear from knocking the cables connected to the case loose from the access ports and/or leads. The trunk 2810 is available for storing additional gear.

Figure 32:
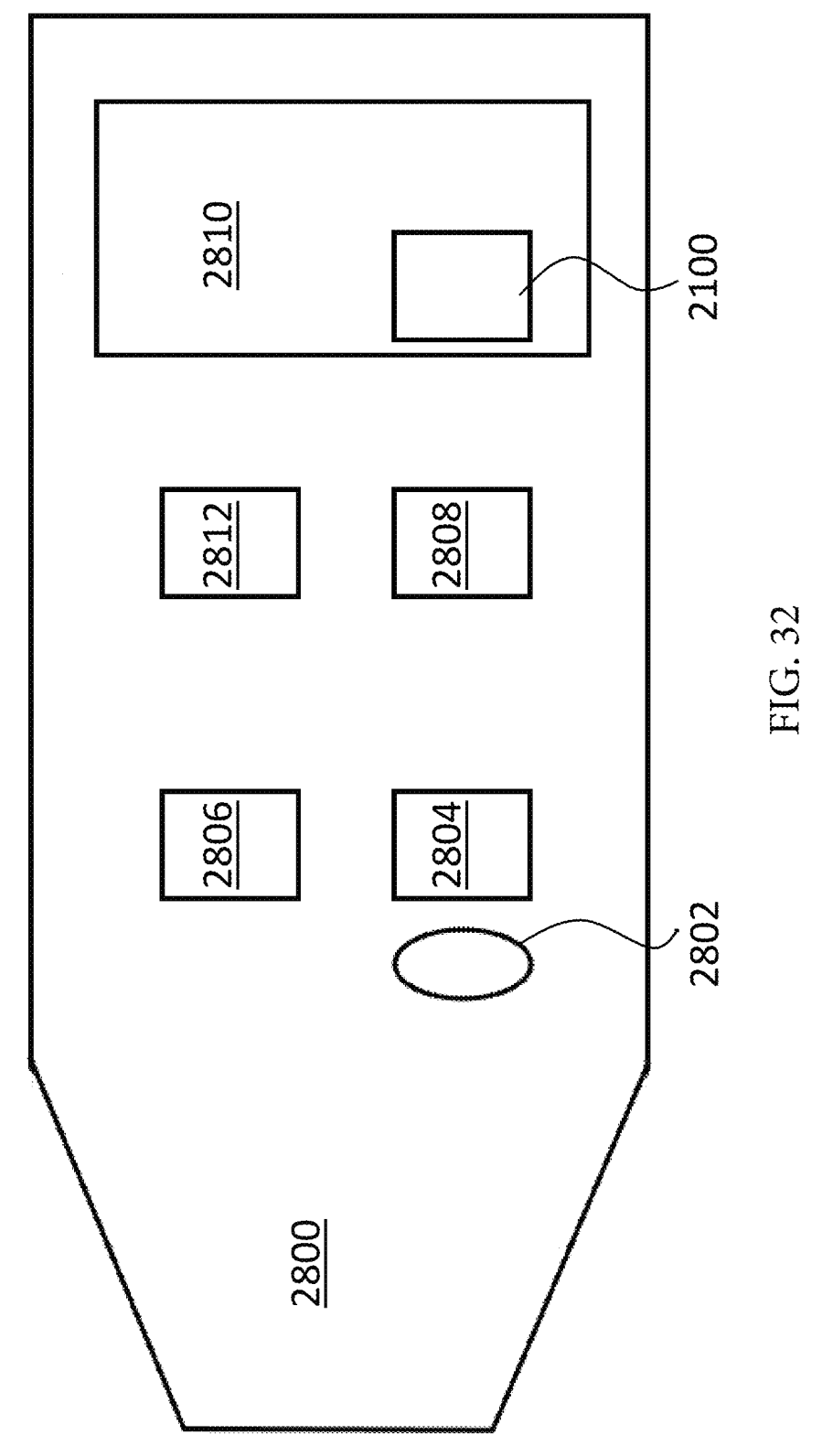
FIG. 32 illustrates a block diagram of a portable power case in an ATV with four passengers.

FIG. 32 illustrates a block diagram of a portable power case in an ATV with four passengers. The ATV 2800 has a steering wheel 2802 and a seat for a driver 2804. A seat for a first passenger 2806 is to the right of the driver. A seat for a second passenger 2808 is behind the driver. The second passenger is responsible for maintaining the security of the left side of the ATV. A seat for a third passenger 2812 is to the right of the seat for the second passenger 2808. The portable power case 2100 is placed in the trunk 2810.

In one embodiment, the portable power case includes at least one visual indicator for indicating the state of charge of an electronic device attached to an access port or lead. In one embodiment, the visual indicator is at least one LED. One preferred embodiment of a visual indicator is a set of light-emitting diodes (LEDs) (e.g., 5 LEDs), wherein five lit LEDs flashing or five lit LEDs indicates greatest charge and one lit LED or one lit LED flashing indicates least charge. In one embodiment, the LEDs are red, yellow, and/or green. In one example, two of the LEDs are green to indicate a mostly full battery in the electronic device, two of the LEDs are yellow to indicate a moderate charge in the electronic device, and one LED is red to indicate that the battery is almost drained in the electronic device. Additionally or alternatively, the LEDs include a blue LED to indicate that the access port or lead is currently attached to a device that is charging the portable power case.

In one embodiment, the at least one LED is preferably covered with a transparent material. In a preferred embodiment, the cover is formed of a clear plastic (e.g., poly(methyl methacrylate)). This provides an extra layer of protection for the at least one LED. This increases the durability of the at least one LED. The portable power case includes a waterproof sealant (e.g., silicone) around the cover.

In an alternative embodiment, the visual indicator for indicating the state of charge of an electronic device attached to an access port or lead is at least one LCD. A preferred embodiment of a visual indicator is at least one 5-bar liquid crystal display (LCD), wherein five bars flashing or five bars indicates greatest charge and one bar or one bar flashing indicates least charge. Another example of a visual indicator is at least one seven-segment numeric LCD, wherein the number 5 flashing or the number 5 indicates greatest charge and the number 1 or the number 1 flashing indicates least charge. Alternatively, an LCD displays the voltage of the electronic device as measured by the control electronics.

The at least one LCD is preferably covered with a transparent material. In a preferred embodiment, the cover is formed of a clear plastic (e.g., poly(methyl methacrylate)). This provides an extra layer of protection for the at least one LCD, much like a screen protector provides an extra layer of protection for a smartphone. This increases the durability of the at least one LCD. The portable power case includes a waterproof sealant (e.g., silicone) around the cover.

In an alternative embodiment, the state of charge of an electronic device attached to an access port or lead is displayed on an indicator incorporated into to a cable attaching the electronic device to the access port or lead. The state of charge is preferably displayed on the indicator when a button is pressed or a switch is turned on. In one embodiment, the cable is operable to communicate information to at least one remote device using a mobile application.

In yet another embodiment, the state of charge of an electronic device attached to an access port or lead is displayed on a separate state of charge indicator, such as the state of charge indicators disclosed in U.S. application Ser. No. 15/612,617 and U.S. Publication No. 20150198670, each of which is incorporated herein by reference in its entirety. In one embodiment, the state of charge indicator is operable to be charged using induction charging.

The portable power case preferably includes at least one USB port for charging electronic devices (e.g., mobile phone, tablet, smartphone, camera, global positioning system devices (GPS), thermal imaging devices, weapon optics, watches, satellite phones, defense advanced GPS receivers, antenna). The at least one USB port is preferably accessibly positioned on the front side of the case. Advantageously, this positions the at least one USB port away from a second passenger of an ATV such that the second passenger's gear does not knock a USB cable loose, while allowing the at least one USB port to remain accessible. Alternatively, the at least one USB port is accessibly positioned on the left, right, or back side of the case or in the top portion of the case (e.g., the lid).

In a preferred embodiment, the at least one USB port connects to any 9-32 volt DC power input. In one embodiment, the at least one USB port has an LED (e.g., a blue LED) that illuminates when the at least one USB port is powered on. In a preferred embodiment, at least one protective dust cap protects the at least one USB port from environmental elements. In one embodiment, the portable power case includes two USB ports protected by one protective dust cap. The output voltage of the at least one USB port is 5 volts DC in one embodiment. The at least one USB port has a charging output up to 2.1 amps per USB device (4.2 amps maximum output) in one embodiment. In a preferred embodiment, the at least one USB port is compatible with APPLE® and ANDROID™ products.

As previously mentioned, the portable power case and wearable battery 2108 are connected through a DC-DC converter cable. Additionally, the battery protector 2114 is connected to the portable power case through a DC-DC converter cable.

Figures 33A, 33B, 33C, 33D:
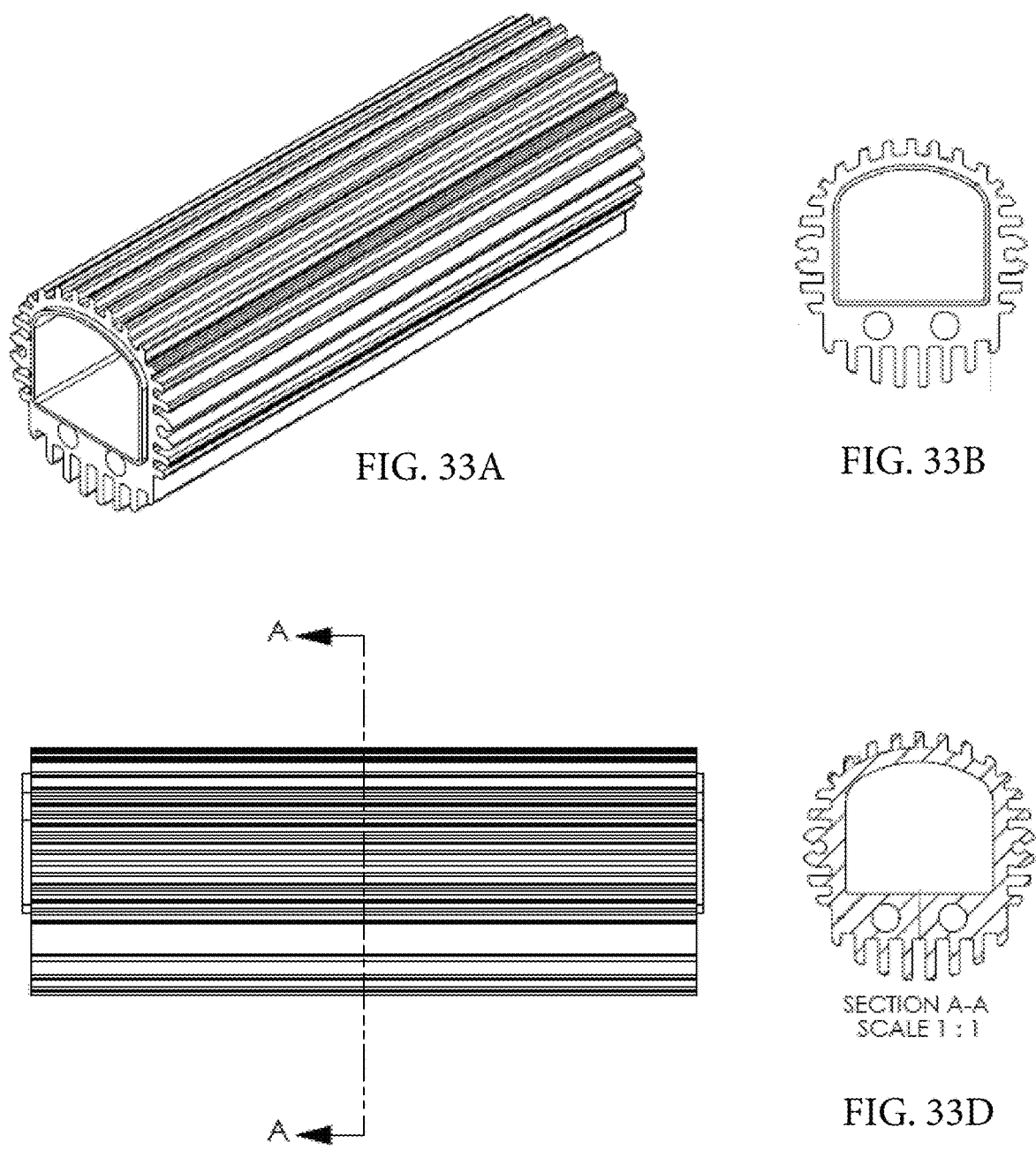
FIG. 33A illustrates an angled view of the housing of one embodiment of a DC-DC converter cable.
FIG. 33B illustrates an end view of the housing of one embodiment of a DC-DC converter cable.
FIG. 33C illustrates a side view of the housing of one embodiment of a DC-DC converter cable.
FIG. 33D illustrates a cross-section of the housing of one embodiment of a DC-DC converter cable.
Figure 33E:
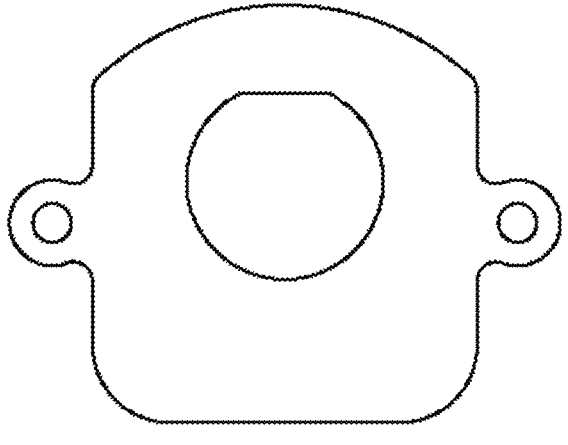
FIG. 33E illustrates an end view of a connector end cap for the housing of one embodiment of a DC-DC converter cable.
Figure 33F:
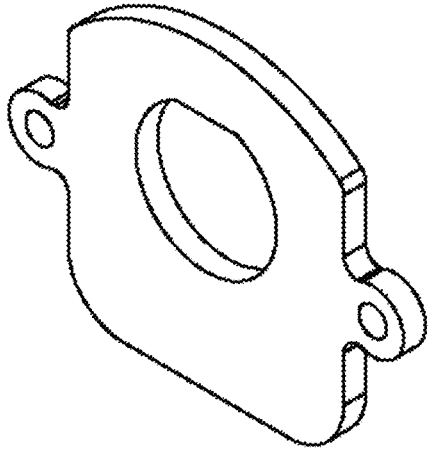
FIG. 33F illustrates an angled view of a connector end cap for the housing of one embodiment of a DC-DC converter cable.
Figure 33G:
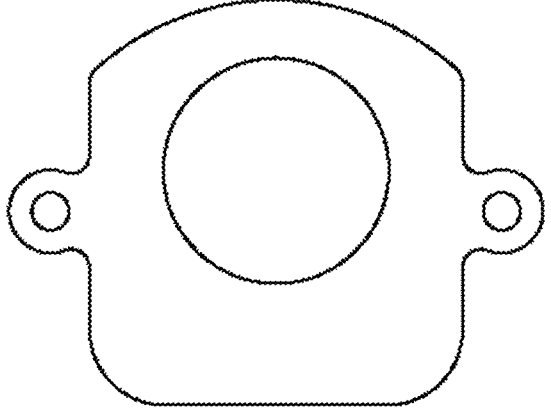
FIG. 33G illustrates an end view of a grommet end cap for the housing of one embodiment of a DC-DC converter cable.
Figure 33H:
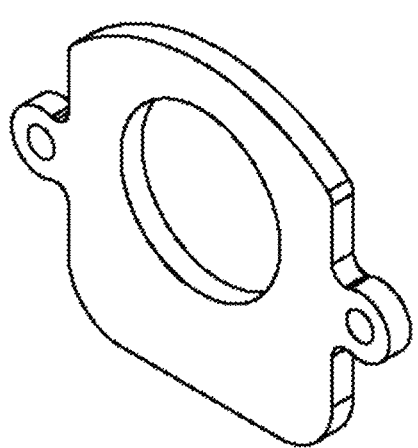
FIG. 33H illustrates an angled view of a grommet end cap for the housing of one embodiment of a DC-DC converter cable.

FIG. 33A illustrates an angled view of the housing of one embodiment of a DC-DC converter cable. FIG. 33B shows an end view of the housing of one embodiment of a DC-DC converter cable. FIG. 33C shows a side view of the housing of one embodiment of a DC-DC converter cable. FIG. 33D shows a cross-section of the housing of one embodiment of a DC-DC converter cable. FIG. 33E shows an end view of a connector end cap for the housing of one embodiment of a DC-DC converter cable. FIG. 33F shows an angled view of a connector end cap for the housing of one embodiment of a DC-DC converter cable. FIG. 33G shows an end view of a grommet end cap for the housing of one embodiment of a DC-DC converter cable. FIG. 33H shows an angled view of a grommet end cap for the housing of one embodiment of a DC-DC converter cable.

In a preferred embodiment, the exterior of the housing has fins to dissipate heat (i.e., a heat sink). The fins provide a larger surface area to dissipate the heat. Additionally or alternatively, the housing of the DC-DC converter cable is formed of copper vacuum tubes encased in an aluminum extrusion. Copper has a high thermal conductivity, which allows heat to quickly dissipate, and aluminum provides a weight savings.

The system allows the portable power case 2100 to charge using the vehicle battery 2112 after the ignition is turned off. The system includes a battery protector 2114 to prevent users from being stranded due to a drained vehicle battery 2112.

Figure 34:
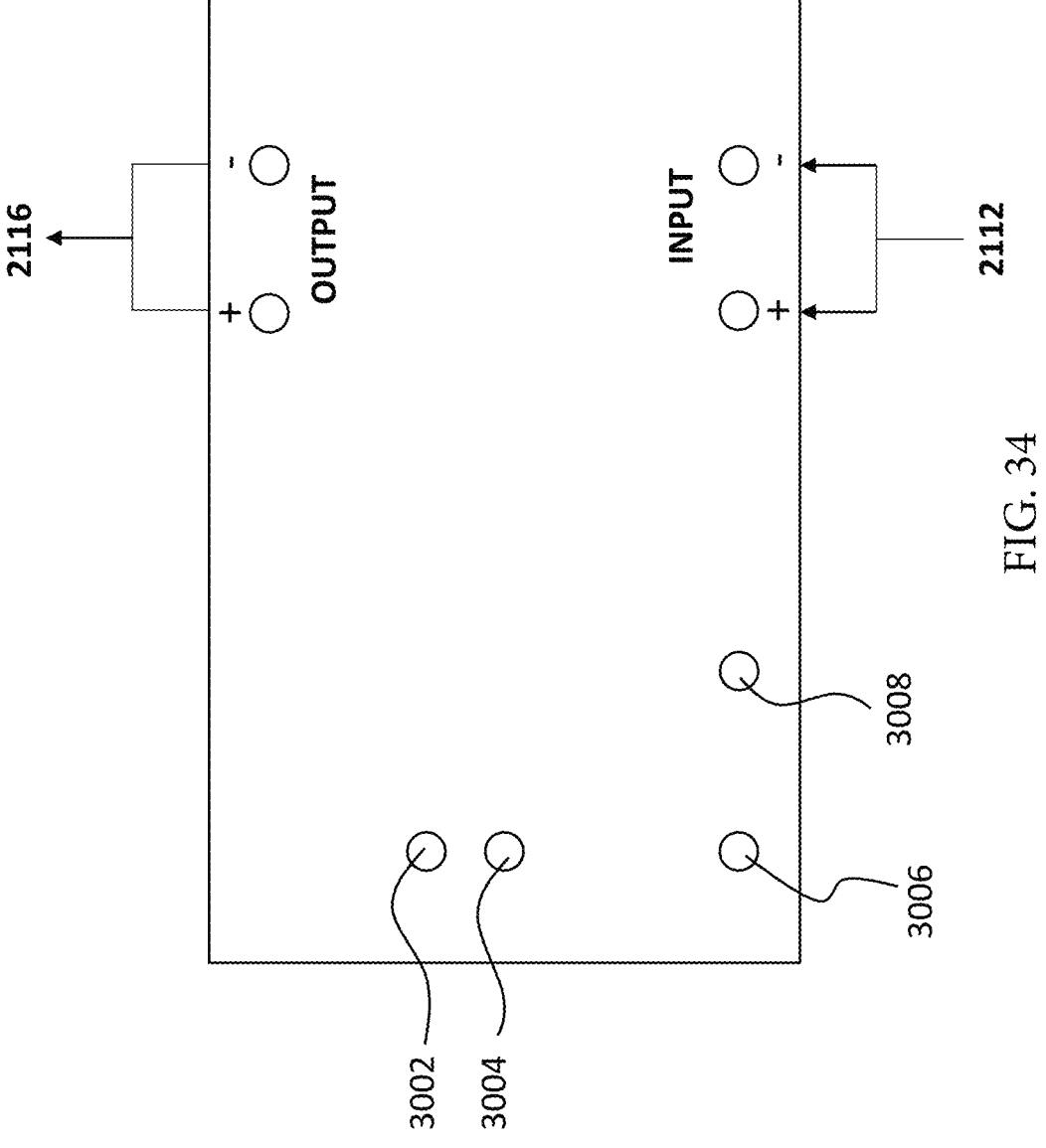
FIG. 34 illustrates a block diagram of the battery protector.

FIG. 34 illustrates a block diagram of the battery protector. The battery protector includes INPUT from the vehicle battery 2112 and OUTPUT to the DC-DC converter cable 2116. A green LED 3002 and a red LED 3004 provide visual information regarding the current charge status. The battery protector includes a rotary switch 3008 to select a desired time or voltage setting. In a preferred embodiment, the battery protector is connected to the vehicle battery using ring terminals. Alternatively, the battery protector is connected to the vehicle battery using alligator clips or a NATO slave adapter.

In one embodiment, the battery protector is a timer set to a time where the load will not drain the vehicle battery (e.g., 2 minutes, 15 minutes, 30 minutes, 1 hour, 2 hours, 3 hours, 4 hours, 5 hours, 8 hours, or 12 hours). Additionally or alternatively, the battery protector is a low voltage disconnect (LVD) that automatically disconnects the load when the vehicle battery voltage falls below a set DC voltage (e.g., 10.6V, 10.8V, 11.0V, 11.2V, 11.4V, 11.6V, 11.8V, 12.0V, 12.1V, or 12.2V for a 12V battery or 19V, 20V, 21V, 21.4V, 22V, 22.5V, 22.8V, 23V, 24V, 24.2V, 25V, or 25.5V for a 24V battery). In one embodiment, the battery protector automatically reconnects the load when the battery voltage returns to a normal value (e.g., above the set DC voltage) after charging. The battery protector automatically detects the vehicle battery voltage (e.g., 12V or 24V) and selects a corresponding set DC voltage (e.g., 11.6V for a 12V battery or 22.8V for a 24V battery) in another embodiment.

The battery protector has over voltage protection that automatically disconnects the load when the battery protector detects a voltage higher than a set DC voltage (e.g., above 16V) in a preferred embodiment. In one embodiment, the battery protector automatically reconnects the load when the detected voltage falls below the set DC voltage (e.g., below 16V).

The battery protector includes an emergency override switch 3006 in one embodiment. This allows the load to charge using the vehicle battery for an additional period of time (e.g., 15 minutes) in an emergency by overriding a timed-out timer.

In a preferred embodiment, the battery protector includes a visual indicator (e.g., LED lights) to indicate a current status. In one embodiment, the battery protector has a green LED light to indicate that the engine is running and the load is charging; a flashing green LED light to indicate that the vehicle engine is off, the timer has started, and the load is charging; a flashing red LED light to indicate that the timer has expired and the load is no longer charging; a slow flashing red LED light to indicate that the vehicle battery voltage is below the set DC voltage and the load is no longer charging; and a solid red light to indicate an overvoltage condition. The battery protector is preferably waterproof. Alternatively, the battery protector is water resistant.

The system also allows the portable power case to charge using at least one alternating current (AC) adapter. In a preferred embodiment, the at least one AC adapter has an AC plug on a first end and a circular connector (e.g., male FISCHER® SOV 105 A087 connector) on a second end. All of the at least two access ports, the at least two leads, or the at least one access port and the at least one lead can be used to charge the portable power case using AC adapters. In one embodiment, the portable power case has four access ports and can be charged in 16 hours using one AC adapter, 8 hours using two AC adapters, and 4 hours using four AC adapters.

In a preferred embodiment, the at least one AC adapter accepts a 100-240 VAC input and has a DC output of 17.4V. In one embodiment, the at least one AC adapter has an indicator for the charge state (e.g., red/orange indicates charging and green indicates charged).

The portable power case is operable to be charged by a pedal power generator. In one embodiment, the portable power case is connected to the pedal power generator through a direct current-direct current (DC-DC) converter cable. The portable power case is also operable to be charged using energy generated from running water and wind energy. In one embodiment, the wind energy is generated using an unmanned aerial system or a drone on a tether. In an alternative embodiment, the wind energy is generated using a drive along turbine. In yet another embodiment, the wind energy is generated using a statically mounted turbine (e.g., ground mounted, tower mounted).

The portable power case is operable to be charged using at least one solar panel. In a preferred embodiment, the at least one solar panel is a combination signal marker panel and solar panel, such as that disclosed in U.S. Publication Nos. 20170109978 and 20150200318, each of which is incorporated herein by reference in its entirety.

In a preferred embodiment, the solar cells are formed of microsystem enabled photovoltaic (MEPV) material, such as that disclosed in U.S. Pat. Nos. 8,736,108, 9,029,681, 9,093,586, 9,143,053, 9,141,413, 9,496,448, 9,508,881, 9,531,322, 9,548,411, and 9,559,219 and U.S. Publication Nos. 20150114444 and 20150114451, each of which is incorporated herein by reference in its entirety.

In another preferred embodiment, the solar panel 2106 is made of glass free, flexible thin film solar modules, such as those sold by Flexopower USA (Raleigh, NC). The solar modules are formed of amorphous silicon with triple junction cell architecture. These solar modules continue to deliver power when damaged or perforated. Additionally, these panels provide higher production and a higher output in overcast conditions than comparable glass panels. These panels also provide better performance at a non-ideal angle of incidence.

Figure 35:
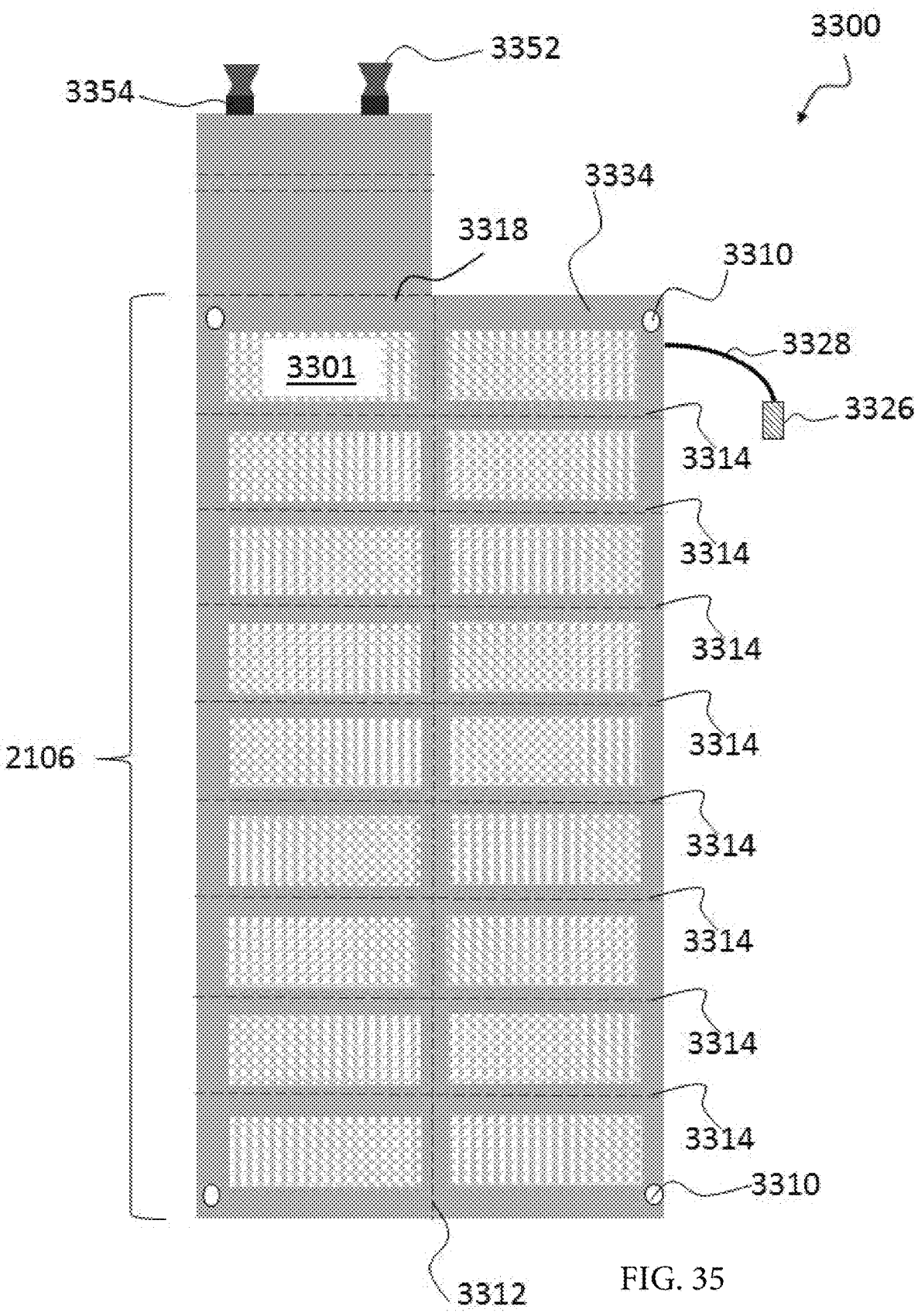
FIG. 35 illustrates a portion of a combination signal marker panel and solar panel.

FIG. 35 illustrates a portion of a combination signal marker panel and solar panel 3300 made with glass free, thin film solar modules. The combination signal marker panel and solar panel 3300 includes a plurality, e.g., one or more, of solar modules 3301 mounted on a flexible substrate 3334. While FIG. 35 shows eighteen solar modules 3301 in the solar panel 2106, this is exemplary only. The solar panel 2106 can include any number of solar modules 3301 configured in series, configured in parallel, or configured in any combination of series and parallel arrangements. In particular, the configuration of solar modules 3301 in the solar panel 2106 can be tailored in any way to provide a certain output voltage and current. The output of any arrangement of solar modules 3301 in the solar panel 2106 is a direct current (DC) voltage. Accordingly, the solar panel 2106 includes at least one output connector 3326 that is electrically connected to the arrangement of solar modules 3301 via a cable 3328. The at least one output connector 3326 is used for connecting any type of DC load to the solar panel 2106. In one embodiment, the cable 3328 of the at least one output connector 3326 includes a blocking diode to prevent power from running back into the solar panel. In a preferred embodiment, the at least one output connector 3326 is a circular connector (e.g., male FISCHER® SOV 105 A087 connector).

In one embodiment, the at least one connector includes one or more connectors that allow a first solar panel to connect to a second solar panel in series or in parallel. This allows a plurality of solar panels 2106 of multiple combination signal marker panel and solar panels 3300 to be connected together in series, in parallel, or any combination of series and parallel arrangements.

In a preferred embodiment, the solar panel 2106 includes eighteen solar modules 3301. The maximum power is about 118 W in one embodiment. The voltage at maximum power is about 28.8V in one embodiment. The current at maximum power is about 4.1 A in one embodiment.

The dimensions of the combination signal marker panel and solar panel 3300 are about 8 feet by about 3 feet when deployed in one embodiment. The weight of the combination signal marker panel and solar panel 3300 is preferably less than about 10 pounds. The combination signal marker panel and solar panel 3300 weighs about 9 pounds in one embodiment.

The combination signal marker panel and solar panel 3300 is preferably foldable. Prior art solar panels that are rollable require a tube to roll the solar panel. The combination signal marker panel and solar panel 3300 of the present invention does not require a tube, which provides a weight and volume savings advantage over prior art. The weight and dimensions of the combination signal marker panel are important because it must be easily transported by a human. Soldiers often carry 60-100 lbs. of gear, including equipment (e.g., radios, solar panels, batteries) in their rucksack or attached to their vest. Additional weight slows soldiers down and also makes it more likely that they will suffer injuries to their body (e.g., injuries to the back, shoulders, hips, knees, ankles, and feet). Additional volume also impedes the movement of the soldiers.

The combination signal marker panel and solar panel 3300 includes clips (female clip 3352 shown) to secure the combination signal marker panel and solar panel 3300 when not in use in one embodiment. The solar panel 2106 includes eyelets 3310, which allows the solar panel to be secured to the ground or another surface. While FIG. 35 shows a total of four eyelets 3310 (one in each corner), this is exemplary only. The solar panel 2106 can include any number of eyelets 3310. The combination signal marker panel and solar panel 3300 has a vertical fold axis 3312, a top horizontal fold axis 3318, and a plurality of horizontal fold axes 3314.

Figure 36:
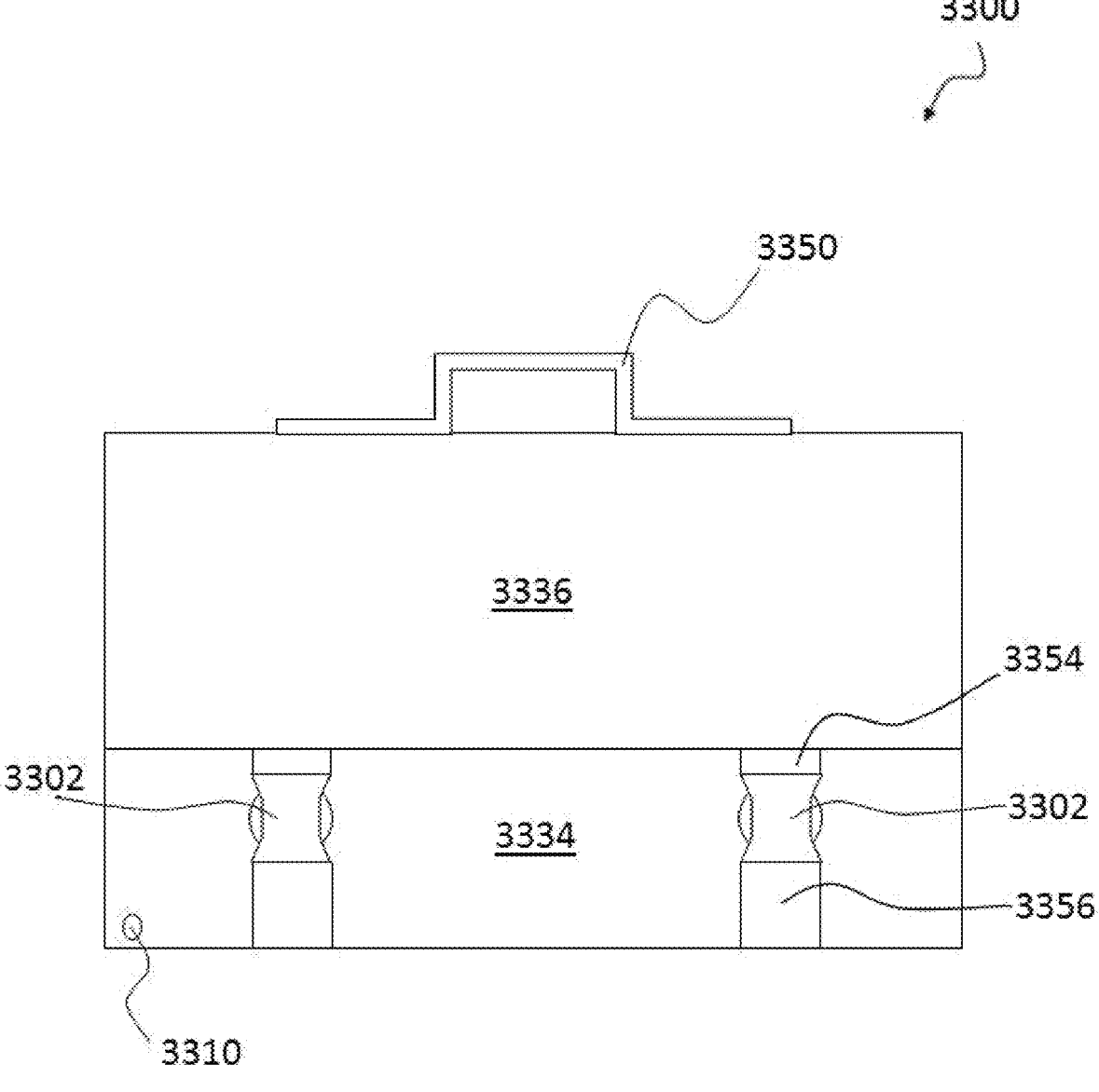
FIG. 36 illustrates a front perspective view of a combination signal marker panel and solar panel while folded.

FIG. 36 shows a front perspective view of the combination signal marker panel and solar panel 3300 while folded. The combination signal marker panel and solar panel 3300 includes a handle 3350. The combination signal marker panel and solar panel 3300 also includes clips 3302 to secure the combination signal marker panel and solar panel 3300 when not in use in one embodiment. The clips 3302 are attached to a front flap 3336 via webbing 3354. The clips are attached at the other end to webbing 3356. The front flap 3336 partially covers a back side of the flexible substrate 3334 in one embodiment. The bottom webbing 3356 is in two pieces that are secured by hook-and-loop tape in one embodiment.

Figure 37:
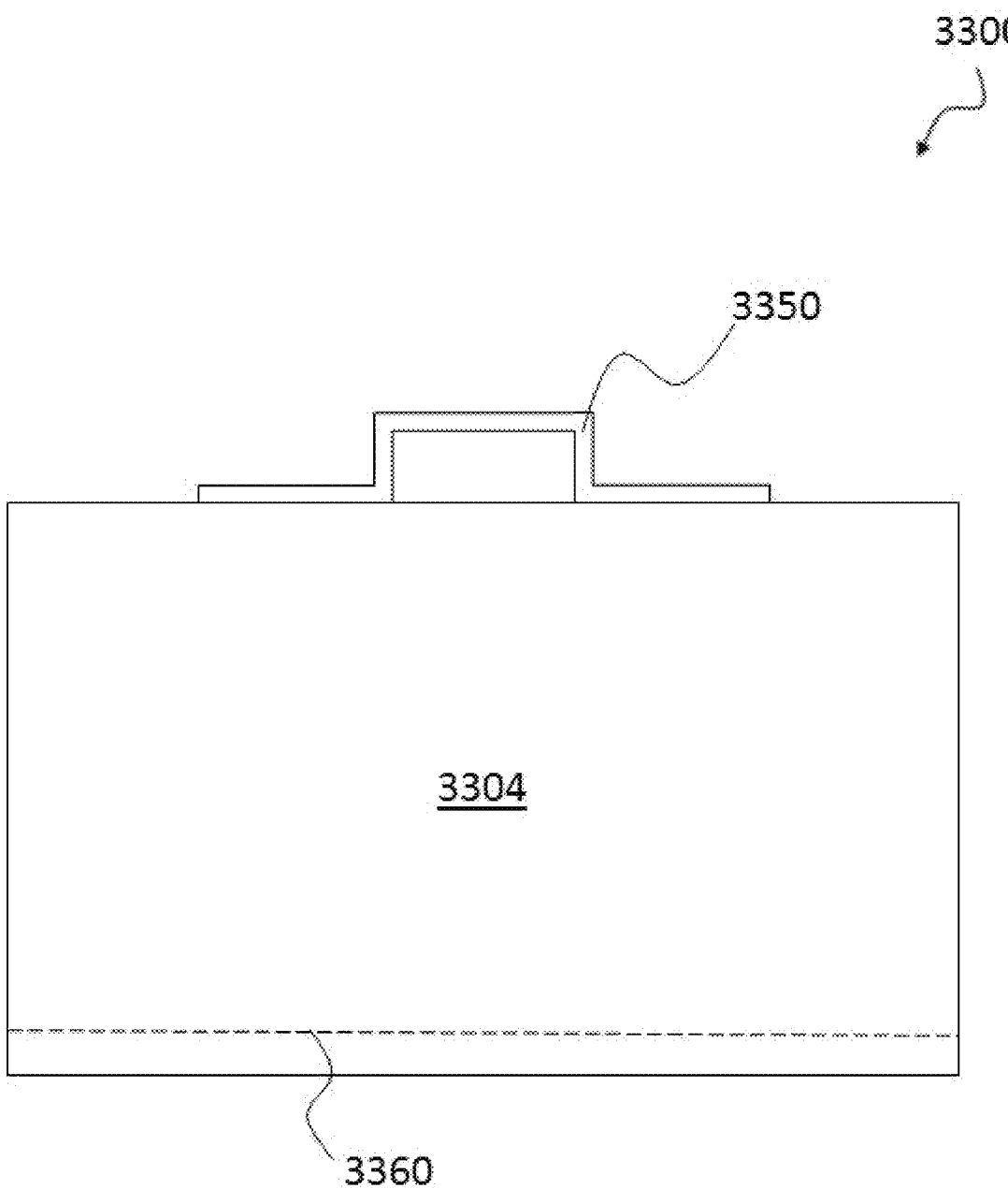
FIG. 37 illustrates a back perspective view of one embodiment of a combination signal marker panel and solar panel while folded.

FIG. 37 shows a back perspective view of one embodiment of the combination signal marker panel and solar panel 3300 while folded. The combination signal marker panel and solar panel 3300 includes an integrated pocket 3304 for holding the signal marker panel 3600 (not shown) when the solar panel 2106 is in use while the signal marker panel 3600 is not in use. The integrated pocket 3304 can also be used to store the at least one output connector 3326 (not shown) when not in use. The integrated pocket 3304 has an opening 3360. The opening 3360 of the integrated pocket 3304 is preferably closed using a hook-and-loop fastener system. Alternatively, the opening 3360 of the integrated pocket 3304 is closed using ties, an arrangement of buttons or snaps, or a zipper.

Figure 38:
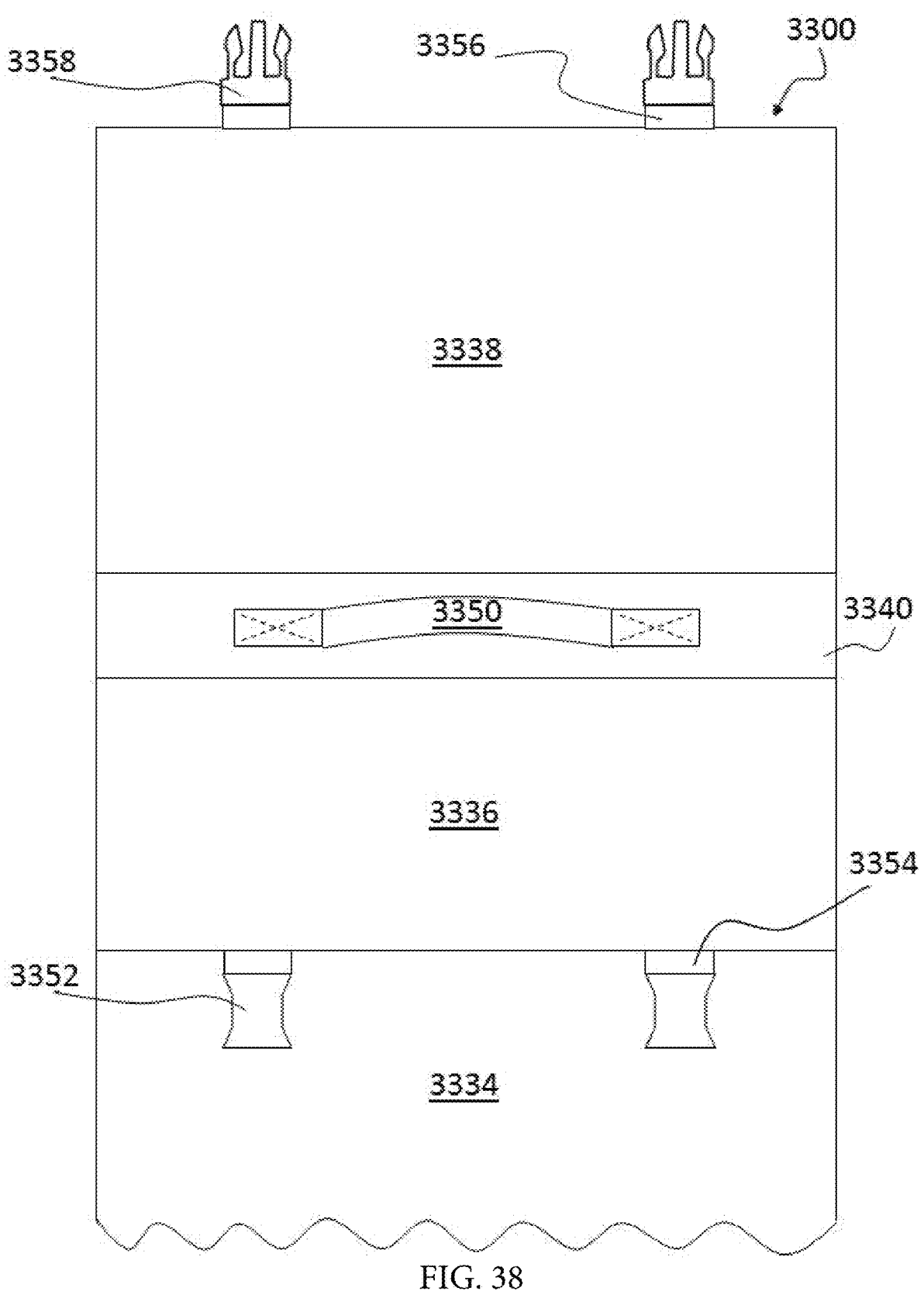
FIG. 38 illustrates a top perspective view of one embodiment of the combination signal marker panel and solar panel while unfolded.

FIG. 38 illustrates a top perspective view of one embodiment of the combination signal marker panel and solar panel 3300 while unfolded. The front flap 3336 is connected to the female clips 3352 via webbing 3354. The front flap 3336 is connected to a top section 3340. The handle 3350 is attached to the top section 3340. The top section 3340 is also connected to the back flap 3338. The back flap 3338 contains the integrated pocket 3304 (not shown). In a preferred embodiment, the integrated pocket 3304 is on the reverse side of the back flap 3338 such that the integrated pocket is not exterior facing when the combination signal marker panel and solar panel 3300 is folded. This protects the contents of the integrated pocket 3304 from accidentally spilling out. This also protects the cable 3328 from getting caught on other gear, vehicle components, etc. The back flap 3338 is also connected to the male clips 3358 via webbing 3356.

Figure 39:
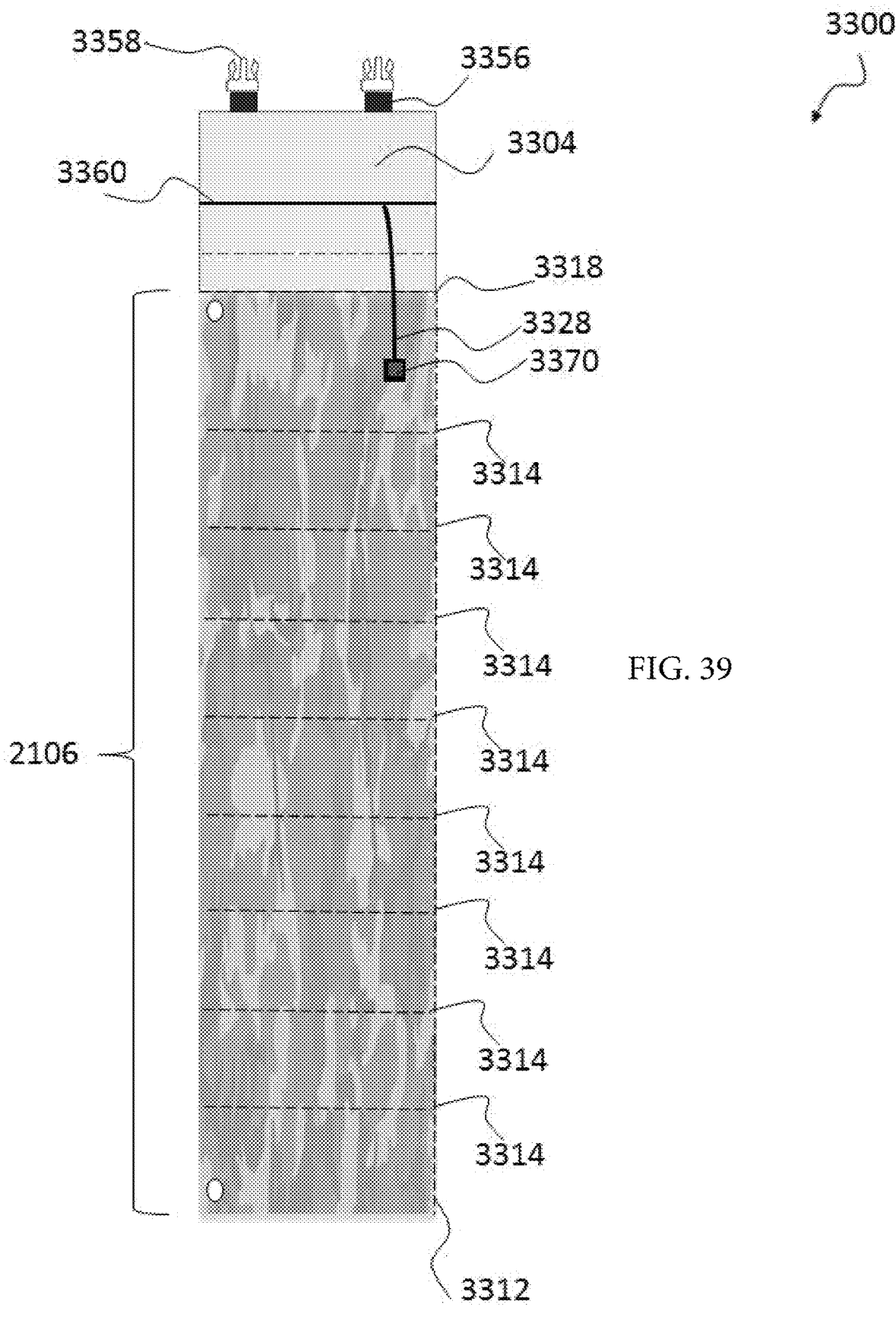
FIG. 39 illustrates another portion of a combination signal marker and solar panel.

FIG. 39 illustrates another portion of a combination signal marker and solar panel 3300. The cable 3328 is electrically connected to the plurality of solar modules 3301 (not shown) via a junction box 3370. The at least one output connector 3326 (not shown) is secured in the integrated pocket 3304.

In the embodiment shown in FIG. 39, the flexible substrate 3334 is shown in a camouflage pattern. Alternatively, the flexible substrate is a solid color (e.g., black, blue, brown, tan, green, white). In a preferred embodiment, the front flap, the top section, and the back flap are made of a canvas or nylon material. The front flap, the top section, and the back flap are formed of a camouflage pattern or a solid color (e.g., black, blue, brown, tan, green, white).

Representative camouflages include, but are not limited to, universal camouflage pattern (UCP), also known as ACUPAT or ARPAT or Army Combat Uniform; MultiCam, also known as Operation Enduring Freedom Camouflage Pattern (OCP); Universal Camouflage Patter-Delta (UCP-Delta); Airman Battle Uniform (ABU); Navy Working Uniform (NWU), including variants, such as, blue-grey, desert (Type II), and woodland (Type III); MARPAT, also known as Marine Corps Combat Utility Uniform, including woodland, desert, and winter/snow variants; Disruptive Over-white Snow digital camouflage, and Tactical Assault Camouflage (TACAM).

Additionally, the combination signal marker panel and solar panel 3300 includes features that allow the combination signal marker panel and solar panel 3300 to be wearable in one embodiment. The combination signal marker panel and solar panel 3300 is be MOLLE-compatible in another embodiment. "MOLLE" means Modular Lightweight Load-carrying Equipment, which is the current generation of load-bearing equipment and backpacks utilized by a number of NATO armed forces. In one embodiment, the combination signal marker panel and solar panel 3300 incorporates a pouch attachment ladder system (PALS), which is a grid of webbing used to attach smaller equipment onto load-bearing platforms, such as vests, backpacks, and body armor. The pouch attachment ladder system is formed of a plurality of straps, a plurality of horizontal rows of webbing, a plurality of slits, and combinations thereof. For example, the PALS grid consists of horizontal rows of 1-inch (2.5 cm) webbing, spaced about one inch apart, and reattached to the backing at 1.5-inch (3.8 cm) intervals.

Figure 40:
FIG. 40 illustrates one embodiment of a signal marker panel.
Figure 40:
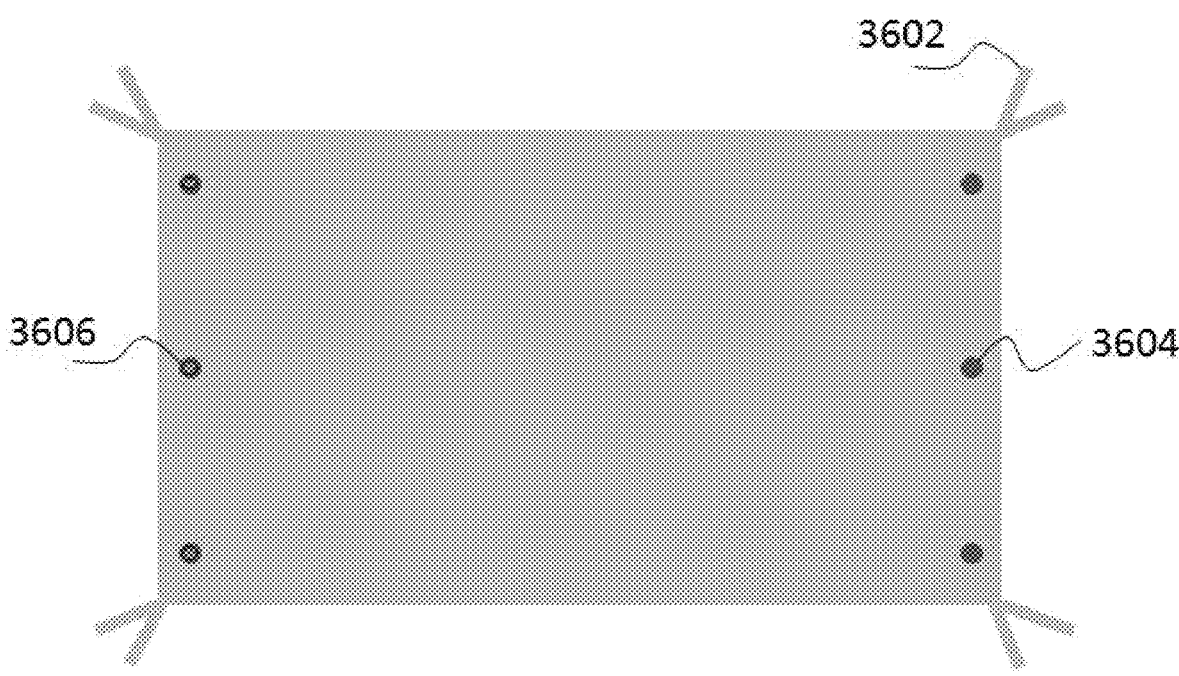

FIG. 40 illustrates one embodiment of a signal marker panel 3600. The signal marker panel is preferably rectangular or square in shape. In a preferred embodiment, the signal marker panel is fluorescent orange (or "international orange") on a first side and cerise on a second side. In a preferred embodiment, the signal marker panel is formed of ripstop nylon. The signal marker panel 3600 includes tie straps 3602, which allows the signal marker panel 3600 to attach to different surfaces (e.g., the ground, trees, a backpack). In one embodiment, the tie straps 3602 are made out of the same material as the signal marker panel 3600, nylon, elastic, hook-and-loop tape, or parachute cord. In one embodiment, the signal marker panel 3600 includes snaps, which allows multiple signal marker panels 3600 to be connected together. The snaps include sockets 3604 (cap shown) and studs 3606.

Figure 41:
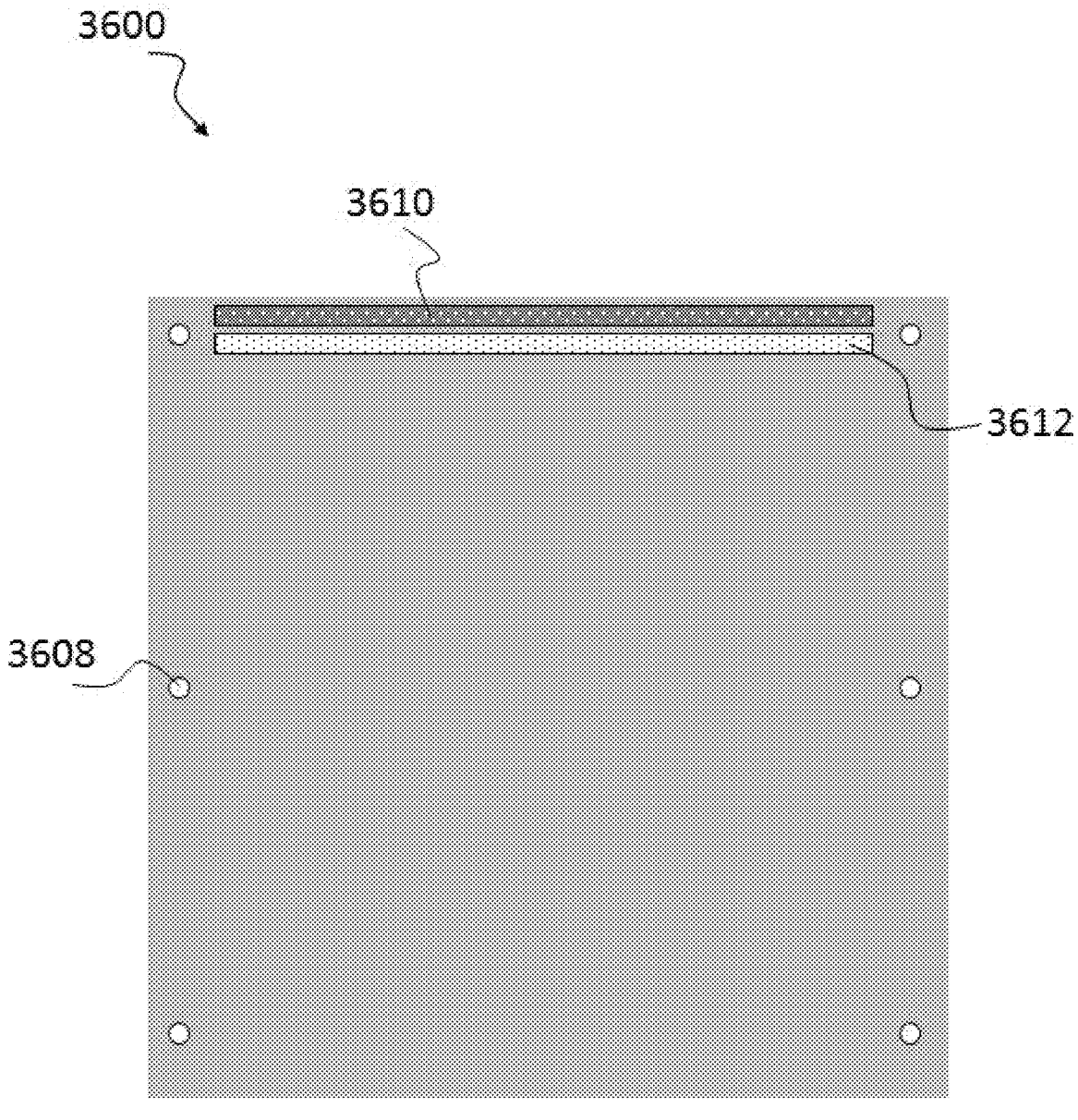
FIG. 41 illustrates another embodiment of a signal marker panel.

FIG. 41 illustrates another embodiment of a signal marker panel 3600. The signal marker panel 3600 includes grommets 3608 on two opposing ends. The signal marker panel 3600 also includes hook tape 3610 and loop tape 3612 on both sides of the signal marker panel (i.e., on both the cerise and international orange sides). In an alternative embodiment, the signal marker panel includes hook tape 3610 and loop tape 3612 on only one side. The signal marker panel includes hook tape 3610 and/or loop tape 3612 on two opposing ends of at least one side of the signal marker panel in another embodiment. In one embodiment, the signal marker panel is about 3 feet wide and about 3 feet long.

The portable power case is operable to be charged using at least one non-rechargeable battery (e.g., BA-5590). Non-rechargeable batteries are often used for military operations. The non-rechargeable batteries are often discarded when 20-40% full to ensure that power is not lost when on the battlefield. Advantageously, the portable power case can be charged using the remaining charge on non-rechargeable batteries, resulting in less wasted energy.

The portable power case is also operable to be charged using at least one generator (e.g., NATO generators) or a fuel cell. In one embodiment, the fuel cell includes a metal-organic framework compound.

As previously described, the portable power case is operable to supply power to a wearable battery. The wearable battery 2108 is preferably the battery shown in FIG. 12B, wherein the battery is lined with a first layer of the heat-shielding or blocking and/or heat-dissipating material and a second layer of the heat-shielding or blocking and/or heat-dissipating material, e.g., in a layer or lining, or coating application.

In an alternate embodiment, the wearable battery 2108 is a portable battery pack such as that disclosed in U.S. Publication No. 20160118634 or U.S. application Ser. No. 15/720,270, each of which is incorporated herein by reference in its entirety.

The portable power case is also operable to supply power to a laser designator and/or rangefinder. In a preferred embodiment, the laser designator and/or rangefinder is a Special Operations Forces Laser Rangefinder Designator (SOFLAM). Alternative laser designators and/or rangefinders are compatible with the present invention.

The portable power case is also operable to supply power to a communications system. In a preferred embodiment, the communications system is the VIASAT® Move Out/Jump Off Kit (MOJO). The MOJO provides simultaneous line-of-sight and/or satellite communications for at least two channels. The MOJO requires a one-step process for turning the MOJO on or off using DC power, such as when using the portable power case. The MOJO requires a four-step process for turning the MOJO on or off using AC power. Further, the four steps must be completed in a specific order. Advantageously, the portable power case allows for the one-step process, which allows an operator to easily turn the MOJO on and off. In another embodiment, the communications system is a voice over secure internet protocol (VoSIP) system (e.g., VoyagerECK by Klas Telecom). In one example, the VoSIP system includes an embedded services router, a network encrypter, a layer 3 switch, an internet protocol (IP) handset, and an uninterruptable power supply (UPS) battery backup. Alternative communications systems are compatible with the present invention.

In one embodiment, the portable power case is operable to resuscitate a vehicle battery if the vehicle battery dies using a contingency cable. One example of a vehicle used by the military is a POLARIS® MRZRR. There are two versions of the MRZR®: diesel and gasoline. The diesel version has two 12V lead acid batteries for a 24V output and an on-board alternator. The gasoline version has a 12V lead acid battery, but does not have an on-board alternator. The lack of an on-board alternator makes it more likely that the battery on the gasoline version will no longer have sufficient charge to power the vehicle (i.e., the battery dies), leaving the passengers and the vehicle stranded. The contingency cable is a DC-DC converter cable with a dedicated hard-wired male cigarette lighter plug connector and a 12V output. Alternatively, the contingency cable is connected to the vehicle battery using ring terminals, alligator clips, or a NATO slave adapter. The contingency cable is a DC-DC converter cable with a 12V or 24V output with a desulfating setting.

The portable power case is operable to connect to a power inverter. The power inverter changes direct current (DC) to alternating current (AC). This allows the portable power case to supply power to AC devices. The portable power case supplies power to the power inverter through a DC input cable. In a preferred embodiment, the DC input cable has one end with a circular connector (e.g., male FISCHER® SOV 105 A087 connector). In an alternative embodiment, the portable power case includes a built-in power inverter.

The portable power case is operable to supply power to a fish finder and/or a chartplotter, an aerator or a live bait well, a camera (e.g., an underwater camera), a temperature and/or a depth sensor, a stereo, a radio, an antenna, a power distribution hub, a data hub, a power distribution and data hub (e.g., APEx 4-port hub by Black Diamond Advanced Technology), a computer, a drone, and/or a lighting system. In one embodiment, the lighting system includes at least one LED.

The above-mentioned examples are provided to serve the purpose of clarifying the aspects of the invention, and it will be apparent to one skilled in the art that they do not serve to limit the scope of the invention. By way of example, the keyway may force the cable at an angle other than 30.0°. Voltages of batteries may be different.

The above-mentioned examples are just some of the many configurations that the mentioned components can take on. All modifications and improvements have been deleted herein for the sake of conciseness and readability but are properly within the scope of the present invention.

The invention claimed is:

1. A portable power case comprising:

a case;

a printed circuit board (PCB) operable to connect to at least one visual indicator;

at least one port connected to the PCB; and at least one battery connected to the PCB;

wherein the PCB includes control electronics, wherein the control electronics include a battery management system;

wherein the at least one port is operable to supply power to at least one electronic device;

wherein the at least one port is operable to charge the case using at least one charging device;

wherein the PCB automatically determines a charge priority between all connected devices; and wherein the at least one visual indicator indicates a state of charge for the at least one battery and/or the at least one charging device.

2. The portable power case of claim 1, wherein the at least one visual indicator comprises a set of light-emitting diodes (LEDs) or at least one 5-bar liquid crystal display (LCD).

3. The portable power case of claim 1, wherein the at least one visual indicator is operable to change color and/or flash to display the state of charge for the at least one battery and/or the at least one charging device.

4. The portable power case of claim 1, wherein the PCB is operable to receive at least one alternating current (AC) adapter.

5. The portable power case of claim 1, wherein the at least one port is operable to charge and discharge the at least one battery simultaneously.

6. The portable power case of claim 1, wherein the at least one charging device is a battery producing direct current (DC) power.

7. The portable power case of claim 1, wherein the at least one battery is rechargeable.

8. The portable power case of claim 1, wherein the battery management system includes a safety cutoff.

9. The portable power case of claim 1, wherein the case is waterproof or water resistant.

10. The portable power case of claim 1, further including a harness, wherein the at least one battery is connected to the PCB via the harness.

11. A portable power case comprising:

a case;

a printed circuit board (PCB) operable to connect to at least one visual indicator;

at least one port connected to the PCB; and at least one battery removably connected to the PCB;

wherein the at least one port is operable to supply power to at least one electronic device;

wherein the PCB automatically determines a charge priority between all connected devices; and wherein the at least one visual indicator indicates a state of charge for the at least one battery.

12. The portable power case of claim 11, wherein the at least one visual indicator comprises a set of light-emitting diodes (LEDs) or at least one 5-bar liquid crystal display (LCD).

13. The portable power case of claim 11, wherein the case is waterproof or water resistant.

14. The portable power case of claim 11, wherein the PCB includes control electronics, wherein the control electronics include a battery management system.

15. A portable power case comprising:

a case;

a printed circuit board (PCB);

at least one port connected to the PCB; and at least one battery connected to the PCB;

wherein the PCB and the at least one battery are disposed within the case;

wherein the at least one port is operable to supply power to at least one electronic device;

wherein the PCB automatically determines a charge priority between all connected devices;

wherein the PCB modifies charge distribution based on the charge priority; and wherein the PCB includes control electronics configured to determine a state of charge of the case and/or the at least one electronic device.

16. The portable power case of claim 15, wherein the state of charge of the case and/or the at least one electronic device is displayed via at least one visual indicator.

17. The portable power case of claim 16, wherein the at least one visual indicator comprises a set of light-emitting diodes (LEDs) or at least one 5-bar liquid crystal display (LCD).

18. The portable power case of claim 15, wherein the case is waterproof or water resistant.

19. The portable power case of claim 15, wherein the control electronics include a communications interface.

20. The portable power case of claim 15, wherein the control electronics include a battery management system, wherein the battery management system includes at least one safety cutoff.

* * * * *